(12) United States Patent
Tsutsumi et al.

(10) Patent No.: US 7,521,765 B2
(45) Date of Patent: Apr. 21, 2009

(54) SEMICONDUCTOR DEVICE

(75) Inventors: Tomohiko Tsutsumi, Kawasaki (JP);
Toru Anezaki, Kawasaki (JP); Hideyuki Kojima, Kawasaki (JP); Taiji Ema, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 71 days.

(21) Appl. No.: 11/020,257

(22) Filed: Dec. 27, 2004

(65) Prior Publication Data

US 2006/0038240 A1 Feb. 23, 2006

(30) Foreign Application Priority Data

Aug. 17, 2004 (JP) ............... 2004-237696

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. ............... 257/392; 257/E27.098

(58) Field of Classification Search .......... 257/391, 257/142, 148, 285, 607–612, E27.098, E27.099, 257/E27.1, E27.101, E27.077, 392
See application file for complete search history.

(56) References Cited

U.S. PATENT DOCUMENTS 6,455,904 B1 9/2002 Noda
6,492,690 B2 * 12/2002 Ueno et al. ............... 257/392
6,891,210 B2 5/2005 Akiyama
2004/0004229 A1 1/2004 Akiyama
2005/0168895 A1 8/2005 Akiyama

OTHER PUBLICATIONS

Peter Van Zant, Microchip Fabrication, 2000, McGraw-Hill, Fourth Edition, p. 74.*
Merriam-Webster Online Dictionary www.m-w.com.*
S. Wolf, Silicon Processing for the VLSI Era, 1990, Lattice Press, vol. 2, p. 572.*
Robert Baumann, The Impact of Technology Scaling on Soft Error Rate Performance and Limits to the Efficacy of Error Correction, IEEE 329-332, 2002, Texas Instruments, Dallas, TX.
Japanese Office Action dated Jan. 20, 2009, issued in corresponding Japanese Application No. 2004-237696.

* cited by examiner

*Primary Examiner*—Monica Lewis
(74) *Attorney, Agent, or Firm*—Westerman, Hattori, Daniels & Adrian, LLP.

(57) ABSTRACT

An n-type embedded layer is formed in an N-LV region of a SRAM cell region after an element isolation insulating film is formed on a p-type Si substrate. Thereafter, a p-well and an n-well are formed. In formation of a channel-doped layer, ion implantation is also performed into the N-LV region of the SRAM cell region in parallel with ion implantation into an N-LV of a logic circuit region. Ion-implantation is further performed into the N-LV region of the SRAM cell region in parallel with ion implantation into an N-MV of an I/O region.

7 Claims, 75 Drawing Sheets

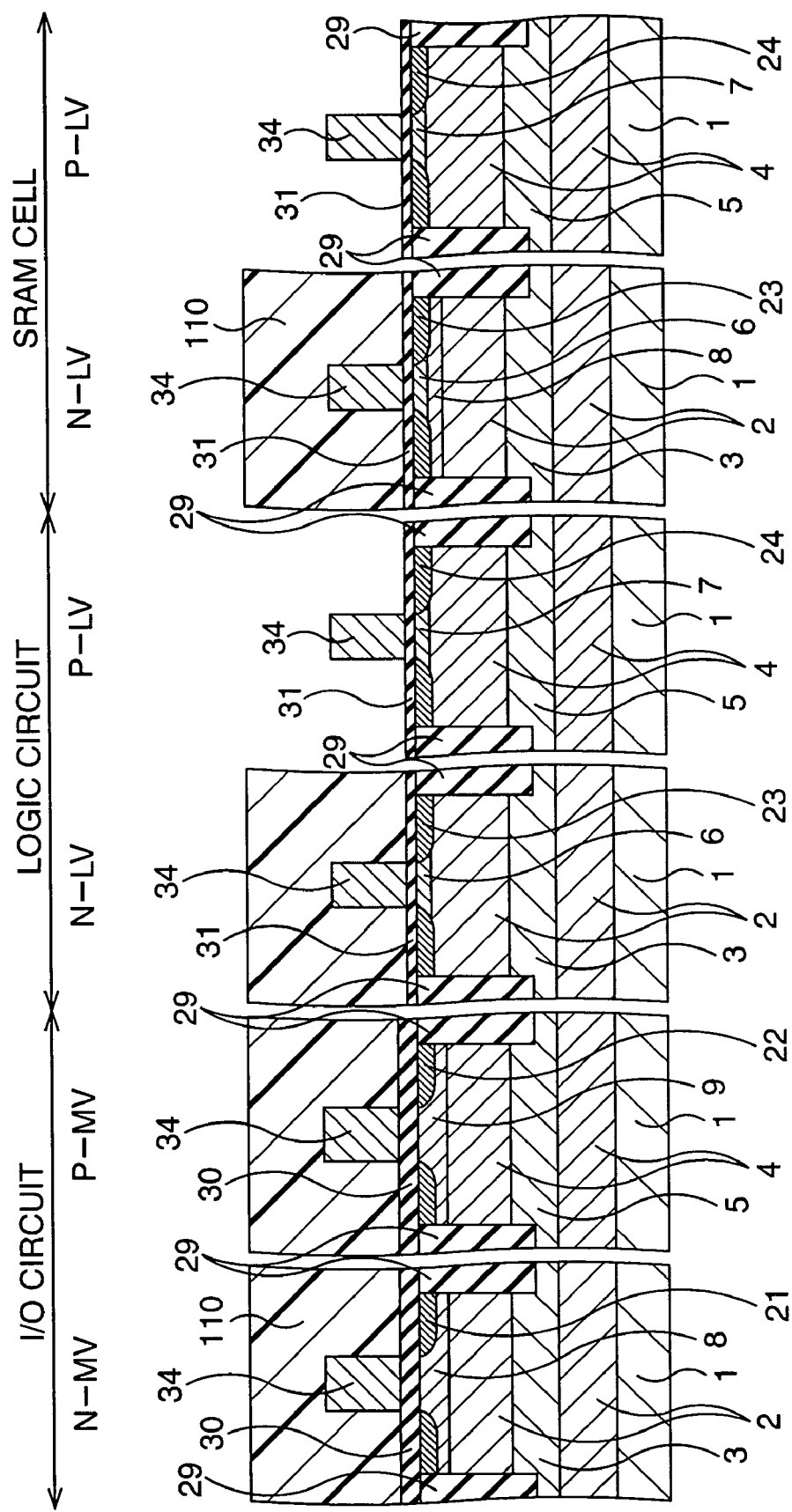

SEMICONDUCTOR DEVICE

CROSS-REFERENCE TO RELATED APPLICATIONS

This application is based upon and claims the benefit of priority from the prior Japanese Patent Application No. 2004-237696, filed on Aug. 17, 2004, the entire contents of which are incorporated herein by reference.

BACKGROUND OF THE INVENTION

1. Field of the Invention

The present invention relates to a semiconductor device suitable for a SRAM and a manufacturing method of the same.

2. Description of the Related Art

Recently, miniaturization of a transistor is pursued for the purpose of high-density design and high performance of a semiconductor device. However, in a SRAM (Static Random Access Memory), the threshold voltage is reduced due to an inverse narrow channel effect when the channel width of the transistor which constitutes each memory cell (SRAM cell) is narrowed. As a result, the operation margin of the SRAM cell becomes small.

Patent document 1 (Japanese Patent Application Laid-open No. 2000-58675) discloses a method in which in order to enhance the threshold voltage of the transistor constituting an SPAM cell, a step of introducing an impurity into only the transistor is added besides the introduction of the impurity which is performed in parallel with formation of a logic circuit and an input and output circuit (I/O circuit).

Further, as described in Non-patent document 1 "The Impact of Technology Scaling on Soft Error Rate Performance and Limits Efficacy of Error Correction", IEDM 2002, as the high-density design of a transistor advances, the soft error rate of the SRAM cell increases, and therefore higher soft error resistance is required.

A related art is described in Patent document 2 (Japanese Patent Application Laid-open No. Hei 11-74378).

SUMMARY OF THE INVENTION

A first object of the present invention is to provide a semiconductor device capable of securing an operation margin of a SRAM cell widely and a manufacturing method of the same. A second object of the present invention is to provide a semiconductor device capable of enhancing soft error resistance and a manufacturing method of the same.

As a result of repeating earnest study to solve the above-described objects, the inventors of the present application have conceived the modes of the invention which will be shown below.

In a semiconductor device according to a first aspect of the present invention, a semiconductor substrate, a first transistor for a memory with a channel of a first conductivity type, formed on a surface of the semiconductor substrate, a first transistor for a peripheral circuit with a channel of the first conductivity type, formed on the surface of the semiconductor substrate, and a second transistor for the peripheral circuit with a channel of the first conductivity type, formed on the surface of the semiconductor substrate are provided. An impurity profile of the channel of the first transistor for the memory is a total of that of the first transistor for the peripheral circuit and that of the second transistor for the peripheral circuit.

In a semiconductor device according to a second aspect of the present invention, a semiconductor substrate of a first conductivity type, a first well of the first conductivity type formed on a surface of the semiconductor substrate, a second well of a second conductivity type formed on the surface of the semiconductor substrate, and an embedded well of the second conductivity type formed directly under the first well are provided. A first transistor for a memory with a channel of the first conductivity type is formed in the first well, and a second transistor for the memory with a channel of the second conductivity type is formed in the second well.

DETAILED DESCRIPTION OF THE PREFERRED EMBODIMENTS

When the method described in Document 1 is adopted concerning an operation margin of a SRAM cell, the number of process steps increases, and thus the cost increases. When a non-volatile memory is mixedly mounted on one chip in addition to a high-speed logic circuit loaded with the SRAM, an element isolation insulating film is formed by STI (Shallow Trench Isolation) in order to form a high voltage resistance CMOS transistor of the non-volatile memory, it is desirable to make the amount of rounding oxidation larger than a certain fixed amount. The inventors have found out that when such oxidation is performed, the channel width of the SRAM cell in the high-speed logic circuit becomes narrower and the operation margin of the SRAM cell is significantly reduced.

When the non-volatile memory is mixedly mounted, the number of process steps is increased by the number of steps of forming the nonvolatile memory, and thus the manufacturing cost increases as compared with an ordinary high-speed logic circuit loaded with a SRAM. Therefore, it is the problem how the increase in the number of steps is reduced and the operation margin of the SRAM cell is secured.

Similarly, concerning the countermeasure against the soft error, it is the problem how the increase in the number of steps is reduced and the increase in the soft error rate is suppressed even when the high-density design advances.

Gist of the Present Invention

Figure 1:
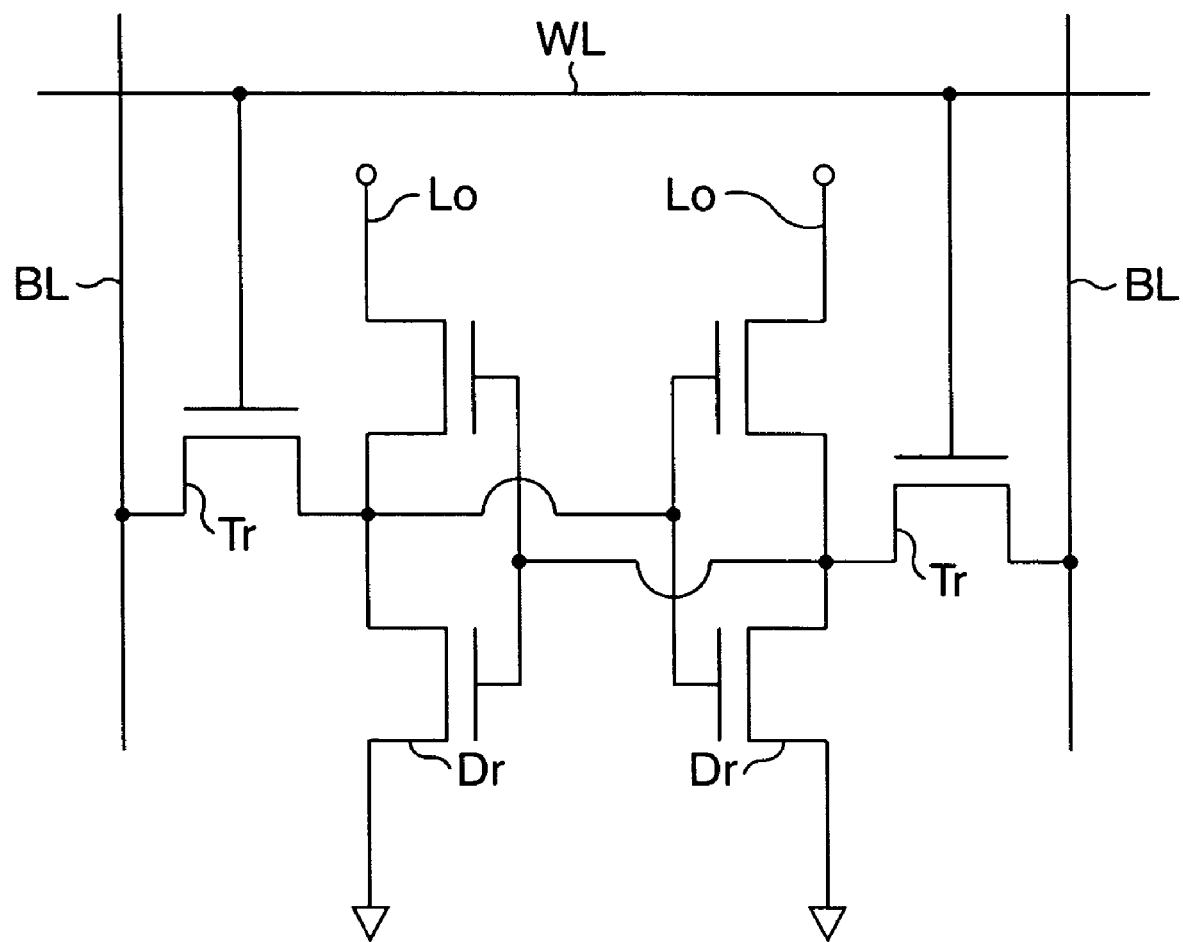
FIG. 1 is an equivalent circuit diagram showing a constitution of a SRAM cell.

The gist of the present invention will be explained. FIG. 1 is an equivalent circuit diagram showing a constitution of a SPRAM cell. This SPRAM cell is provided with two transfer transistors Tr connected to bit lines BL, and two driver transistors Dr and two load transistors Lo, which constitute one flip flop circuit. Gates of the two transfer transistors Tr are connected to the same word line WL.

Figure 2:
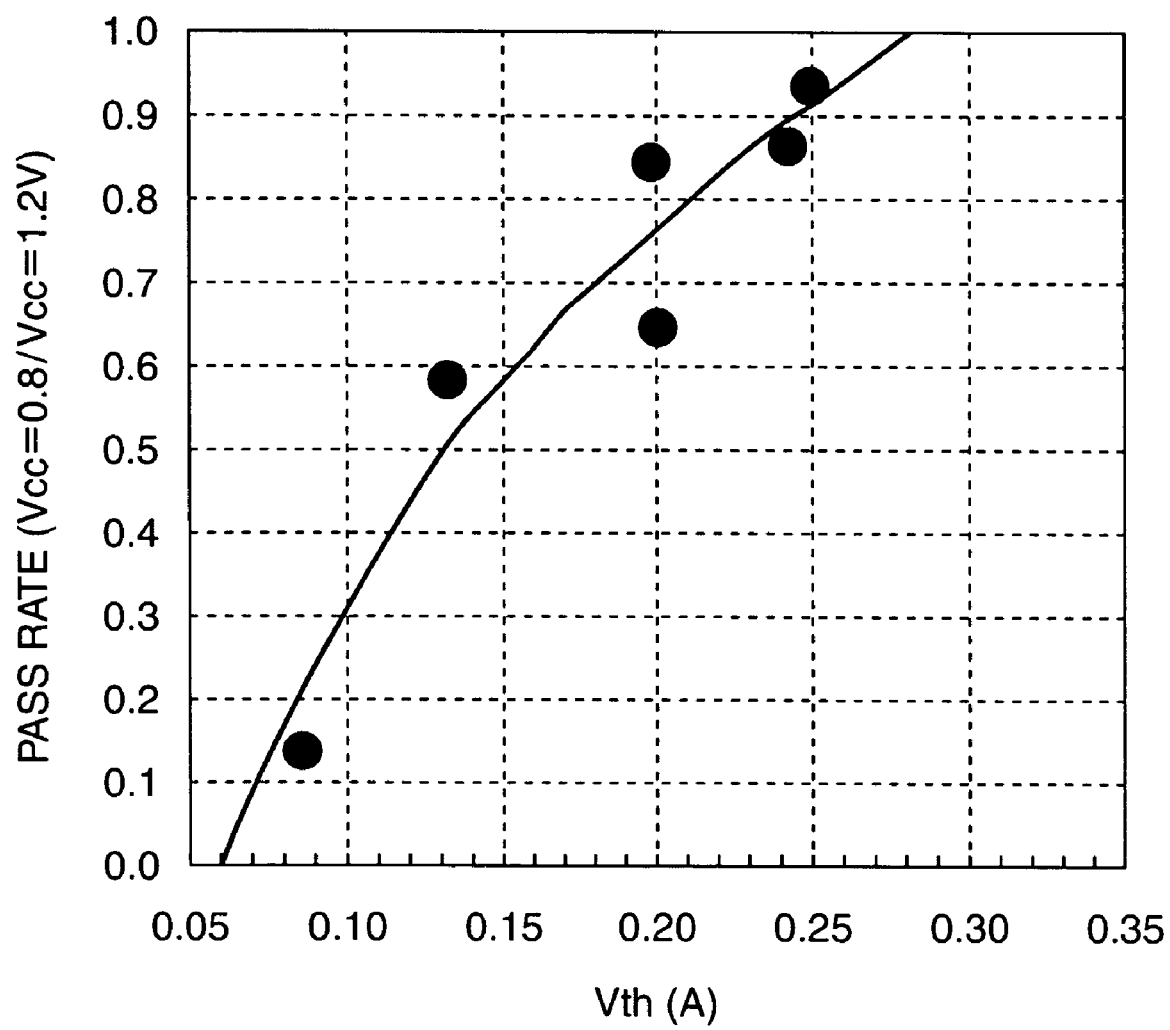
FIG. 2 is a graph showing the relationship between the threshold voltage of a driver transistor Dr and the rate of memory cells operating normally.
Figure 3:
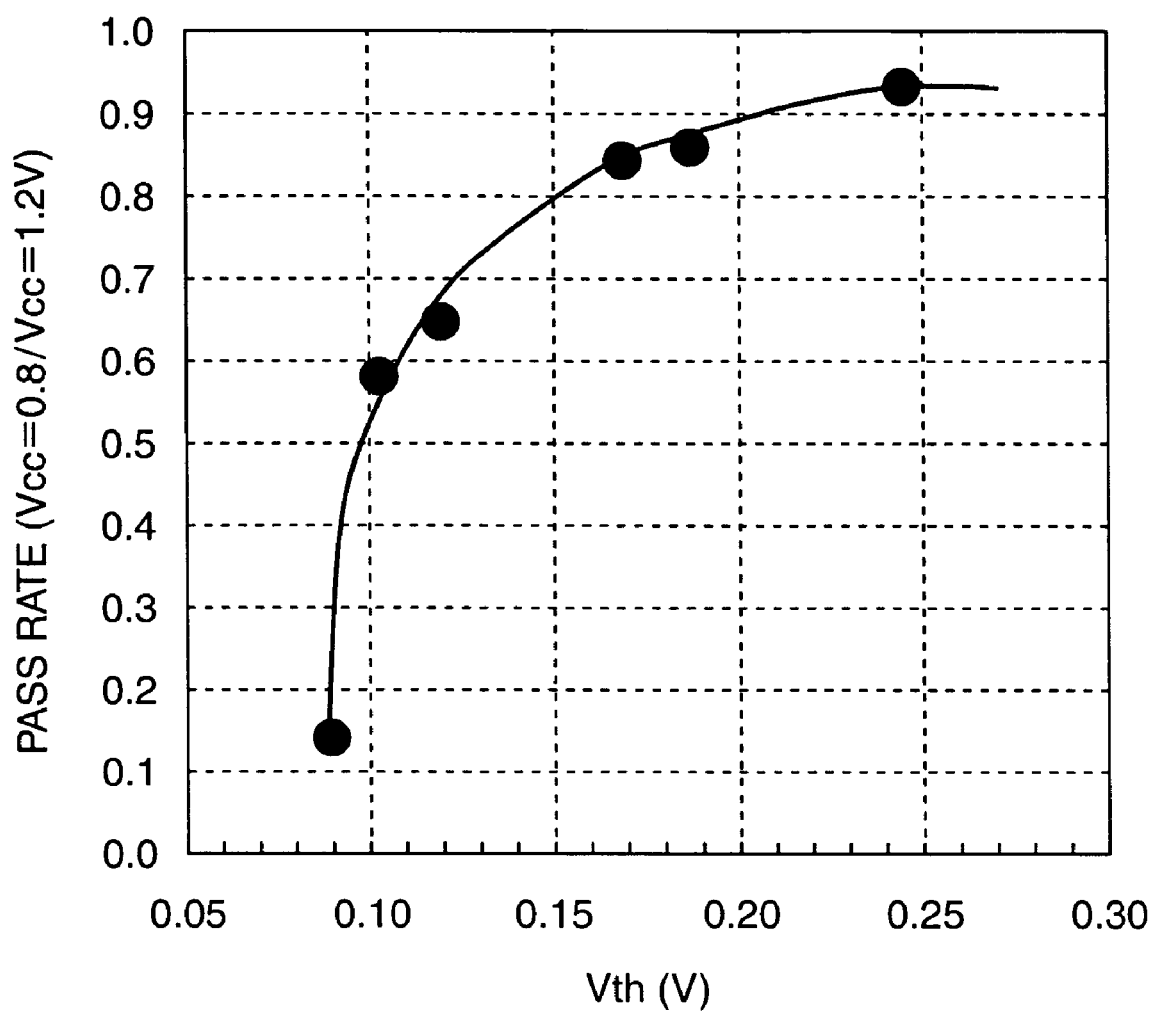
FIG. 3 is a graph showing the relationship between the threshold voltage of a transfer transistor Tr and the rate of SRAM cells operating normally.

When, For the SRAM cells of such circuit constitution, the inventors of the present application examined the relationship between the threshold voltage and the number of the SRAM cells operating normally, the results shown in FIG. 2 and FIG. 3 were obtained. In this examination, the number of memory cells which operated normally when the power supply voltage (Vcc) was set at 1.2 V was set as the reference (Pass rate: 1), and the rate of the number of memory cells which operated normally when the power supply voltage was set at 0.8 V was obtained. FIG. 2 shows the relationship between the threshold voltage of the driver transistor Dr and the rate of the memory cells which operate normally, and FIG. 3 shows the threshold voltage of the transfer transistor Tr and the rate of the SRAM cells which operate normally. As shown in FIG. 2 and FIG. 3, as the threshold voltage becomes lower, the rate of the SRAM cells which operate normally decreases even at a low power supply voltage. From the inverse point of view, it is effective to enhance the threshold voltage in order to make the SRAM cells operate normally even at a low power supply voltage. However, if an exclusive step as described in Patent Document 1 is added, the number of steps increases and the cost is increased.

Thus, in the first aspect of the present invention, in forming a low voltage operation transistor and a middle voltage operation transistor, which operates at a higher voltage than the low voltage transistor, in the same chip, in parallel with the transistor constituting the SRAM cell, ion-implantation is performed for the transistor constituting the SRAM cell in parallel with the formation of a channel dope layer of the transistor of the low voltage operation, and ion implantation is performed for the transistor which constitutes the SRAM cell in parallel with the formation of a channel dope layer of the transistor of the middle voltage operation.

Figure 4A:
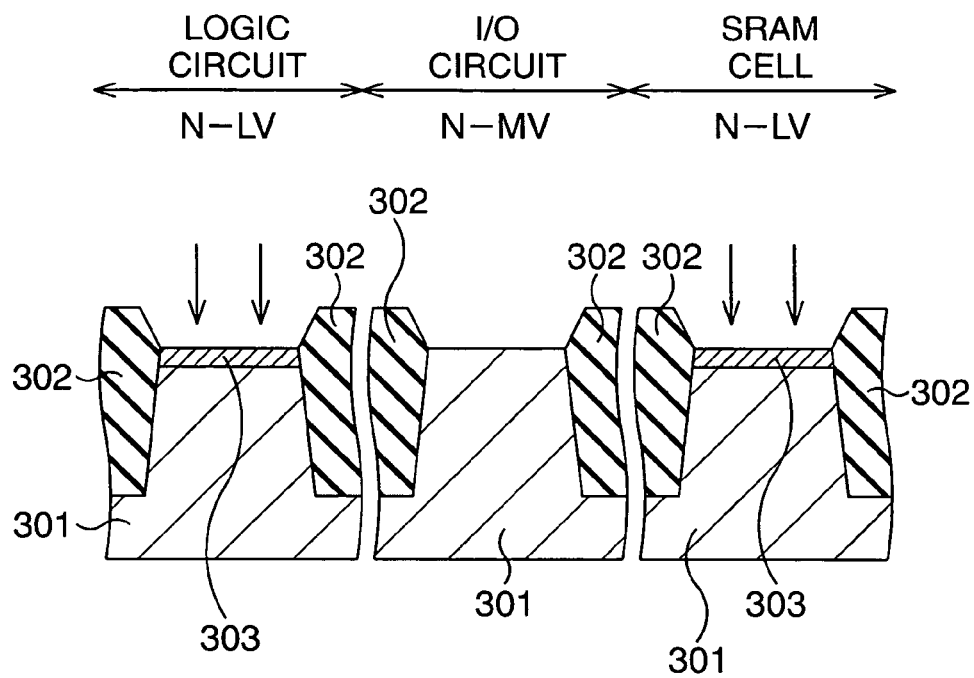
FIGS. 4A and 4B are sectional views showing a conventional manufacturing method of a semiconductor device, concerning the formation of a channel.
Figure 4B:
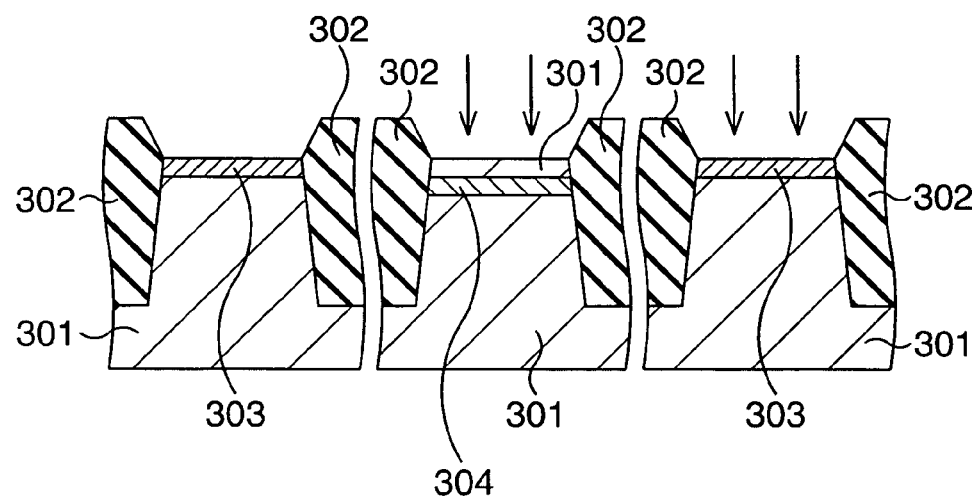

As shown in FIGS. 4A and 4B, in the conventional manufacturing method, the low voltage operation nMOS transistor (N-LN) for the SRAM cell, the low voltage operation nMOS transistor (N-LV) for the logic circuit and the medium voltage operation nMOS transistor (N-MV) for the I/O circuit are formed in parallel in one chip. Namely, as shown in FIG. 4A, for the p-type Si substrate 301 on which element isolation insulating films 302 are formed, channel doped layers 303 are formed by performing ion-implantation in the SRAM cell region and the logic circuit region, and thereafter, as shown in FIG. 4B, a channel doped layer 304 is formed by performing ion implantation in the I/O circuit region.

Figure 5A:
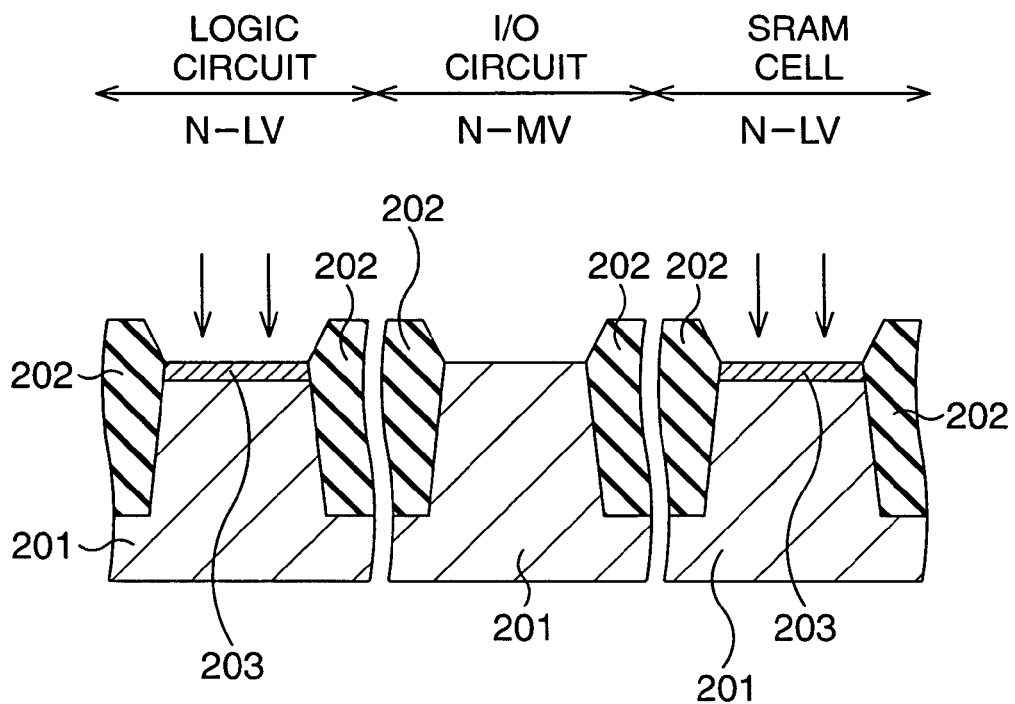
FIGS. 5A and 5B are sectional views showing a manufacturing method of a semiconductor device according to a first aspect of the present invention, concerning the formation of a channel.
Figure 5B:
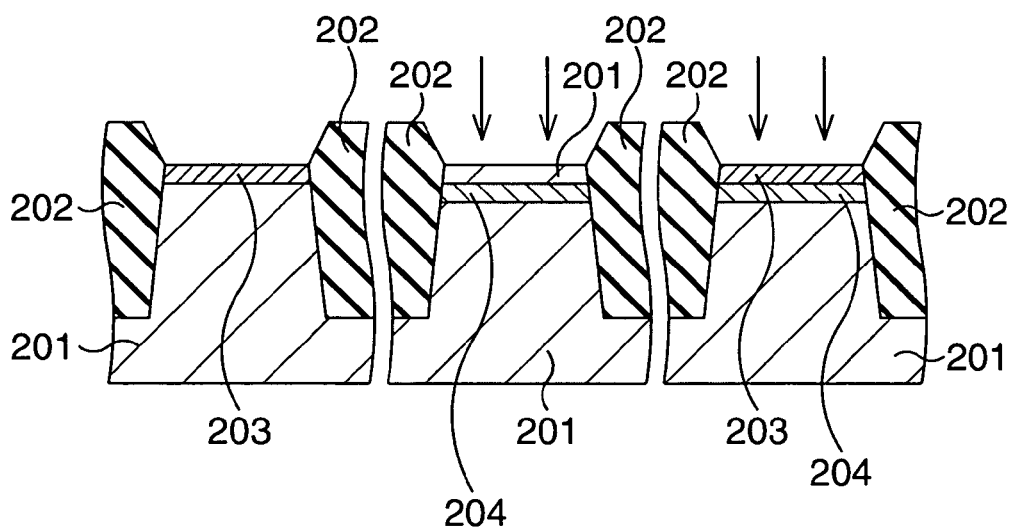

In contrast to this, in the first aspect of the present invention, as shown in FIG. 5A, for a p-type Si substrate 201 on which element isolation insulating films 202 are formed, channel doped layers 203 are formed by performing ion-implantation in the SRAM cell region and the logic circuit region, and thereafter, as shown in FIG. 5B, channel doped layers 204 are formed by performing ion-implantation not only in the I/O circuit region but also in the SRAM cell region. As a result, as for the nMOS transistor, the impurity profile in the SRAM cell region corresponds to the total of the impurity profile in the I/O circuit region and the impurity profile in the logic circuit region.

According to the above method, the threshold voltage of the transistor constituting the SRAM cell can be enhanced without changing the characteristics of the peripheral circuits such as the logic circuit and the I/O circuit, or without adding a new process step, and the transistor can be normally operated at low voltage and a large operation margin can be secured by extension.

Figure 6A:
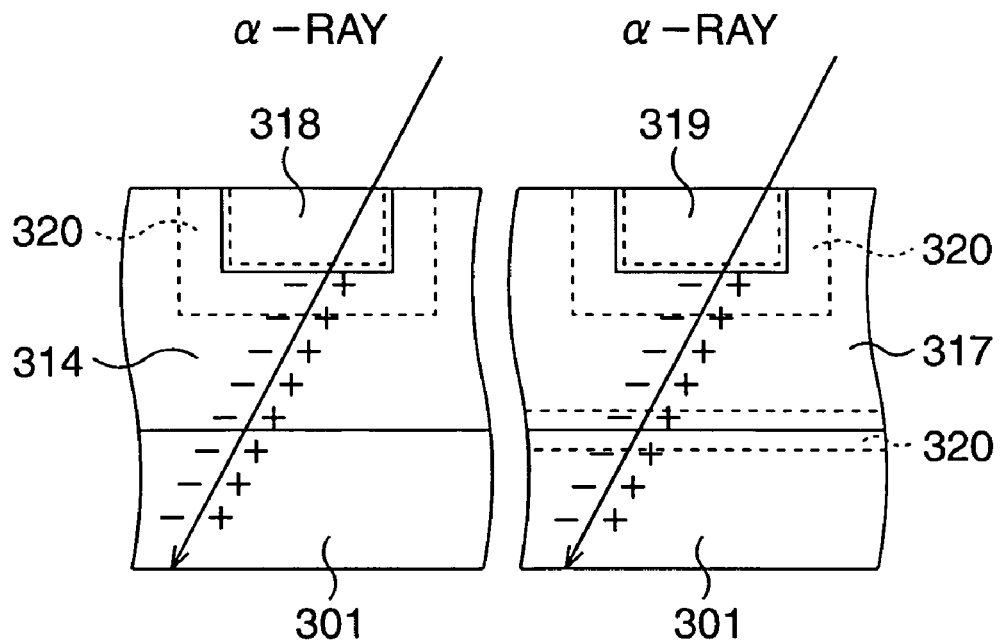
FIGS. 6A and 6B are sectional views showing a mechanism of occurrence of a soft error.
Figure 6B:
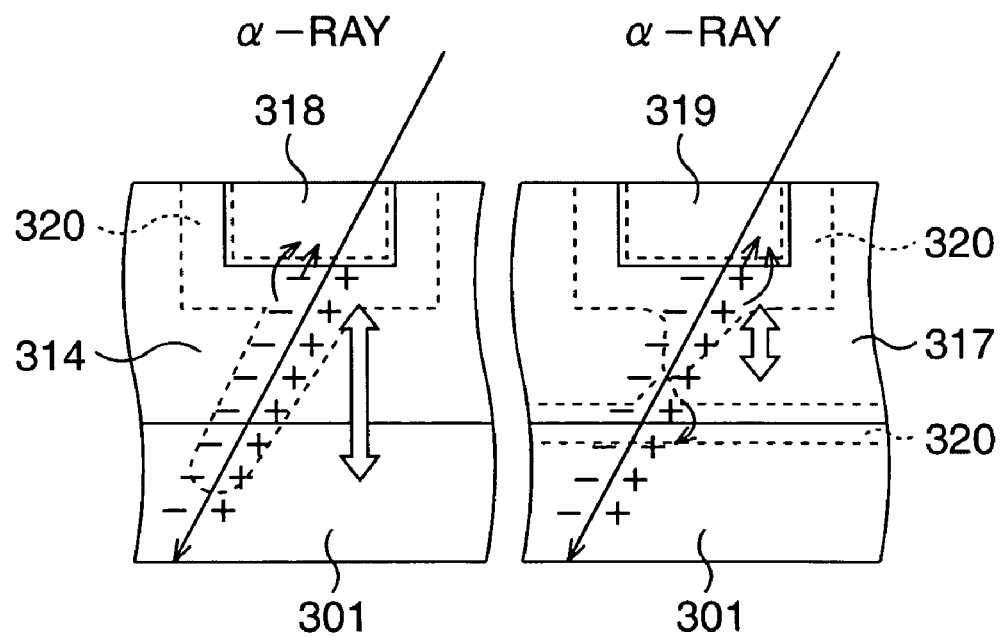

As described above, it is desired to further enhance the soft error resistance. Here, the occurrence mechanism of the soft error will be explained. Assume that a p-well 314 and an n-well 317 are formed on a p-type Si substrate 301, and an $n^+$ diffusion layer 318 and a $p^+$ diffusion layer 319 are formed in the respective p-well 314 and the n-well 317, as shown FIG. 6A. In the semiconductor device of such a structure, depletion layers 320 exist in the vicinity of the borders between the n-type regions and the p-type regions. When α-ray is incident on such a state, positive and negative electric charges are induced as shown in FIG. 6A. As a result, as shown in FIG. 6B, as the electric charges move, the depletion layers changes. On this occasion, the moving amount of the electrons to the $n^+$ diffusion layer 318 becomes large, and the soft error occurs. On the other hand, the moving amount of the positive holes to the $p^+$ diffusion layer 319 is not as large as the moving amount of the electrons, and the soft error due to this movement hardly occurs.

Figure 7A:
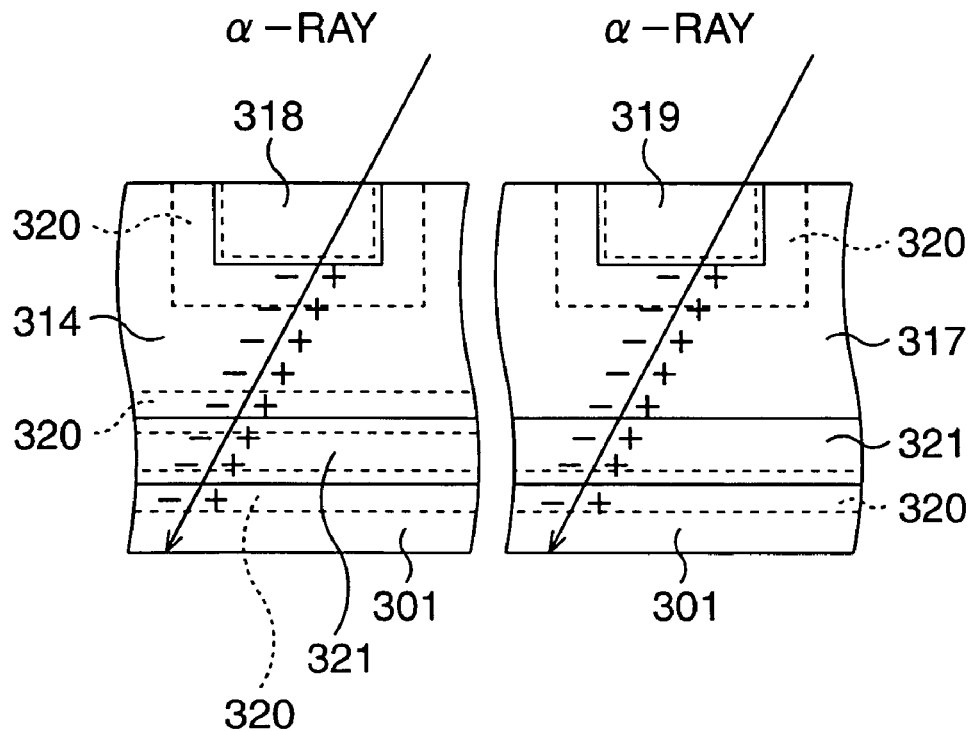
FIGS. 7A and 7B are sectional views showing an example of the measure against the soft error.
Figure 7B:
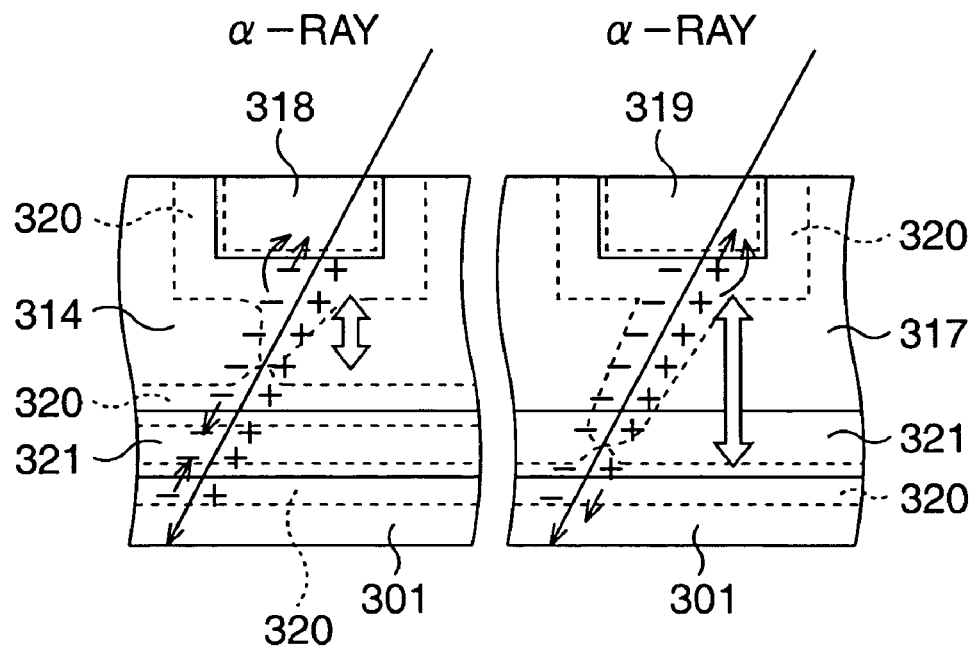

Thus, as shown in FIG. 7A, it is considered to form an $n^+$ well 321 between the Si substrate 301 and each of the wells 314 and 317. By forming the $n^+$ wells 321, even when the electric charges are induced by irradiation of the α-ray as shown in FIG. 7A, the change in the depletion layers 320 is decreased as shown in FIG. 7B. Accordingly, as for the nMOS transistor, the soft error resistance is enhanced. However, the change amount of the depletion layer 320 in the pMOS transistor increases, and it cannot be said that the soft error resistance is enhanced as a whole.

Figure 8A:
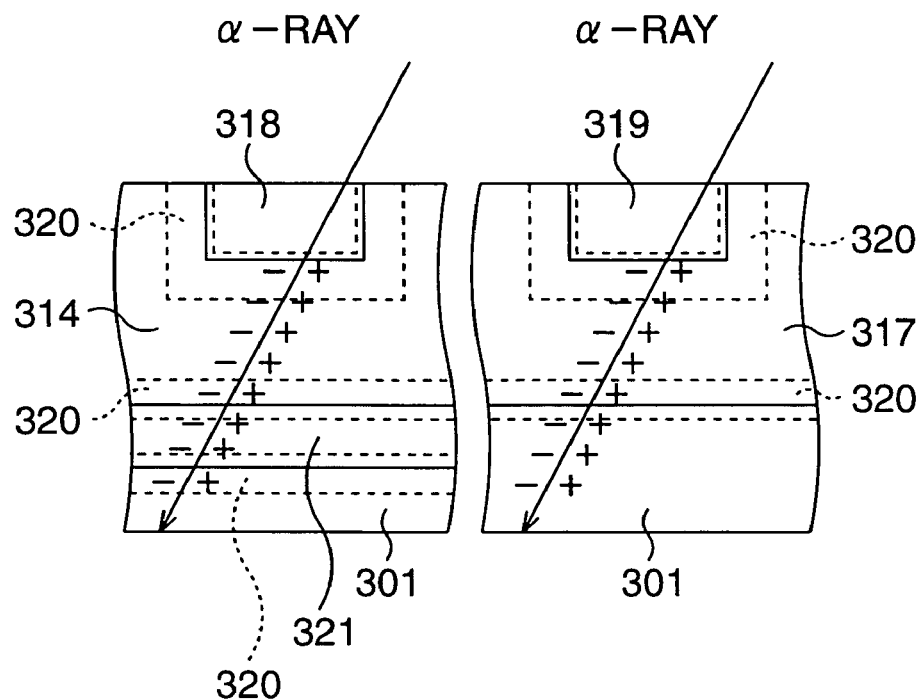
FIGS. 8A and 8B are sectional views showing an example of the measure against the soft error according to a second aspect of the present invention.
Figure 8B:
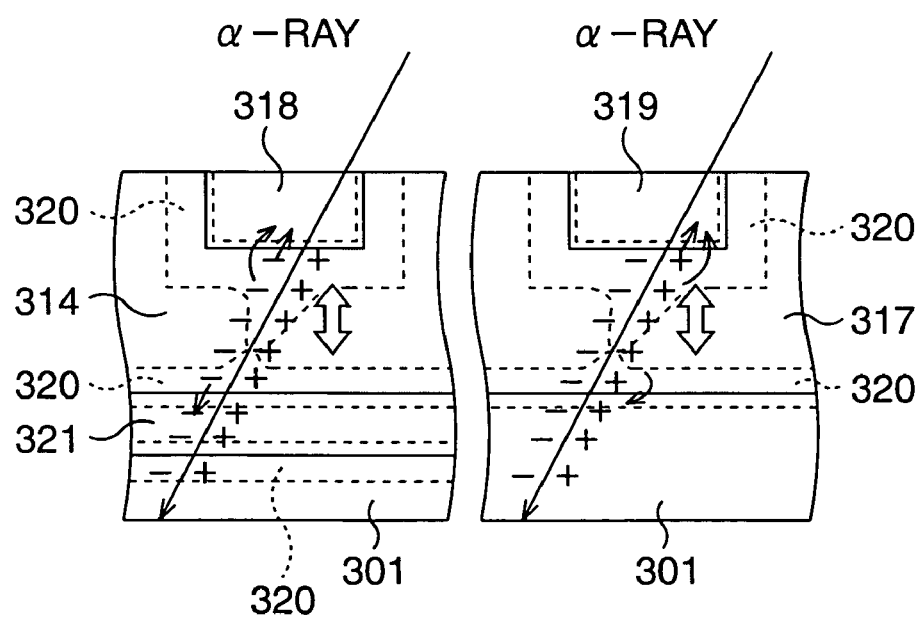

Thus, the inventors of the present application formed the $n^+$ well 321 between the Si substrate 301 and the p-well 314 for only the nMOS transistor, and the Si substrate 301 and the n-well 317 were made in contact with each other in the pMOS transistor as shown in FIG. 8A. Thereby, the inventors have found out that the change amount of the depletion layer 320 becomes small as shown in FIG. 8B, and the soft error resistance could be enhanced for both the nMOS transistor and the pMOS transistor.

Figure 9A:
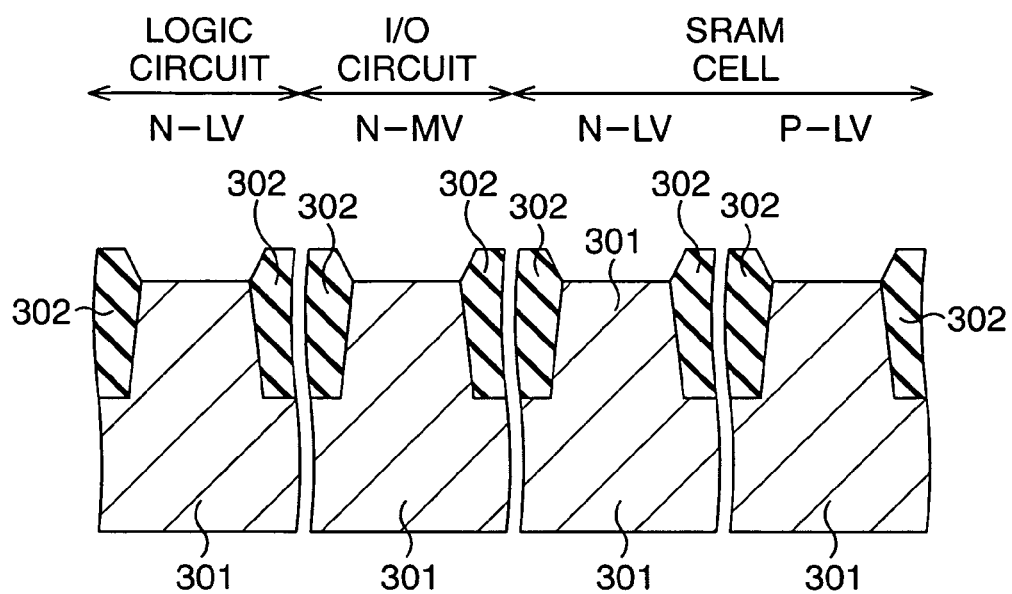
FIGS. 9A, 9B and 9C are sectional views showing a conventional manufacturing method of a semiconductor device concerning the formation of wells.
Figure 9B:
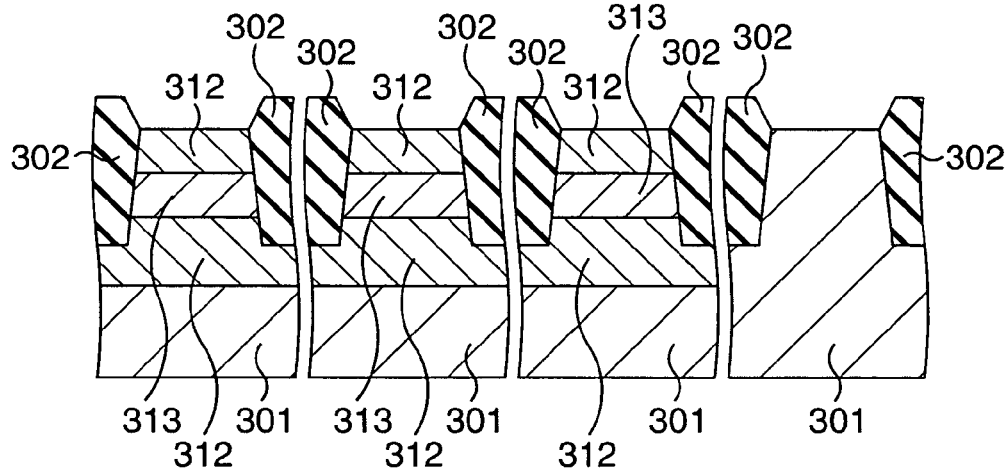
Figure 9C:
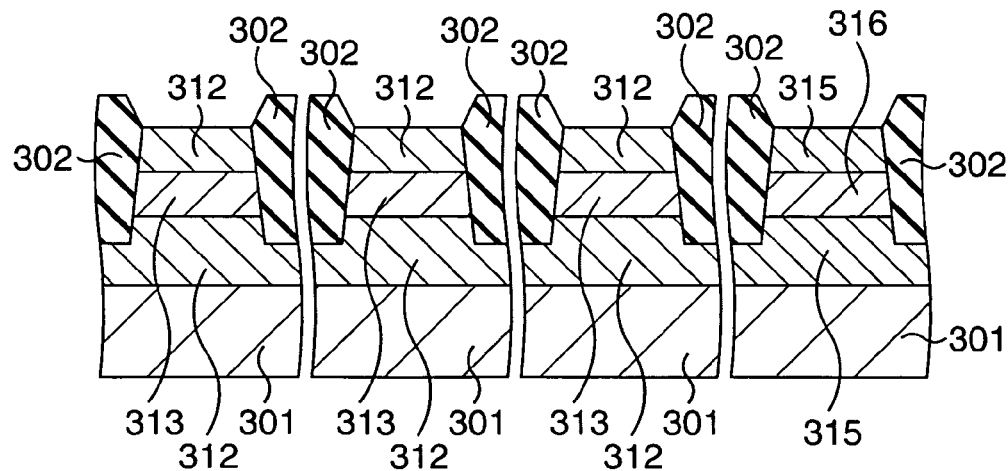

In the conventional manufacturing method, as for the process steps up to the formation of the wells, after the element isolation insulating films 302 are formed on the surface of the p-type Si substrate 301 as shown in FIG. 9A, the p-wells 312 are formed in the element active regions in which the nMOS transistors are to be formed in the SRAM cell region, the logic circuit region and the I/O circuit region as shown in FIG. 9B. Next, the p-wells 313 of the higher impurity concentration are formed in the p-wells 312. Thereafter, as shown in FIG. 9C, the n-well 315 is formed in the element active region in which the pMOS transistor is to be formed in the SRAM cell region, the logic circuit region and the I/O circuit region, and thereafter, the n-well 316 of the higher impurity concentration is formed in the n-well 315.

Figure 10A:
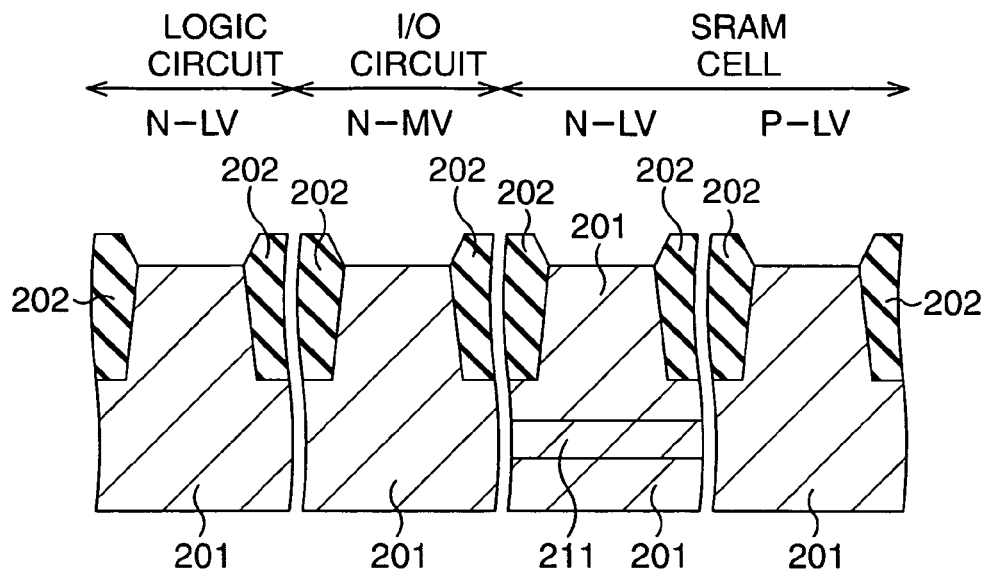
FIGS. 10A, 10B and 10C are sectional views showing a manufacturing method of a semiconductor device according to a second aspect of the present invention, concerning the formation of wells.
Figure 10B:
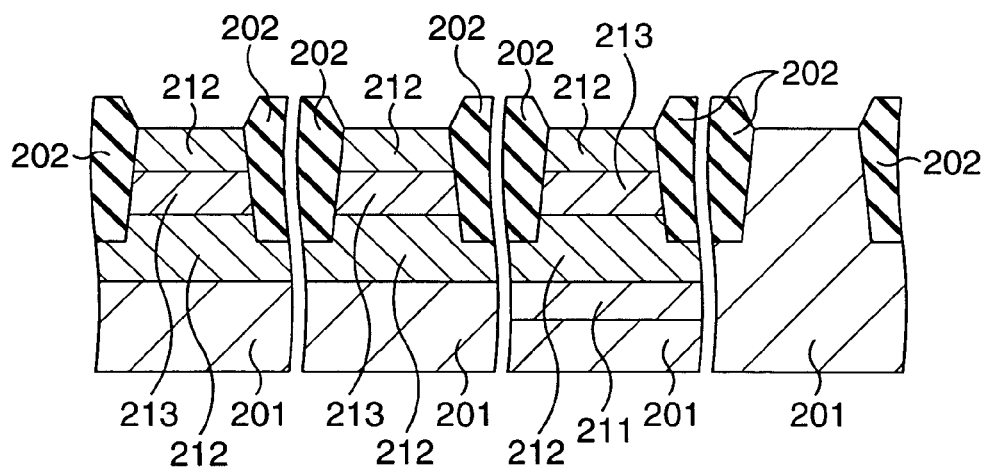
Figure 10C:
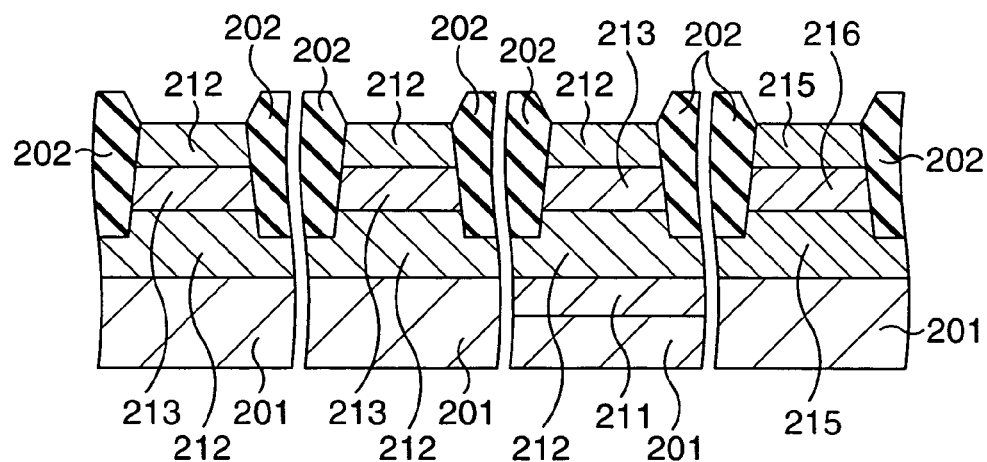

In contrast to this, in the second aspect of the present invention, as shown in FIG. 10A, after the element isolation insulating films 202 are formed on the surface of the p-type Si substrate 201, an n-type buried layer 211 is formed by, for example, ion implantation. Next, as shown in FIG. 10B, p-wells 212 are formed in the element active regions in which the nMOS transistors are to be formed in the SRAM cell region, the logic circuit region and the I/O circuit region. Next, p-wells 213 of higher impurity concentration are formed in the p-wells 212. Thereafter, as shown in FIG. 10C, an n-well 215 is formed in the element active region in which the pMOS transistor is to be formed in the SRAM cell region, the logic circuit region and the I/O circuit region, and thereafter an n-well 216 of the higher impurity concentration is formed in the n-well 215.

In the semiconductor device manufactured according to such a method, the change in the depletion layer in the SRAM cell is suppressed even if α-ray is irradiated, and thus the soft error hardly occurs.

Embodiments of the present invention will be concretely explained hereinafter with reference to the attached drawings. However, the sectional structure of the semiconductor device will be explained with the manufacturing method thereof for convenience.

First Embodiment

Figure 11A:
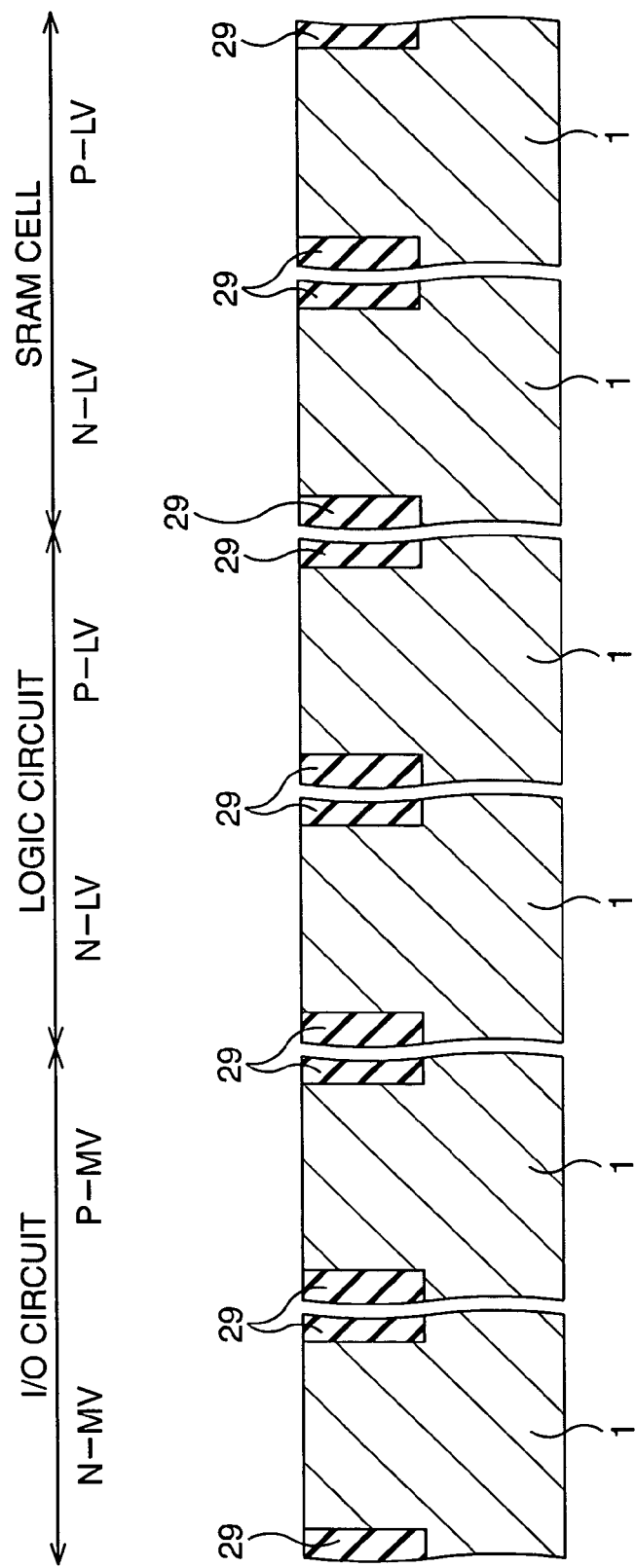
FIG. 11A to FIG. 11S are sectional views showing a manufacturing method of a semiconductor device according to a first embodiment of the present invention in the sequence of the process steps.

Initially, a first embodiment of the present invention will be explained. FIG. 11A to FIG. 11S are sectional views showing a manufacturing method of a semiconductor device according to a first embodiment of the present invention. In this embodiment, an I/O circuit, a logic circuit and a SRAM cell each including an nMOS transistor and a pMOS transistor are formed in one chip. In a logic circuit region and a SRAM cell region, the transistors operated at low voltage are formed, and the transistors operated at higher voltage (medium voltage) are formed in the I/O circuit region. A region in which the nMOS transistor operated at a low voltage is formed is called an N-LV region, a region in which the pMOS transistor operated at a low voltage is formed is called a P-LV region, a region in which the nMOS transistor operated at a medium voltage is formed is called an N-MV region, and a region in which the pMOS transistor operated at a medium voltage is formed is called a P-MV region.

In the first embodiment, element isolation insulating films 29 are formed on a surface of an Si substrate 1 first as shown in FIG. 11A. Next, by thermally oxidizing (sacrificial oxidation) the surface of the Si substrate 1, an Si oxidation film (not shown) of the thickness of about 10 nm is formed.

Figure 11B:
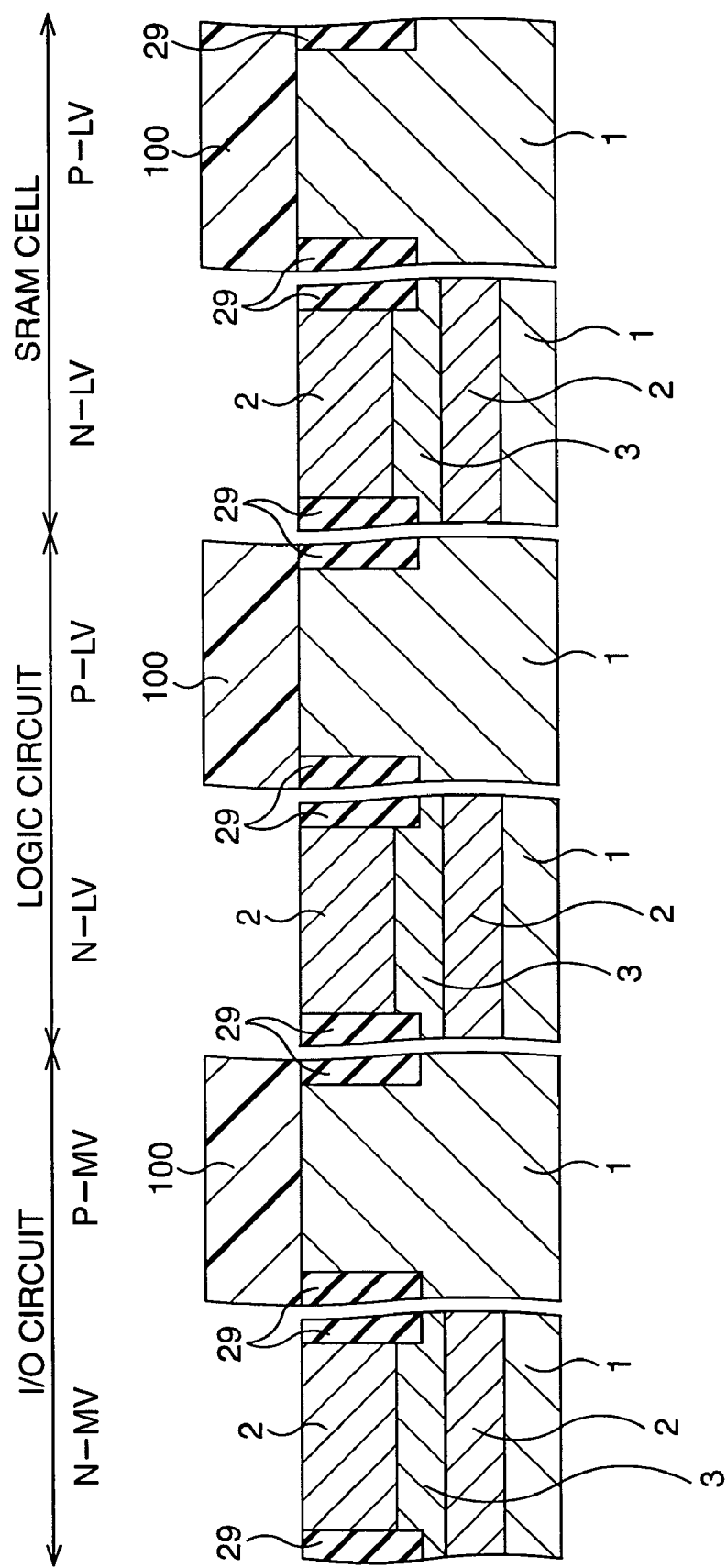

Next, as shown in FIG. 11B, a photoresist mask 100 exposing the N-MY region and the N-LV regions is formed by a photolithography technique. Thereafter, by performing ion implantation with the photoresist mask 100 as a mask, p-wells 2 and 3 are formed. In formation of the p-well 2, for example, boron ion is ion-implanted under the condition of the acceleration energy: 400 keV and the dose amount: $1.5 \times 10^{13}$ cm$^{-2}$. In formation of the p-well 3, for example, boron ion is ion-implanted under the condition of the acceleration energy: 100 keV and the dose amount: $8 \times 10^{12}$ cm$^{-2}$. As a result, the p-well of higher impurity concentration is formed in the p-well 2.

Figure 11C:
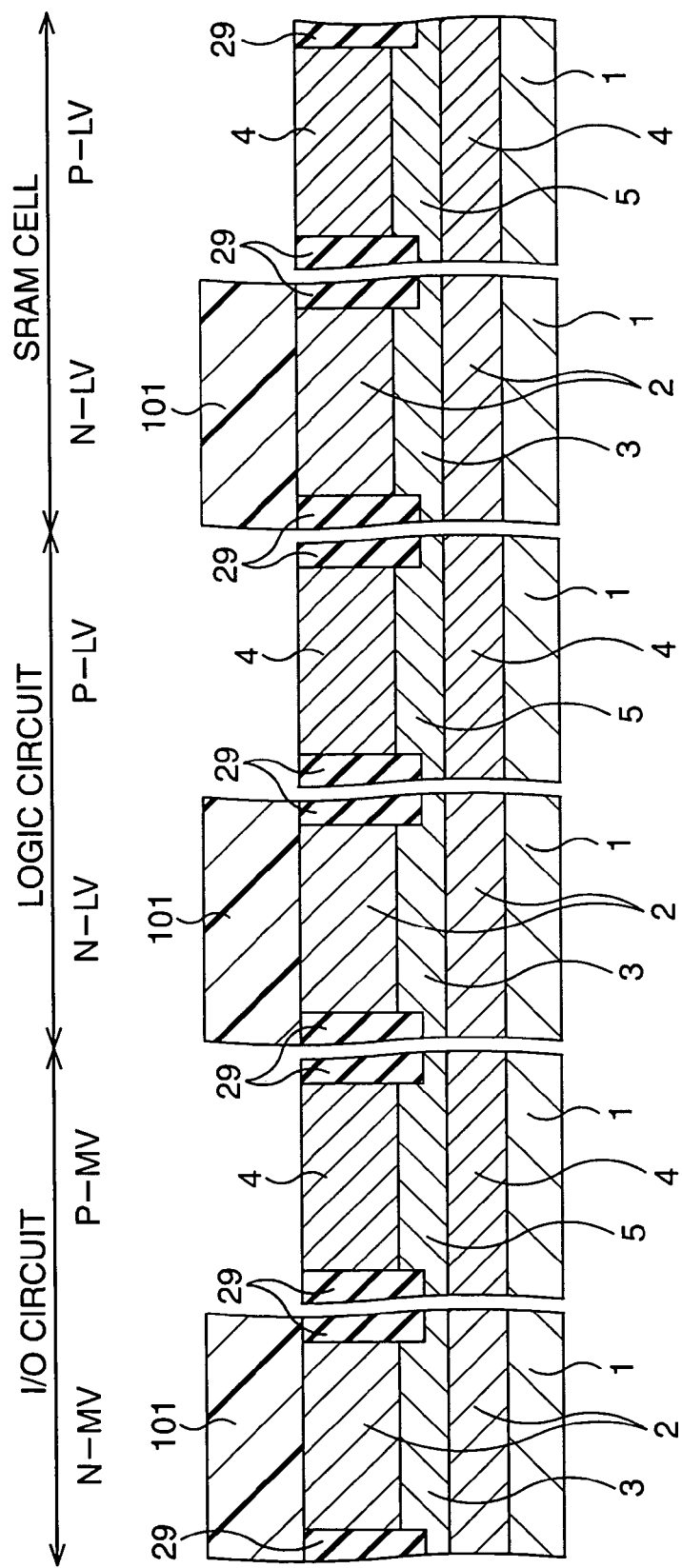

Subsequently, as shown in FIG. 11C, the photoresist mask 100 is removed by, for example, ashing. Next, a photoresist mask 101 exposing the P-MV region and the P-LV regions is formed by a photolithography technique. Next, with the photoresist mask 101 as a mask, ion implantation is performed, and thereby, n-wells 4 and 5 are formed. In formation of the n-wells 4, for example, phosphorus ion is ion-implanted under the condition of the acceleration energy: 600 keV and the dose amount: $1.5 \times 10^{13}$ cm$^{-2}$. In formation of the n-wells 5, for example, phosphorus ion is ion-implanted under the condition of the acceleration energy: 240 keV, and the dose amount: $5 \times 10^{12}$ cm$^{-2}$. As a result, the n-well 5 of higher impurity concentration is formed in each of the n-wells 4.

Figure 11D:
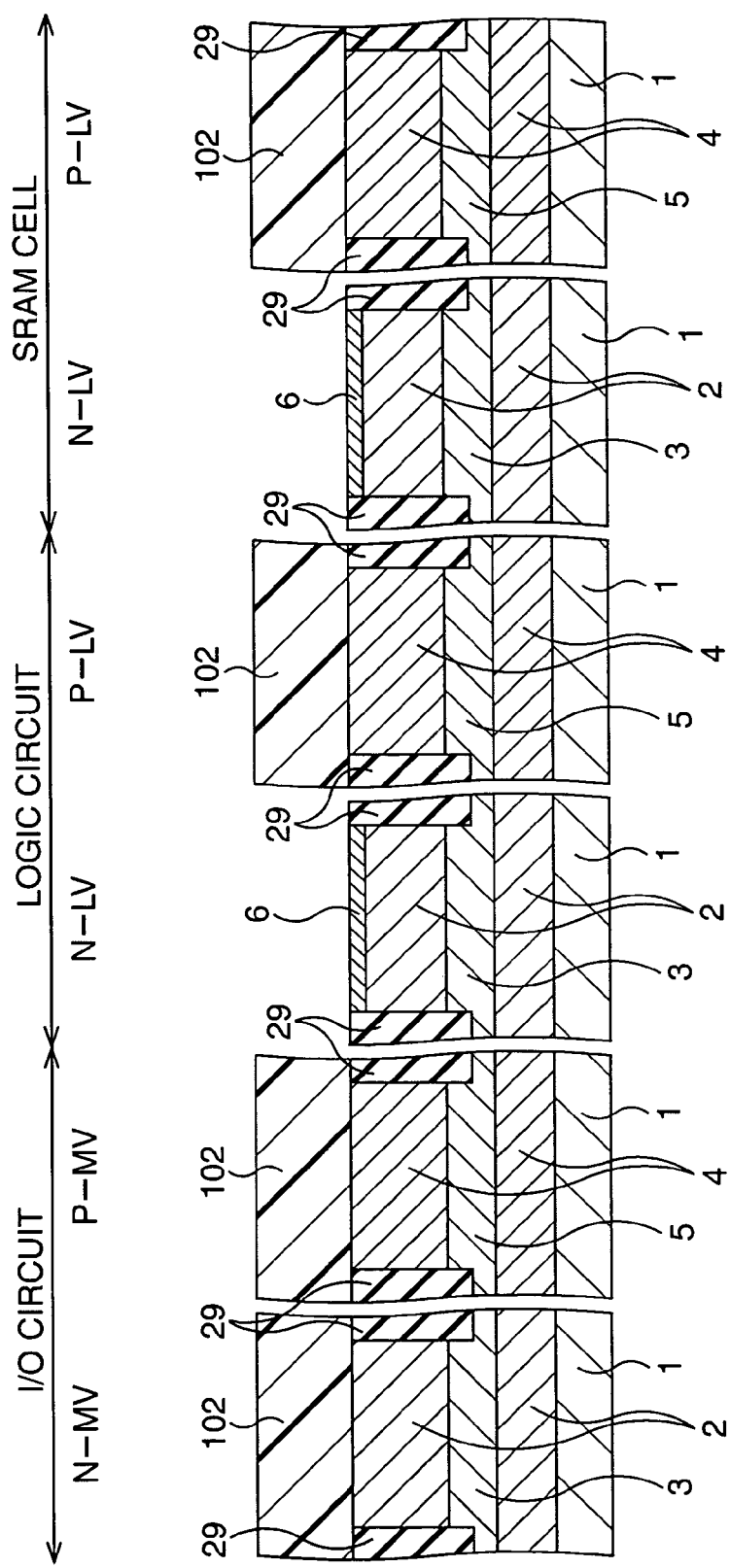
Figure 11E:
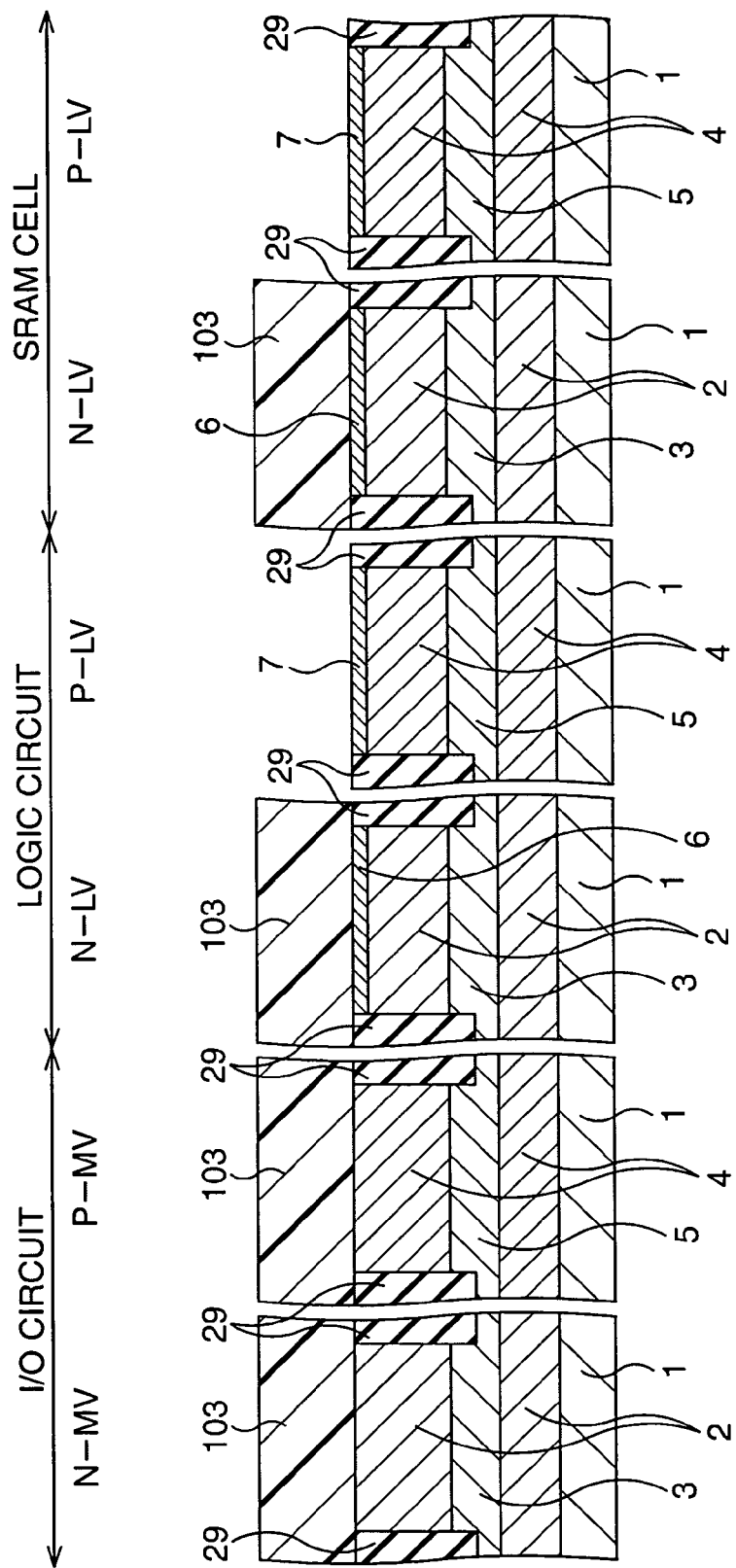

Next, as shown in FIG. 11D, the photoresist mask 101 is removed by, for example, ashing. Thereafter, a photoresist mask 102 exposing the N-LV regions is formed by a photolithography technique. Thereafter, with the photoresist mask 102 as a mask, ion implantation is performed, and thereby, channel doped layers 6 are formed as a p-type threshold voltage control impurity layer. In formation of the channel-doped layers 6, for example, boron ion is ion-implanted under the condition of the acceleration energy: 15 keV and the dose amount: $8 \times 10^{12}$ cm$^{-2}$.

Subsequently, as shown in FIG. 1E, the photoresist mask 102 is removed by, for example, ashing. Next, a photoresist mask 103 exposing the P-LV regions is formed by a photolithography technique. Next, with the photoresist mask 103 as a mask, ion implantation is performed, and thereby, channel doped layers 7 are formed as an n-type threshold voltage control impurity layer. In formation of the channel-doped layers 7, for example, arsenic ion is ion-implanted under the condition of the acceleration energy: 150 keV and the dose amount: $3 \times 10^{12}$ cm$^{-2}$.

Figure 11F:
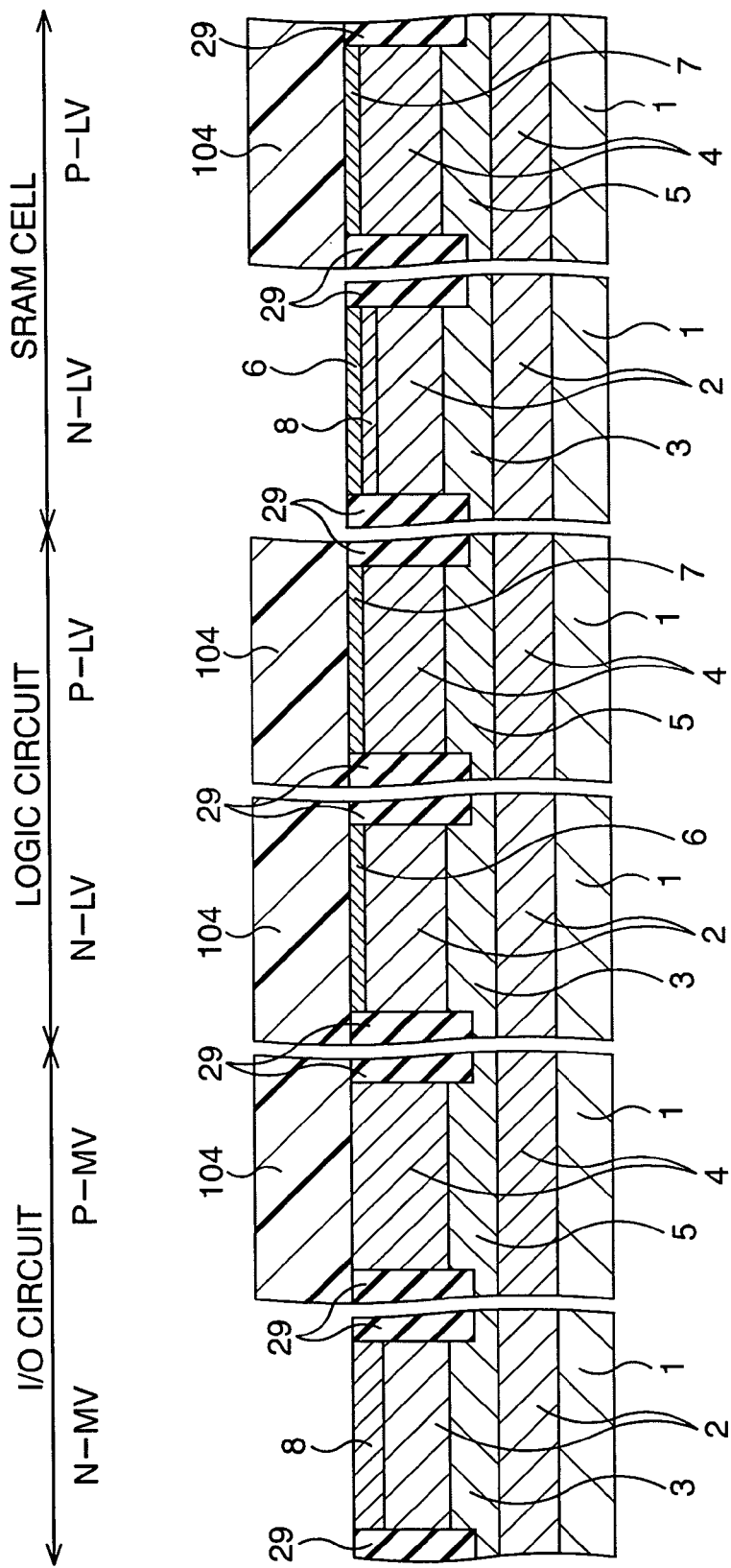

Thereafter, as shown in FIG. 11F, the photoresist mask 103 is removed by, for example, ashing. Subsequently, a photoresist mask 104 exposing the N-MV region and the N-LV region of the SRAM cell region is formed by a photolithography technique. Next, with the photoresist mask 104 as a mask, ion implantation is performed, and thereby, channel doped layers 8 are formed as the threshold voltage control impurity layers. Accordingly, in the N-LV region of the SRAM cell region, the channel doped layers 6 and 8 are formed. Namely, the N-LV region of the SRAM cell region is in the same state as the state shown in FIG. 5B. In formation of the channel-doped layer 8, for example, boron ion is ion-implanted under the condition of the acceleration energy: 35 keV and the dose amount: $4.5 \times 10^{12}$ cm$^{-2}$.

Figure 11G:
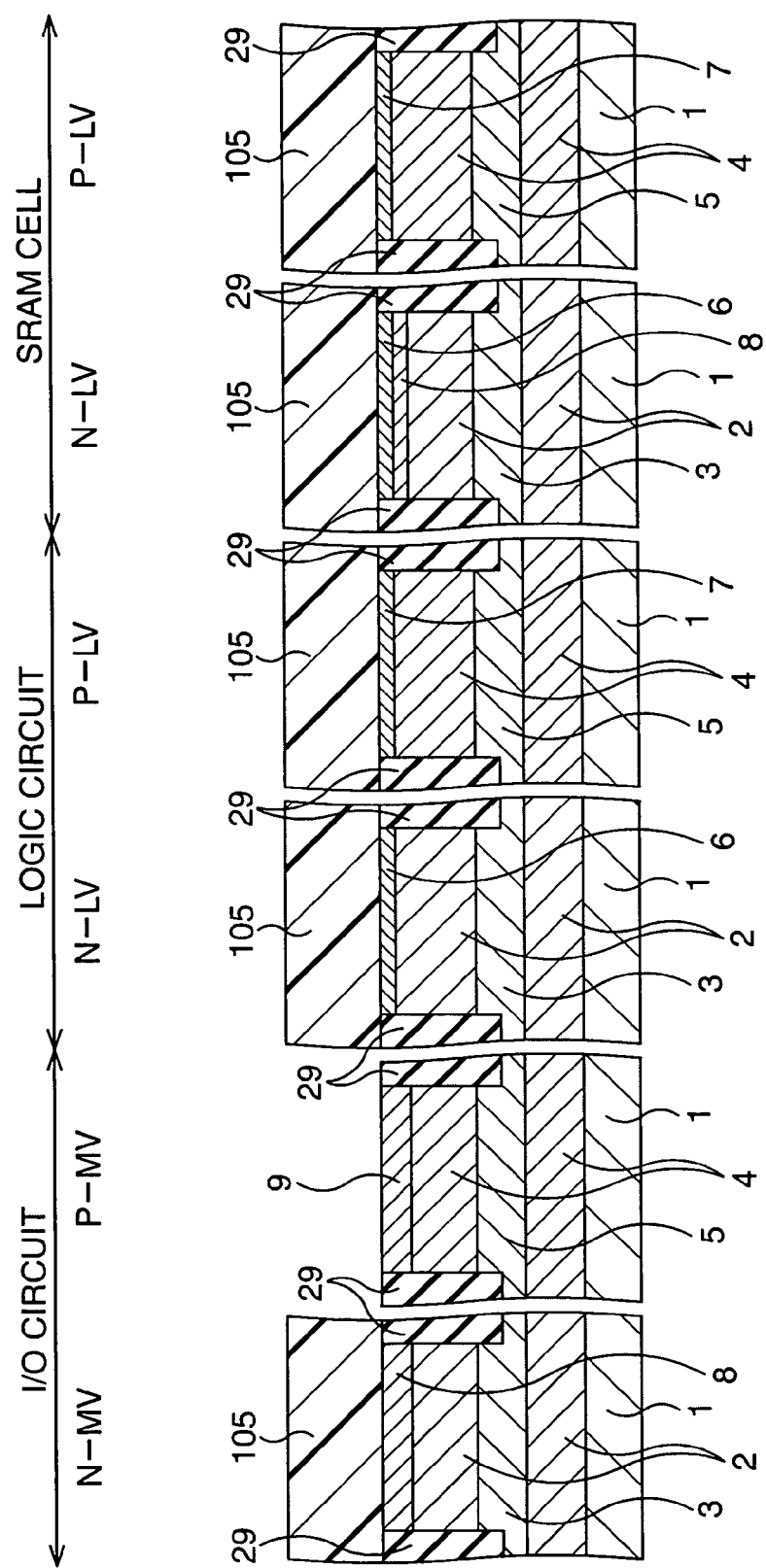

Next, as shown in FIG. 11G, the photoresist mask 104 is removed by, for example, ashing. Thereafter, a photoresist mask 105 exposing the P-MV region is formed by a photolithography technique. Subsequently, with the photoresist mask 105 as a mask, ion implantation is performed, and thereby, a channel doped layer 9 is formed as the n-type threshold voltage control impurity layers. In formation of the channel-doped layers 9, for example, arsenic ion is ion-implanted under the condition of the acceleration energy: 150 keV and the dose amount: $2 \times 10^{12}$ cm$^{-2}$.

Figure 11H:
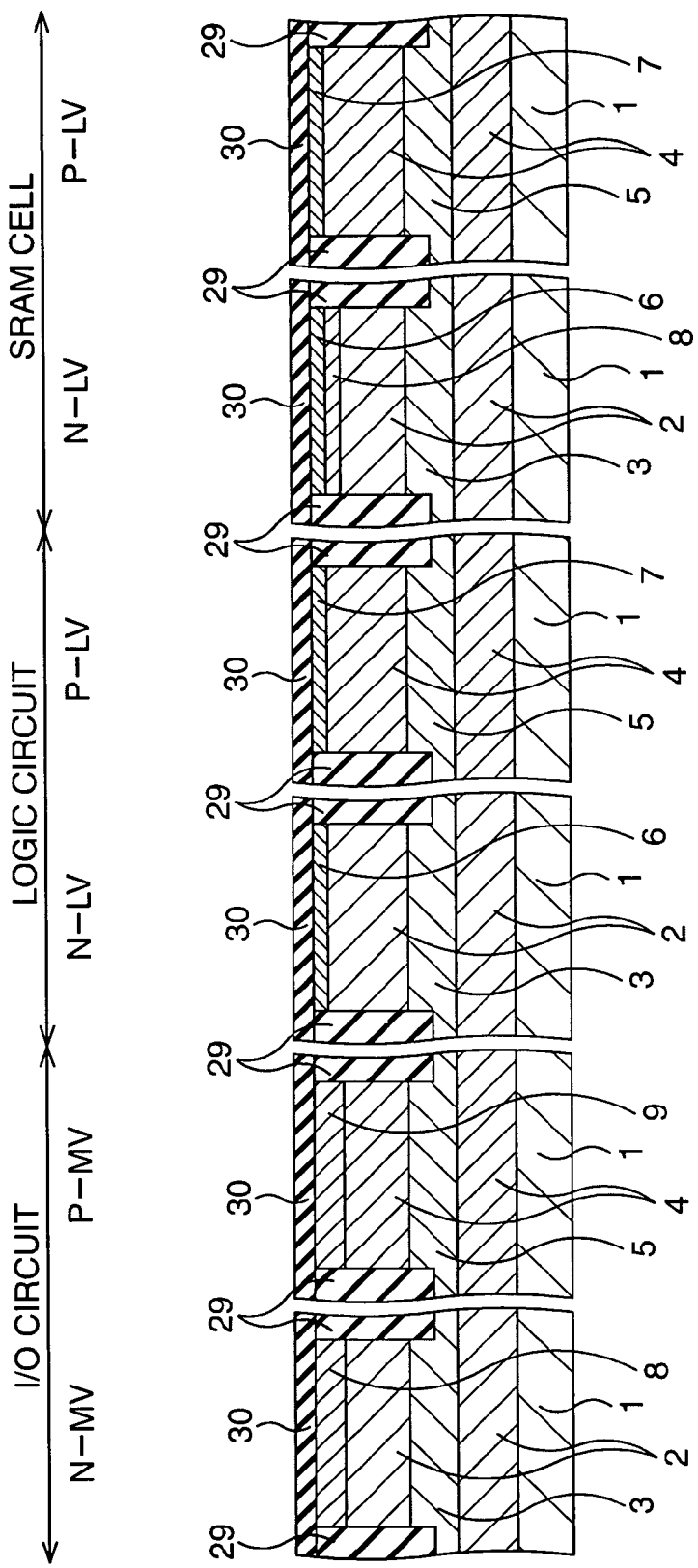

Next, as shown in FIG. 11H, the photoresist mask 105 is removed by, for example, ashing. Next, silicone oxide films each of the film thickness of about 7 nm are formed on the active regions of the N-MV region, the P-MV region, the N-LV regions and the P-LV regions as gate insulation films 30 by performing thermal oxidation at, for example, the temperature of 850° C.

Figure 11I:
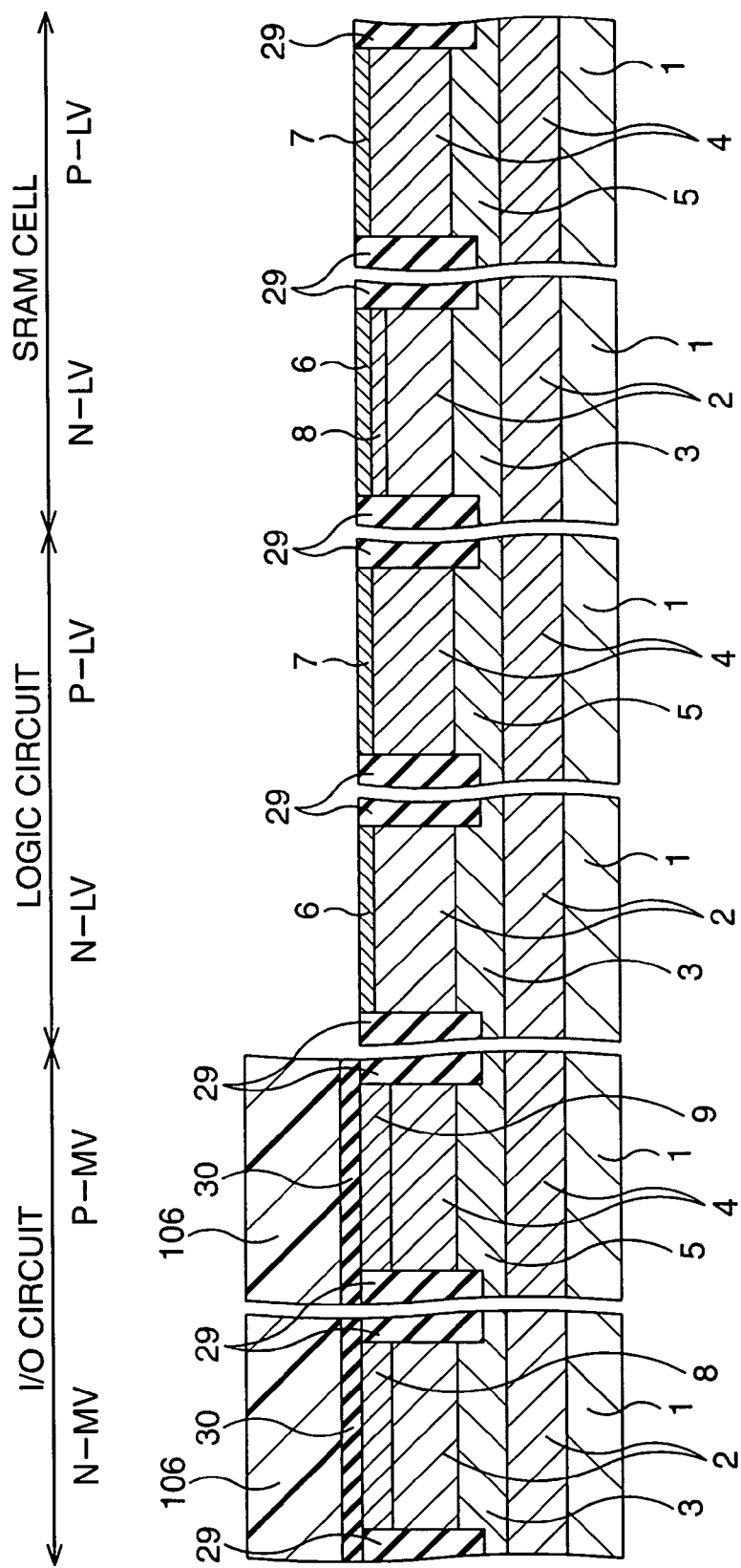

Next, as shown in FIG. 11I, a photoresist mask 106 covering the N-MV region and the P-MV region and exposing the regions in which the low-voltage transistors are to be formed (the N-LV regions and the P-LV regions) is formed by a photolithography technique. Thereafter, by wet etching using, for example, a hydrofluoric acid aqueous solution, the gate insulation films 30 are etched with the photoresist masks 106 as a mask. As a result, the gate insulation films 30 in the N-LV regions and the P-LV regions are removed.

Figure 11J:
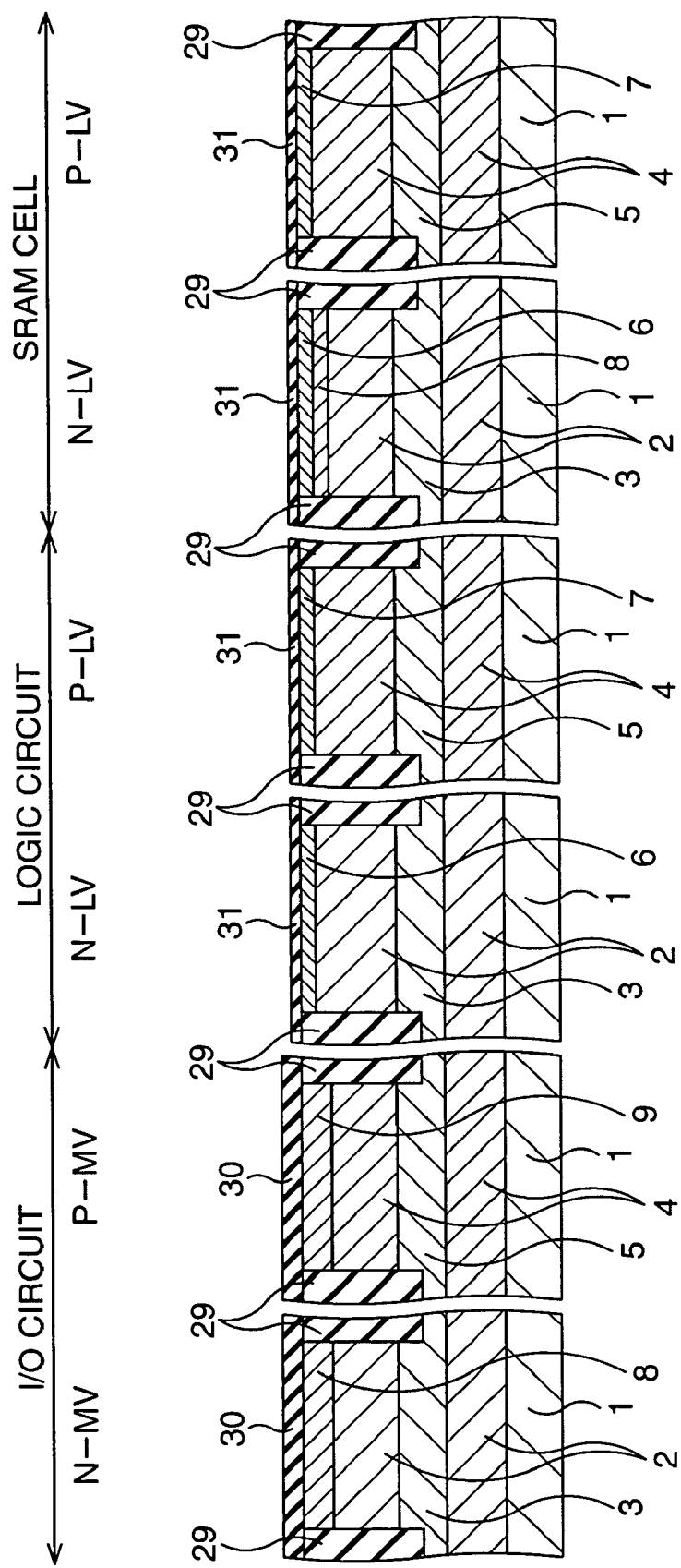

Subsequently, as shown in FIG. 11J, the photoresist mask 106 is removed by, for example, ashing. Next, silicone oxide films each of the film thickness of about 1.8 nm are formed on the active regions of the N-LV regions and the P-LV formation regions as gate insulation films 31 by performing thermal oxidation at, for example, the temperature of 850° C. The film thickness of the gate insulation film 30 increases up to about 8.8 nm by this thermal oxidation.

Figure 11K:
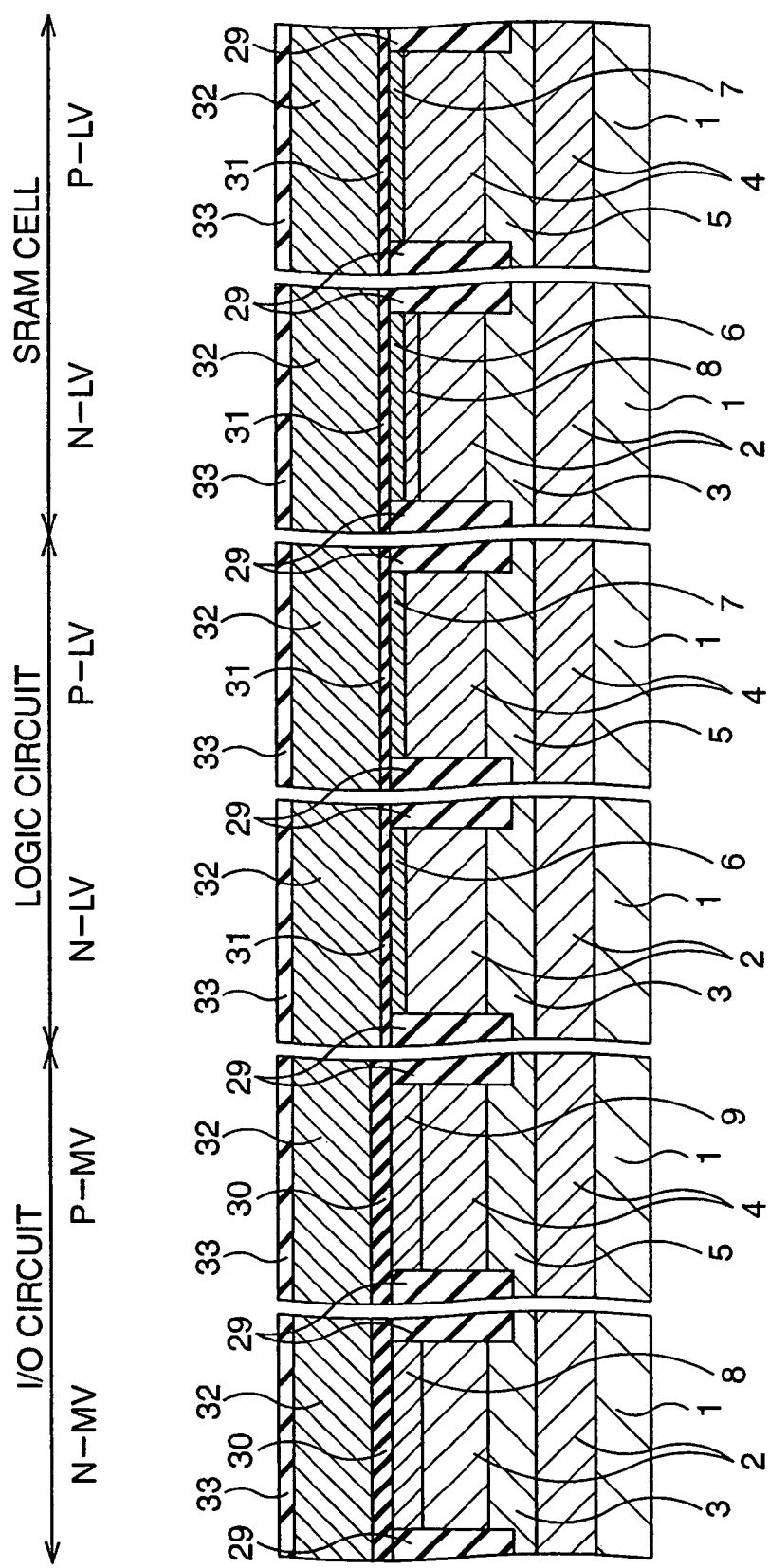

Next, as shown in FIG. 11K, a polysilicon film 32 of the film thickness of about 180 nm, for example, is formed by a CVD method, and a silicon nitride film 33 of the film thickness of about 30 nm, for example, is formed on the polysilicon film 32 as a etching mask also serving as an antireflection film.

Figure 11L:
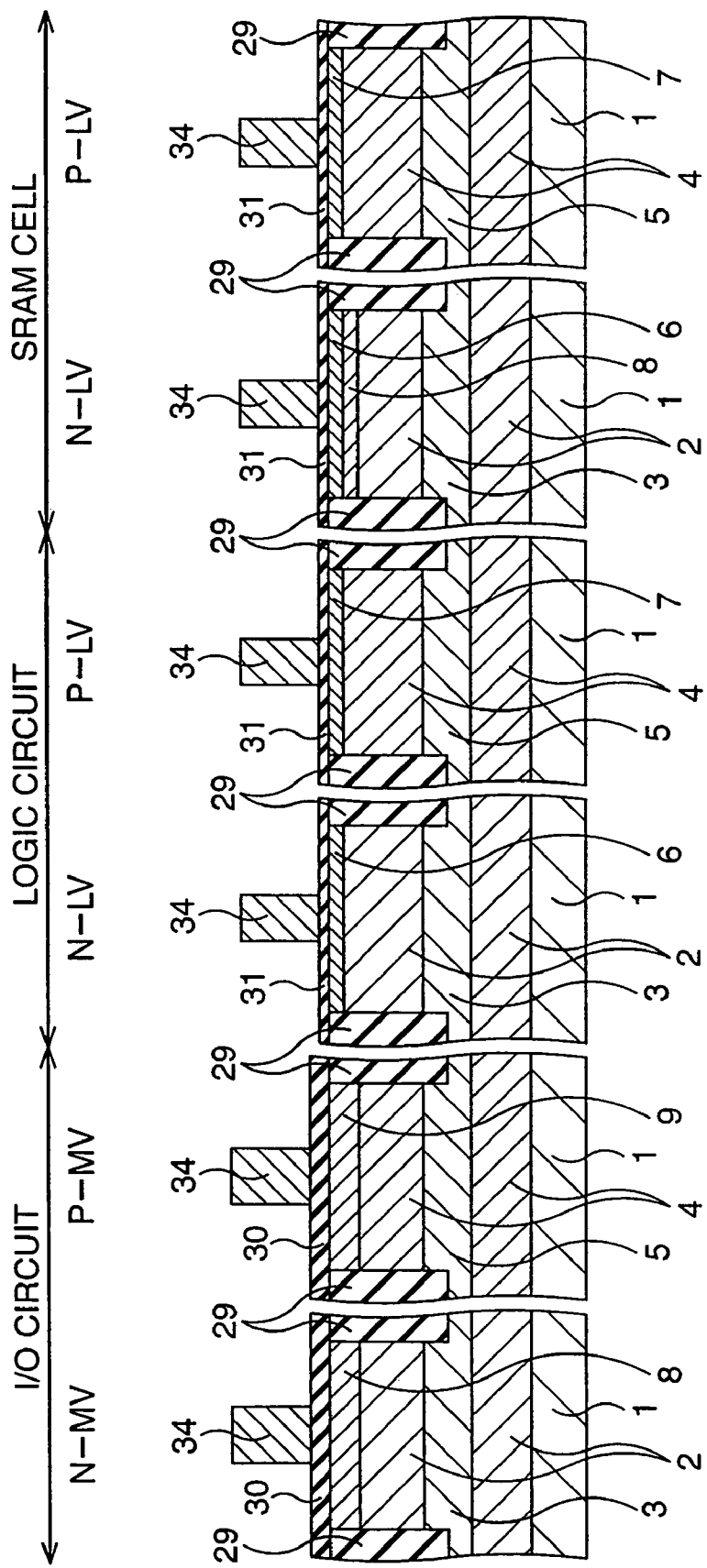

Thereafter, as shown in FIG. 11L, the polysilicon film 32 is patterned by a photolithography technique and a dry etching technique, and thereby gate electrodes 34 are formed in the N-MV region, the P-MV region, the N-LV regions and the P-LV regions. At this time, the width of each of the gate electrodes 34 in the N-MV region and the P-MV region is made larger than the width of each of the gate electrodes 34 in the N-LV regions and the P-LV regions.

Figure 11M:
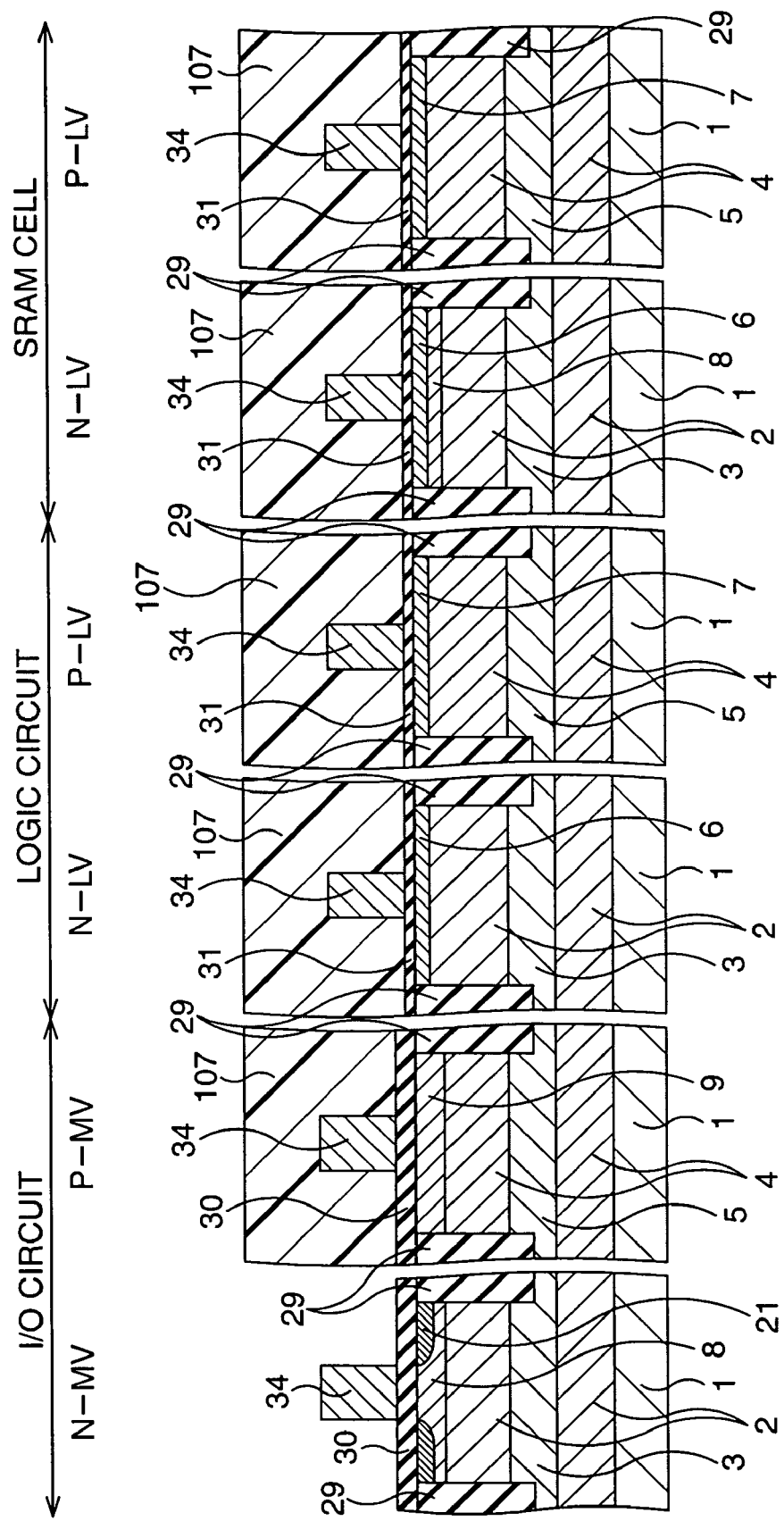

Subsequently, as shown in FIG. 11M, a photoresist mask 107 exposing the N-MV region and covering the other regions is formed by a photolithography technique. Next, an extension layer 21 for forming a source/drain of the N-MV region is formed by performing ion implantation with the photoresist mask 107 as a mask. In formation of the extension layer 21, for example, phosphorus ion is ion-implanted under the condition of the acceleration energy: 35 keV and the dose amount: $4 \times 10^{13}$ cm$^{-2}$.

Figure 11N:
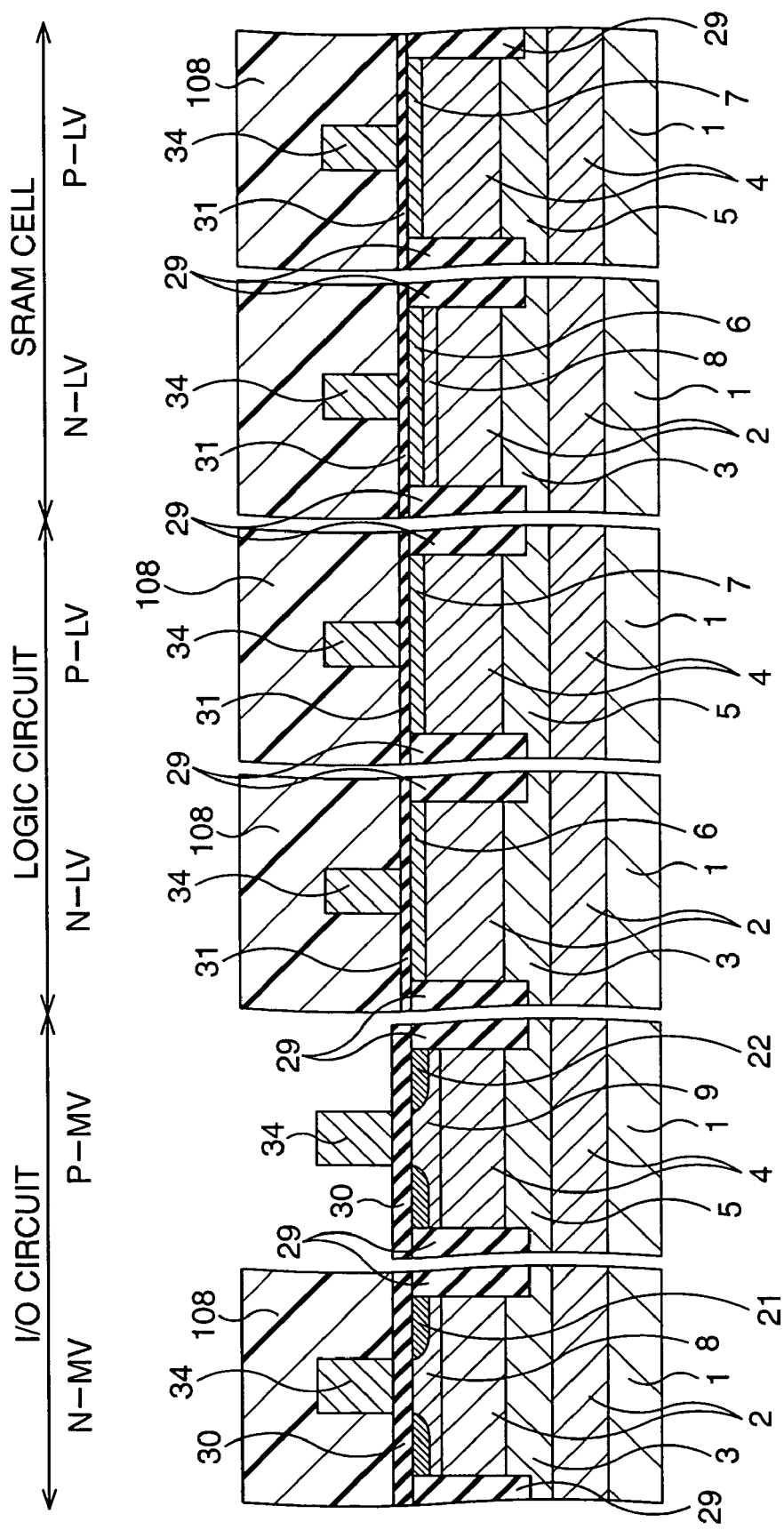

Next, as shown in FIG. 11N, the photoresist mask 107 is removed by, for example, ashing. Thereafter, a photoresist mask 108 exposing the P-MV region and covering the other regions is formed by a photolithography technique. Subsequently, an extension layer 22 for forming a source/drain of the P-MV region is formed by performing ion implantation with the photoresist mask 108 as a mask. In formation of the extension layer 22, for example, boron fluoride ion is ion-implanted under the condition of the acceleration energy: 10 keV and the dose amount: $4 \times 10^{13}$ cm$^{-2}$.

Figure 11O:
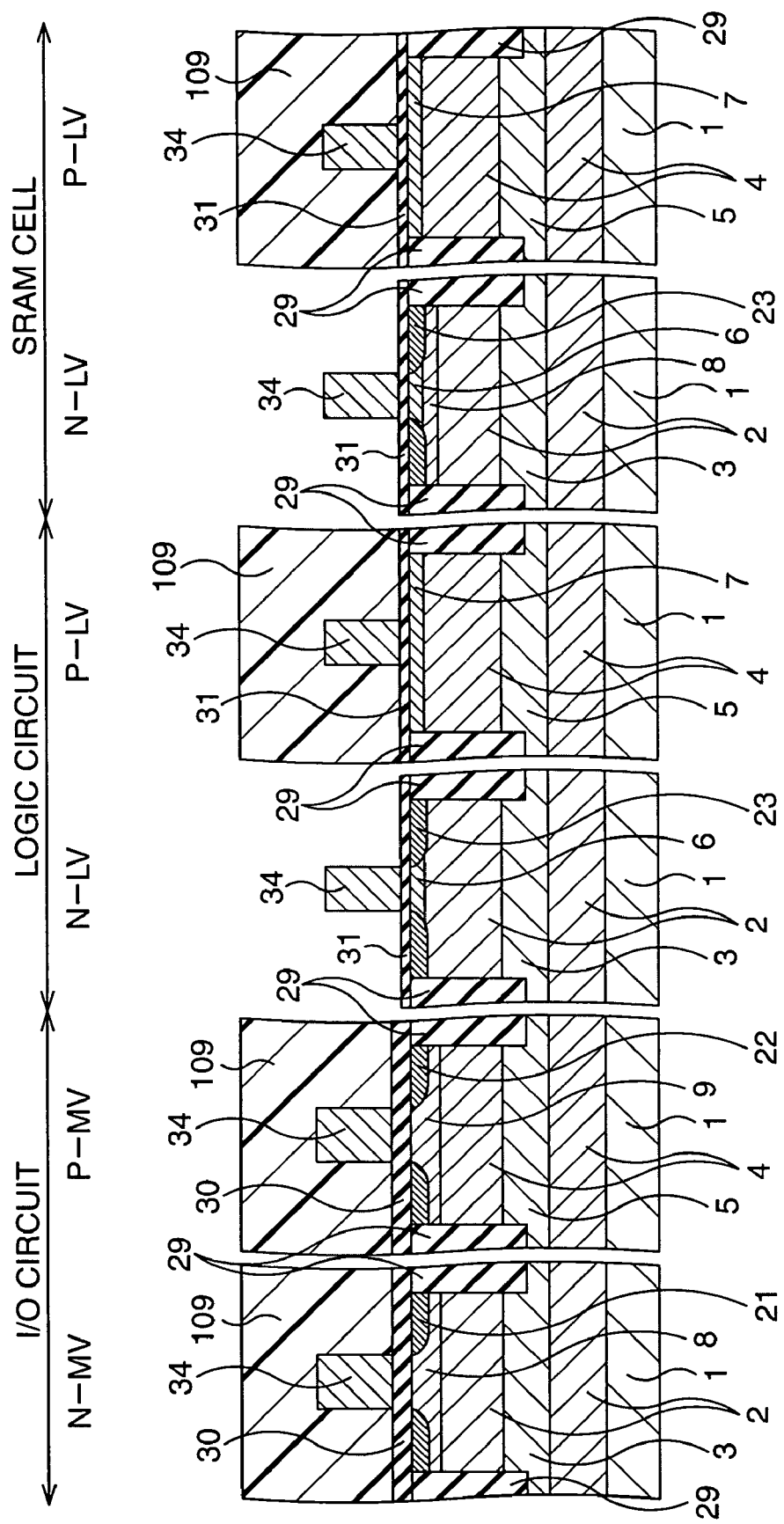

Next, as shown in FIG. 11O, the photoresist mask 108 is removed by, for example, ashing. Next, a photoresist mask 109 exposing the N-LV regions and covering the other regions is formed by a photolithography technique. Thereafter, ion-implantation is performed with the photoresist mask 109 as a mask, and thereby, extension layers 23 for forming sources/drains of the N-LV regions are formed. In formation of the extension layer 23, for example, arsenic ion is ion-implanted under the condition of the acceleration energy: 3 keV and the dose amount: $1 \times 10^{15}$ cm$^{-2}$, and thereafter, boron fluoride ion is ion-implanted from the four directions inclined 28 degrees from the normal line of the Si substrate 1. under the condition of the acceleration energy: 80 keV and the dose amount: $4 \times 10^{12}$ cm$^{-2}$ for each. As a result, the extension layer 23 becomes an extension layer including a pocket layer (not shown).

Subsequently, as shown in FIG. 11P, the photoresist mask 109 is removed by, for example, ashing. Next, a photoresist mask 110 exposing the P-LV regions and covering the other regions is formed by a photolithography technique. Next, ion-implantation is performed with the photoresist mask 110 as a mask, and thereby, extension layers 24 for forming sources/drains of the P-LV regions are formed. In formation of the extension layer 24, for example, boron ion is ion-implanted under the condition of the acceleration energy: 0.5 keV and the dose amount: $6 \times 10^{14}$ cm$^{-2}$, and thereafter, arsenic ion is ion-implanted from the four directions inclined 28 degrees from the normal line of the Si substrate 1 under the condition of the acceleration energy: 120 keV and the dose amount: $5 \times 10^{12}$ cm$^{-2}$ for each. As a result, the extension layer 24 becomes an extension layer including a pocket layer (not shown).

Figure 11Q:
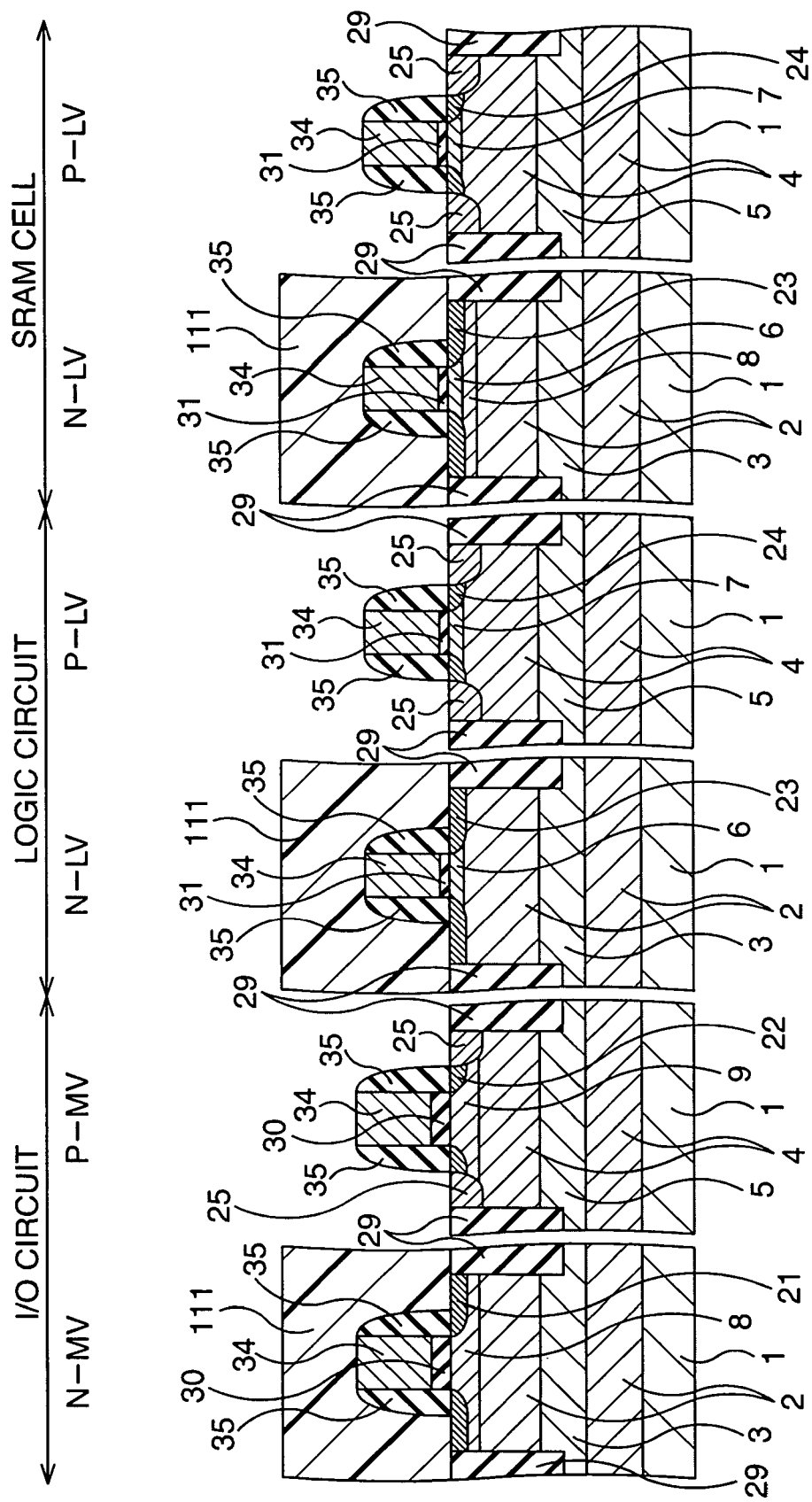

Thereafter, as shown in FIG. 11Q, the photoresist mask 110 is removed by, for example, ashing. Subsequently, after a silicon oxide film is deposited by, for example, a thermal CVD method, the silicon oxide film is etched back, and thereby side walls (side wall insulation films) 35 constituted of the silicon oxide film are formed on side wall portions of the gate electrodes 34. Next, a photoresist mask 111 exposing the P-MV region and the P-LV regions is formed by a photolithography technique. Next, by performing ion implantation with the photoresist mask 111 as a mask, source/drain diffusion layers (SD diffusion layer) 25 constituting the sources/drains of the pMOS transistors (transistors in the P-MV region and the P-LV regions) are formed. In formation of the SD diffusion layers 25, for example, boron ion is ion-implanted under the condition of the acceleration energy: 5 keV and the dose amount: $4 \times 10^{15}$ cm$^{-2}$. The conductivity type of the gate electrode 34 of the pMOS transistor becomes p-type by this ion implantation.

Figure 11R:
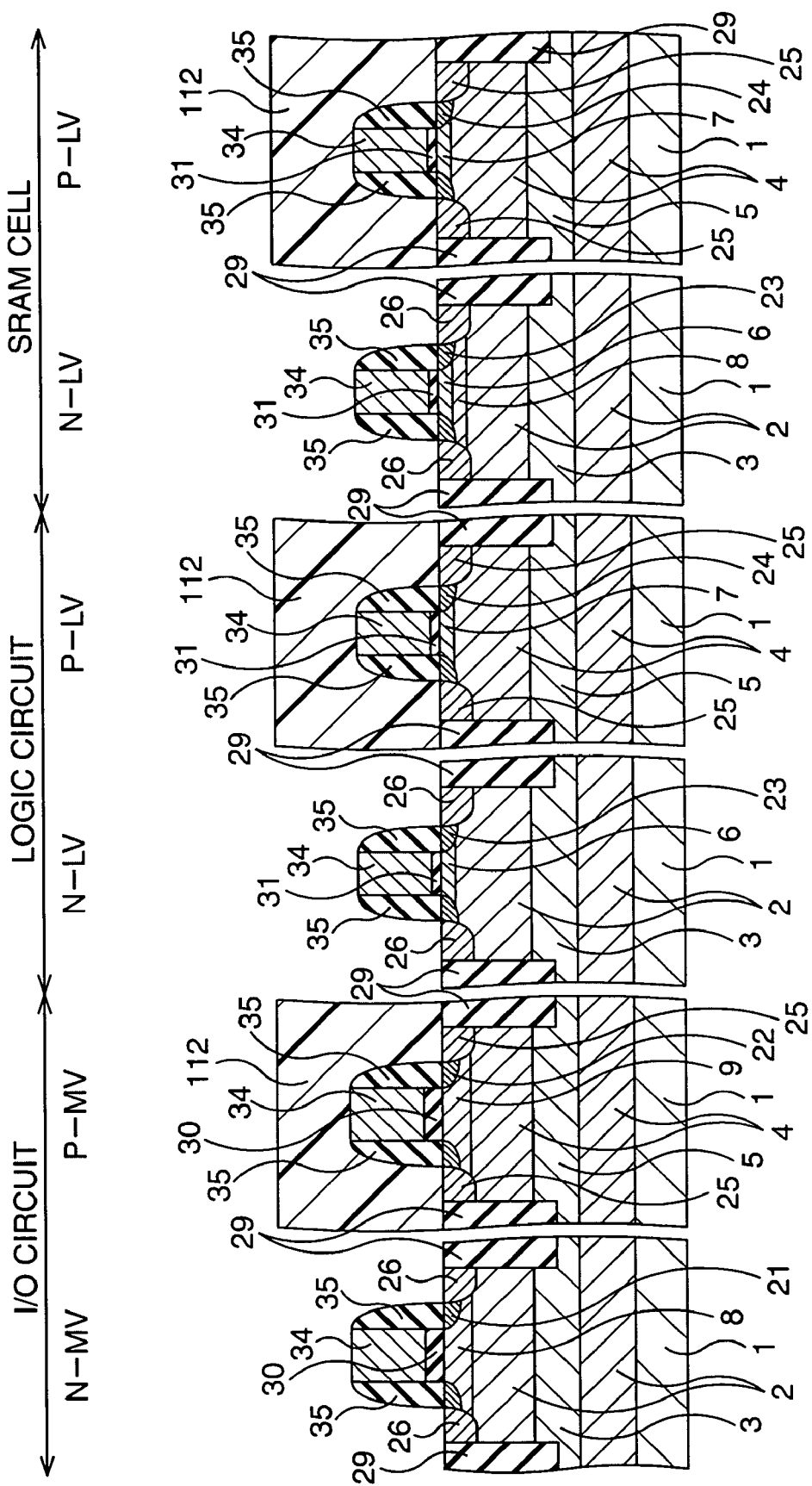
Figure 11S:
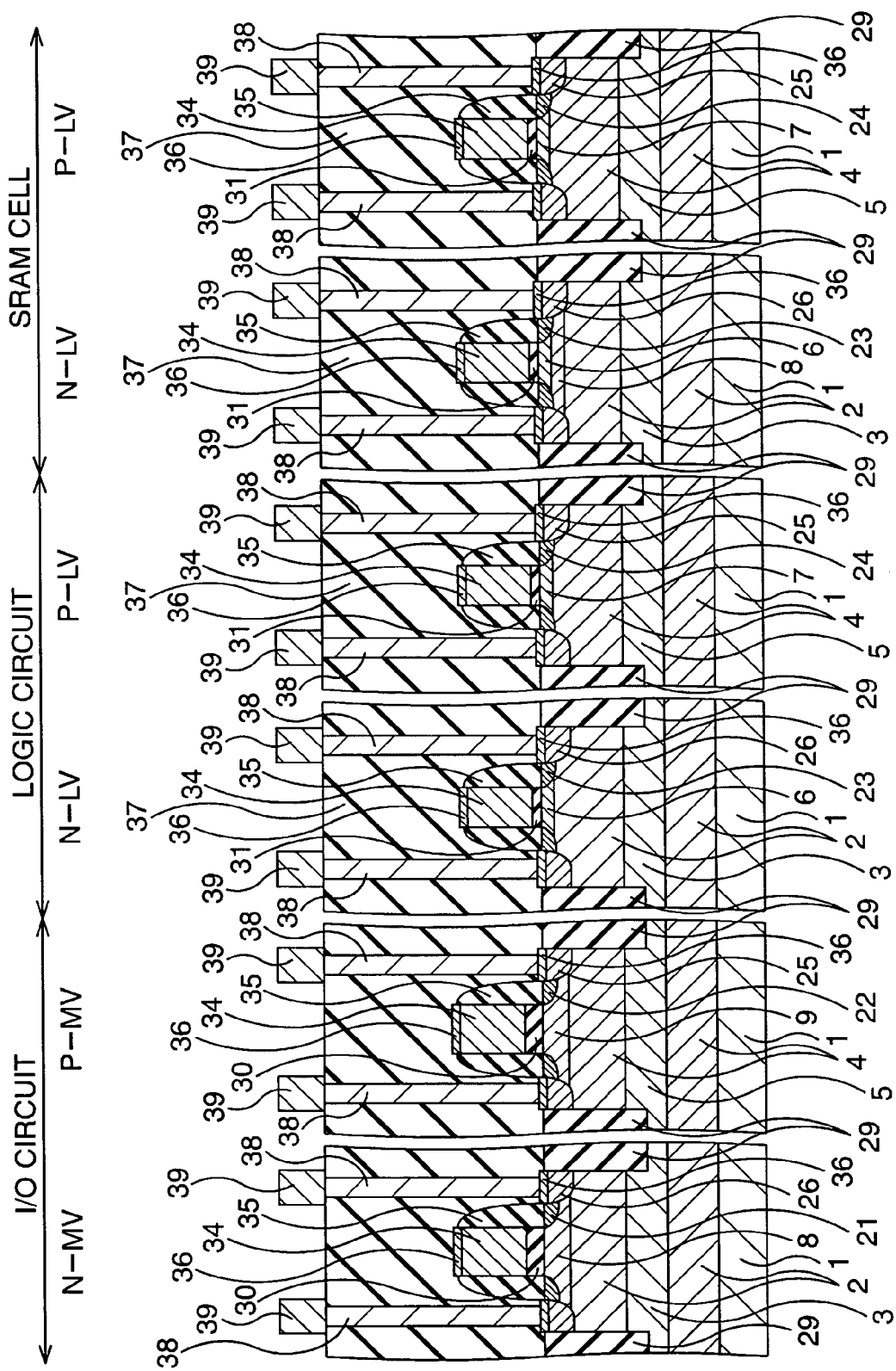

Thereafter, as shown in FIG. 11R, the photoresist mask 111 is removed by, for example, ashing. Next, a photoresist mask 112 exposing the N-MV region and the N-LV regions is formed by a photolithography technique. Next, by performing ion implantation with the photoresist mask 112 as a mask, SD diffusion layers 26 constituting the sources/drains of the nMOS transistors (transistors in the N-MV region and the N-LV regions) are formed. In formation of the SD diffusion layer 26, for example, phosphorus ion is ion-implanted under the condition of the acceleration energy: 10 keV and the dose amount: $6 \times 10^{15}$ cm$^{-2}$. The conductivity type of the gate electrode 34 of the nMOS transistor becomes n-type by this ion implantation.

Thereafter, as shown in FIG. 11S, the photoresist mask 112 is removed by, for example, ashing. Subsequently, silicide layers 36 are formed on the gate electrodes 34 and the SD diffusion layers 25 and 26 by a known salicide process. Subsequently, an interlayer insulation film 37 is formed on the entire surface, and thereafter contact holes are formed. After contact plugs 38 are formed in the contact holes, wirings 39 are formed on the interlayer insulation film 37. In this manner, the steps up to the first metal wiring layer are completed. As the interlayer insulation film 37, an Si oxide film of the thickness of about 600 nm is formed by, for example, an HDP method.

Thereafter, a further upper wiring layer and interlayer insulation films and the like are formed, and the logic circuit element (semiconductor device) loaded with the SRAM is completed.

In the semiconductor device manufactured according to the above method, the impurity profile of the channel in the N-LV region in the SRAM cell region is the total of the impurity profile of the channel in the N-LV region of the logic circuit region and the impurity profile of the channel in the N-MV region of the I/O circuit region. Therefore, the threshold voltage becomes higher, and the wide operation margin can be obtained. In manufacturing, introduction of the impurity into only the channel of the N-LV region of the SRAM cell region is not required, and therefore it is possible to avoid an increase in the number of process steps and a rise in the cost following this.

Second Embodiment

Figure 12A:
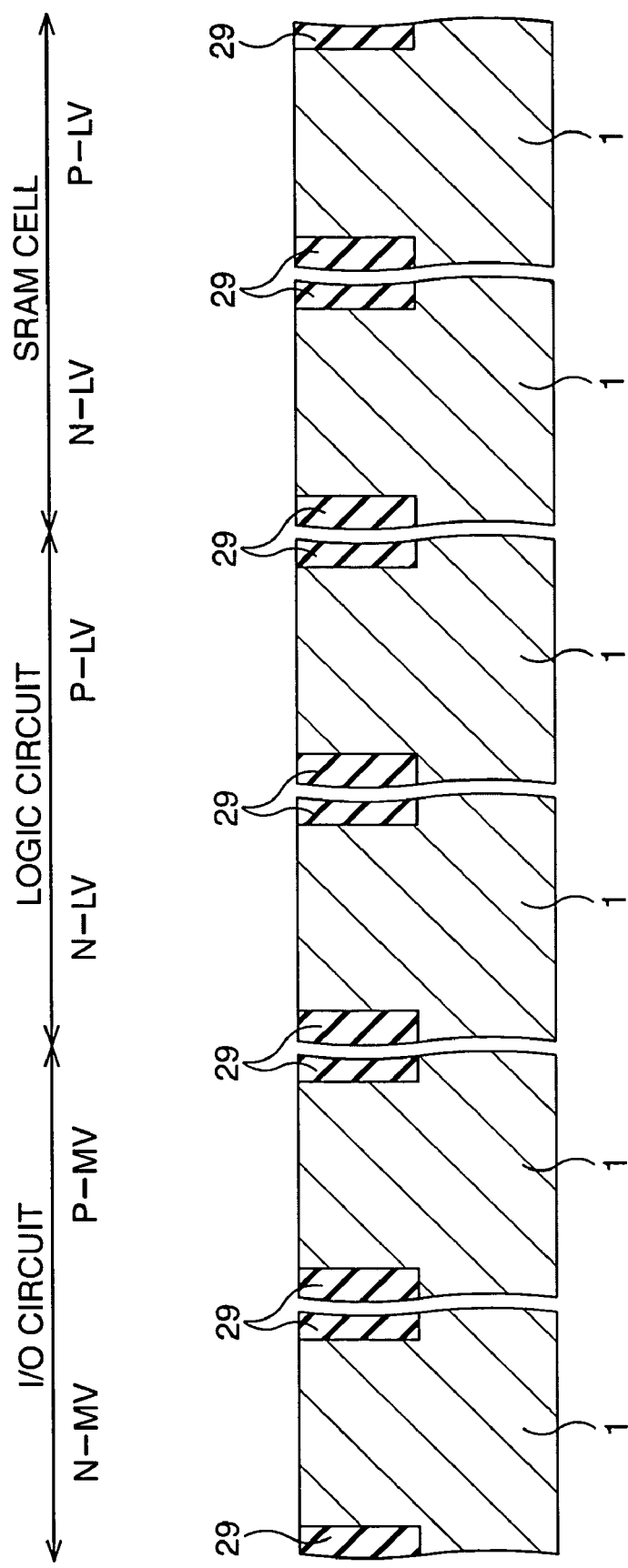
FIG. 12A to FIG. 12T are sectional views showing a manufacturing method of a semiconductor device according to a second embodiment of the present invention in the sequence of the process steps.

Next, a second embodiment of the present invention will be explained. FIGS. 12A to 12T are sectional views showing a manufacturing method of a semiconductor device according to a second embodiment of the present invention. In this embodiment, the I/O circuit, the logic circuit and the SRAM cell including nMOS transistors and pMOS transistors respectively are also formed in one chip, as in the first embodiment.

In the second embodiment, element isolation insulating films 29 are formed on surfaces of an Si substrate 1 by the STI first as shown in FIG. 12A. Next, by thermally oxidizing (sacrificial oxidation) the surface of the Si substrate 1, an Si oxide film (not shown) of the thickness of about 10 nm is formed.

Figure 12B:
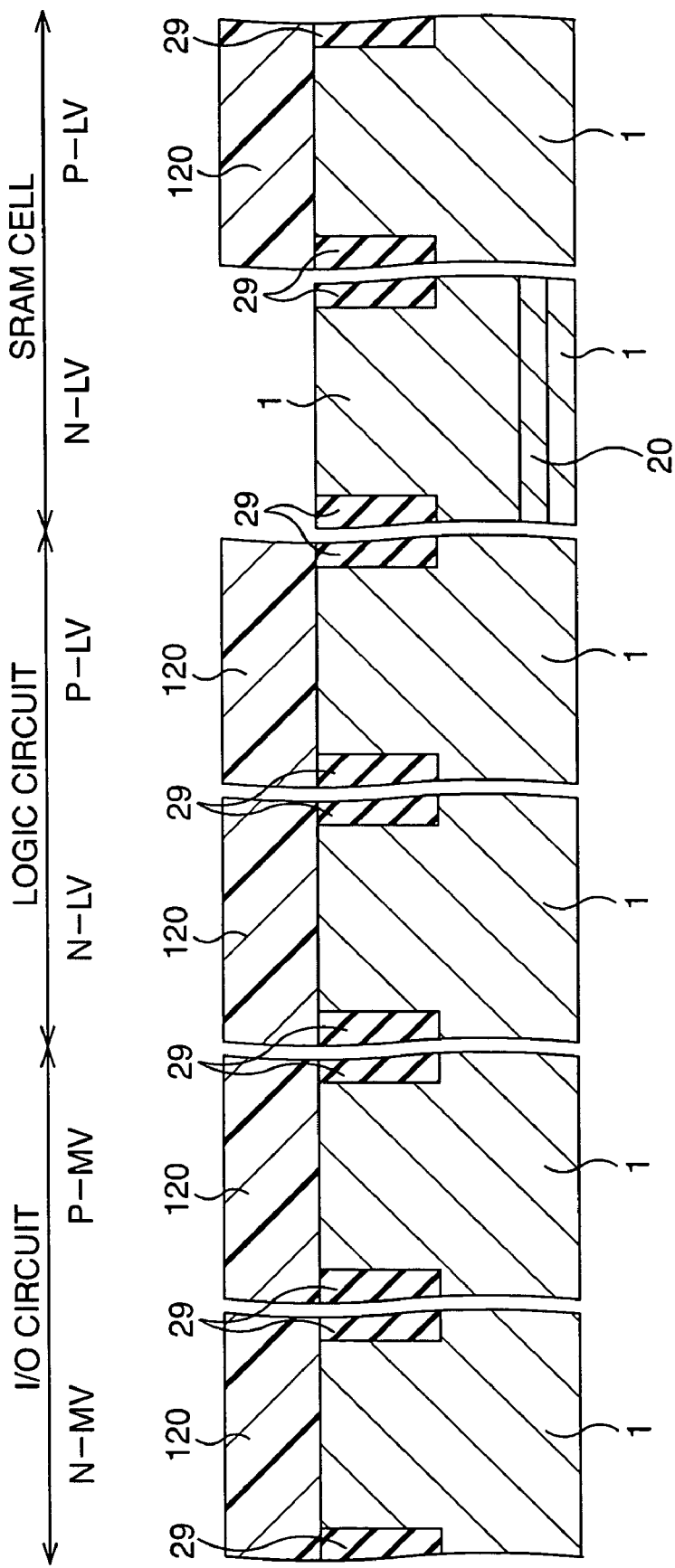

Next, as shown in FIG. 12B, a photoresist mask 120 exposing the N-LV region of the SRAM cell region is formed by a photolithography technique. Thereafter, by performing ion implantation with the photoresist mask 120 as a mask, an n-type embedded layer 20 is formed. In formation of the n-type embedded layer 20, for example, phosphorus ion is ion-implanted under the condition of the acceleration energy: 2 MeV and the dose amount: $2\times10^{13}$ cm$^{-2}$, The depth of the embedded layer 20 from the substrate surface is about 2 μm, for example.

Figure 12C:
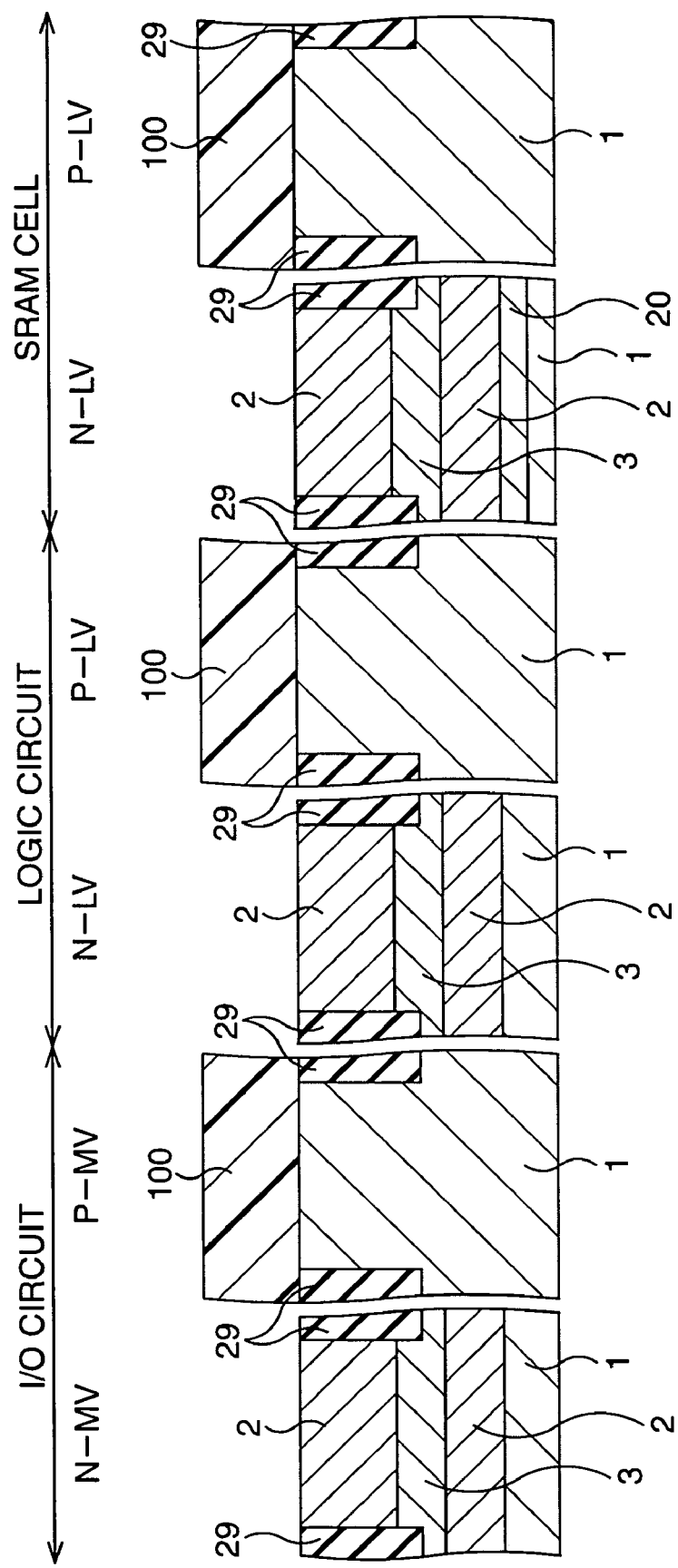

Subsequently, as shown in FIG. 12C, the photoresist mask 120 is removed by, for example, ashing. Next, a photoresist mask 100 exposing the N-MV region and the N-LV regions is formed by a photolithography technique. Thereafter, with the photoresist mask 100 as a mask, ion implantation is performed, and thereby, p-wells 2 and 3 are formed. In formation of the p-wells 2, for example, boron ion is ion-implanted under the condition of the acceleration energy: 400 keV and the dose amount: $1.5\times10^{13}$ cm$^{-2}$. In formation of the p-wells 3, for example, boron ion is ion-implanted under the condition of the acceleration energy: 100 keV and the dose amount: $2\times10^{12}$ cm$^{-2}$. As a result, the p-well 3 of higher impurity concentration is formed in each of the p-wells 2.

Figure 12D:
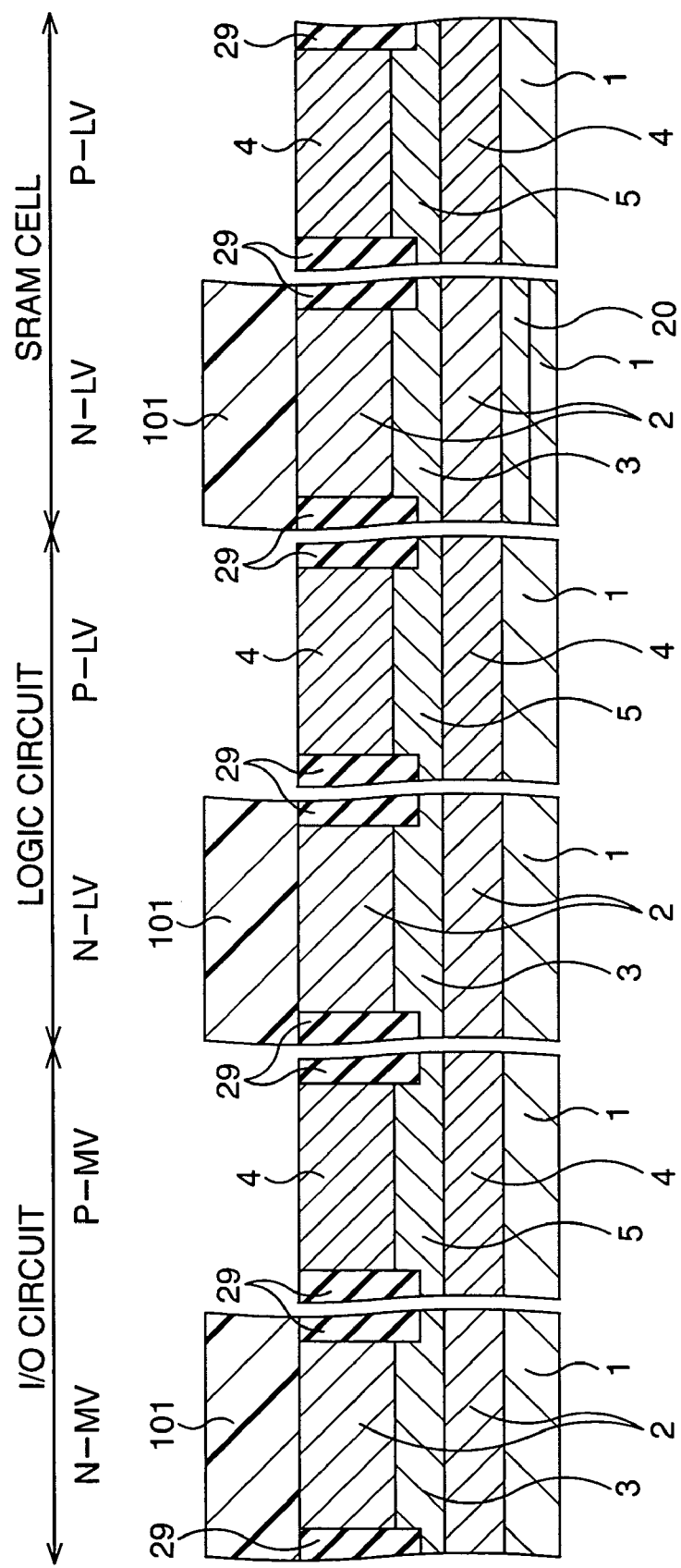

Subsequently, as shown in FIG. 12D, the photoresist mask 100 is removed by, for example, ashing. Next, a photoresist mask 101 exposing the P-MV region and the P-LV regions is formed by a photolithography technique. Next, with the photoresist mask 101 as a mask, ion implantation is performed, and thereby, n-wells 4 and 5 are formed. In formation of the n-wells 4, for example, phosphorus ion is ion-implanted under the condition of the acceleration energy: 600 keV and the dose amount: $1.5\times10^{13}$ cm$^{-2}$. In formation of the n-wells 5, for example, phosphorus ion is ion-implanted under the condition of the acceleration energy: 240 keV and the dose amount: $5\times10^{12}$ cm$^{-2}$. As a result, the n-well 5 of higher impurity concentration is formed in each of the n-wells 4.

Figure 12E:
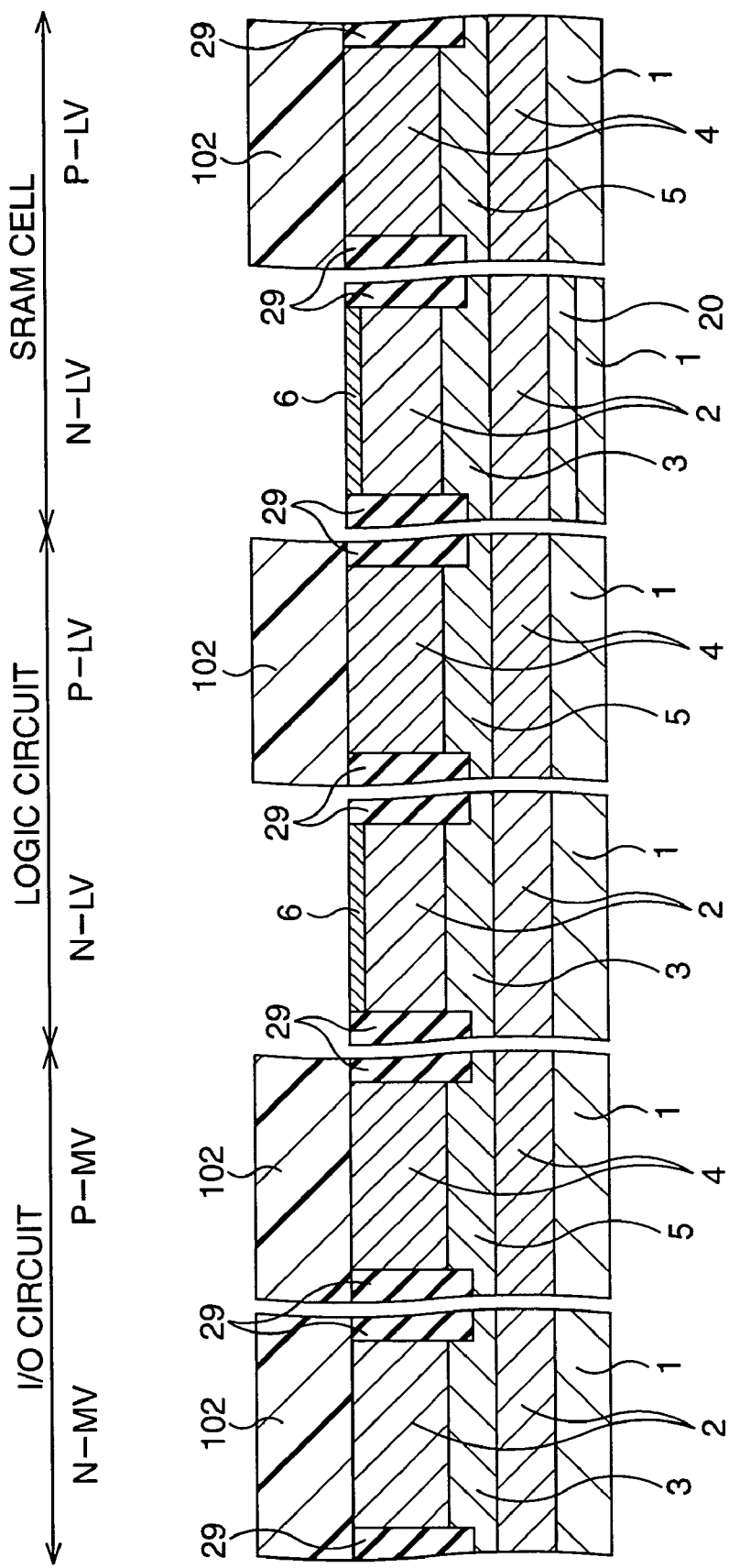

Next, as shown in FIG. 12E, the photoresist mask 101 is removed by, for example, ashing. Thereafter, a photoresist mask 102 exposing the N-LV regions is formed by a photolithography technique. Thereafter, with the photoresist mask 102 as a mask, ion implantation is performed, and thereby, channel doped layers 6 are formed as a p-type threshold voltage control impurity layer. In formation of the channel-doped layers 6, for example, boron ion is ion-implanted under the condition of the acceleration energy: 15 keV and the dose amount: $8\times10^{12}$ cm$^{-2}$.

Figure 12F:
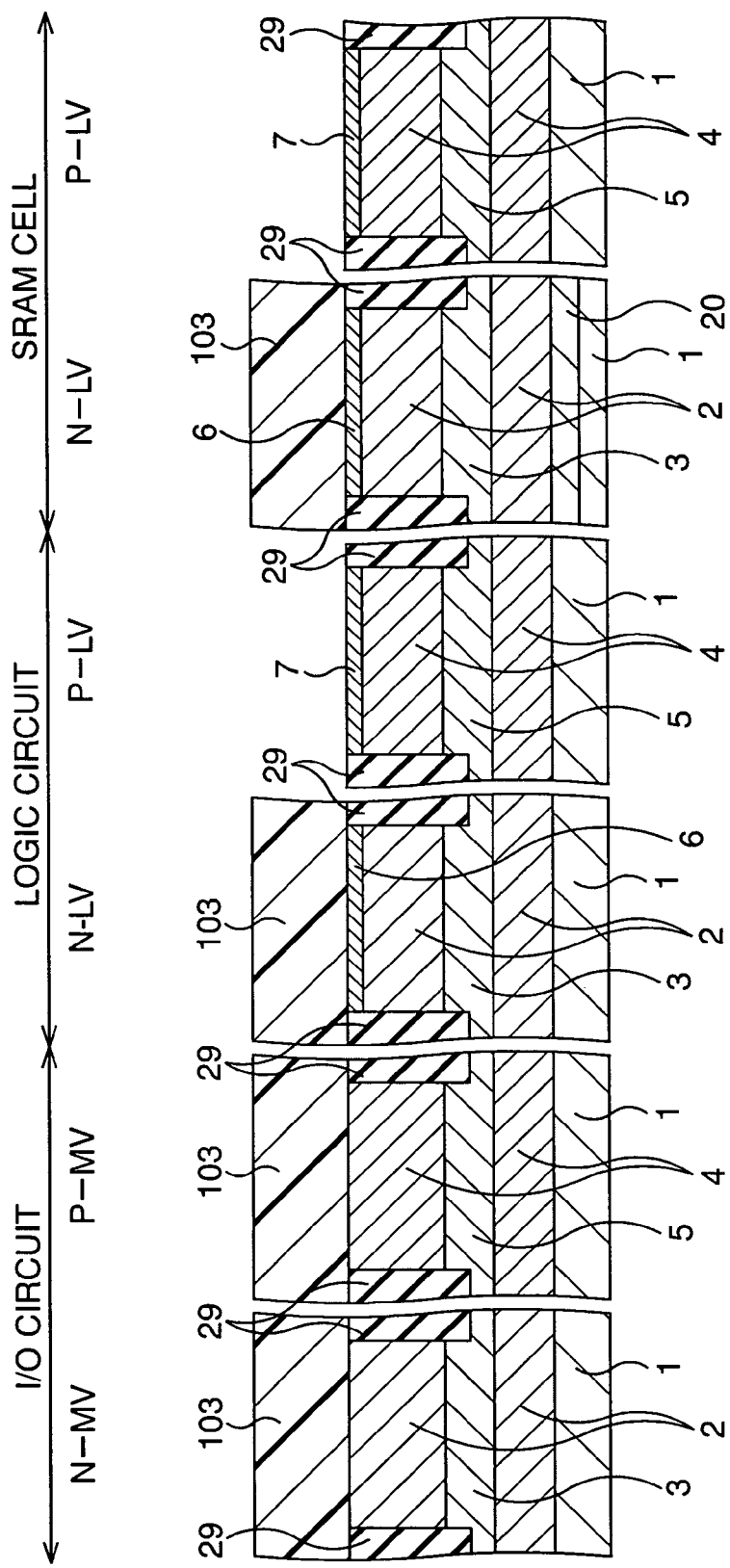

Subsequently, as shown in FIG. 12F, the photoresist mask 102 is removed by, for example, ashing. Next, a photoresist mask 103 exposing the P-LV regions is formed by a photolithography technique. Next, with the photoresist mask 103 as a mask, ion implantation is performed, and thereby, channel doped layers 7 are formed as an n-type threshold voltage control impurity layer. In formation of the channel-doped layers 7, for example, arsenic ion is ion-implanted under the condition of the acceleration energy: 150 keV and the dose amount: $3\times10^{12}$ cm$^{-2}$.

Figure 12G:
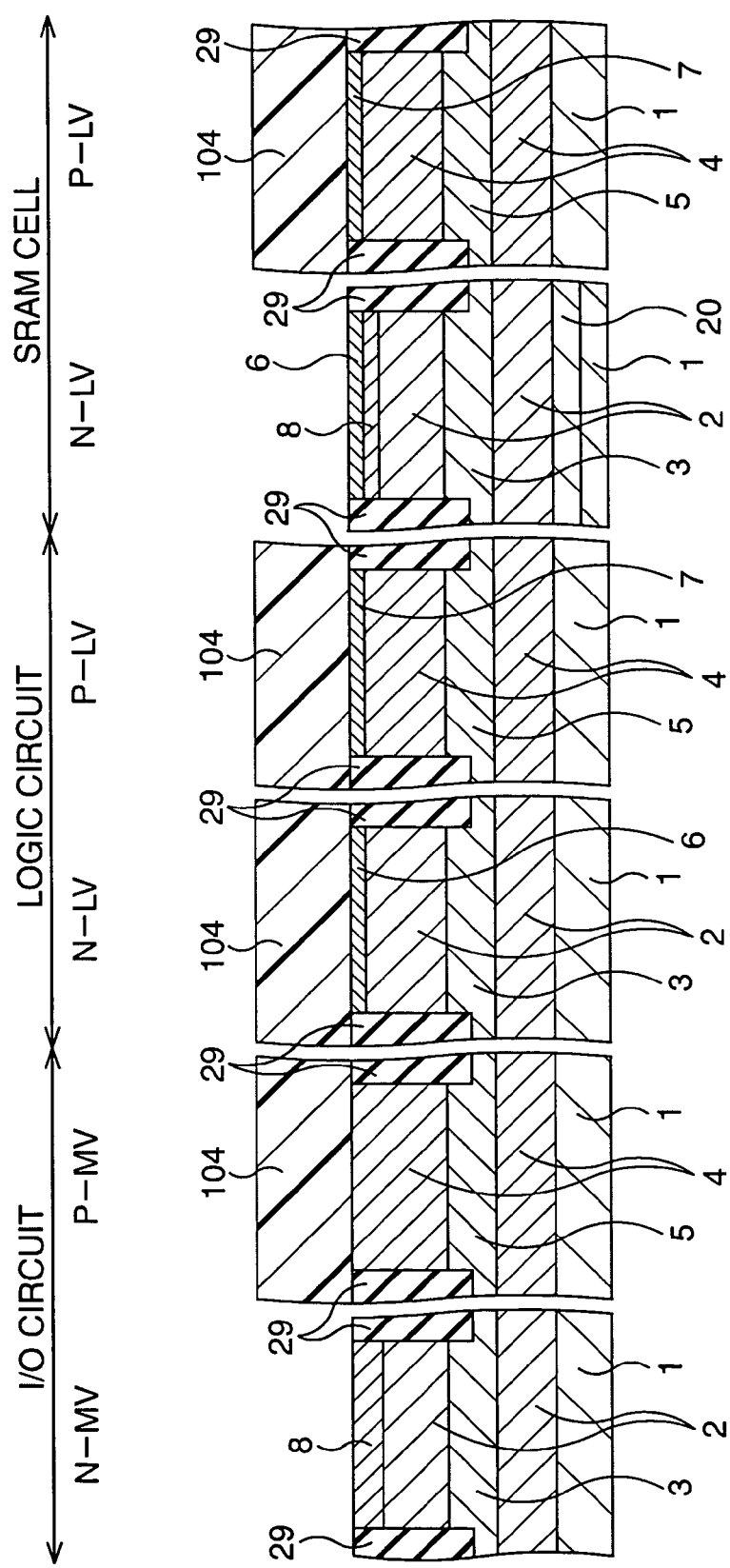

Thereafter, as shown in FIG. 12G, the photoresist mask 103 is removed by, for example, ashing. Subsequently, a photoresist mask 104 exposing the N-MV region and the N-LV region of the SRAM cell region is formed by a photolithography technique. Next, with the photoresist mask 104 as a mask, ion implantation is performed, and thereby, channel doped layers 8 are formed as the p-type threshold voltage control impurity layer. Accordingly, in the N-LV region of the SRAM cell region, the channel doped layers 6 and 8 are formed. Namely, the N-LV region of the SRAM cell region is in the same state as the state shown in FIG. 5B. In formation of the channel-doped layers 8, for example, boron ion is ion-implanted under the condition of the acceleration energy: 35 keV and the dose amount: $4.5\times10^{12}$ cm$^{-2}$.

Figure 12H:
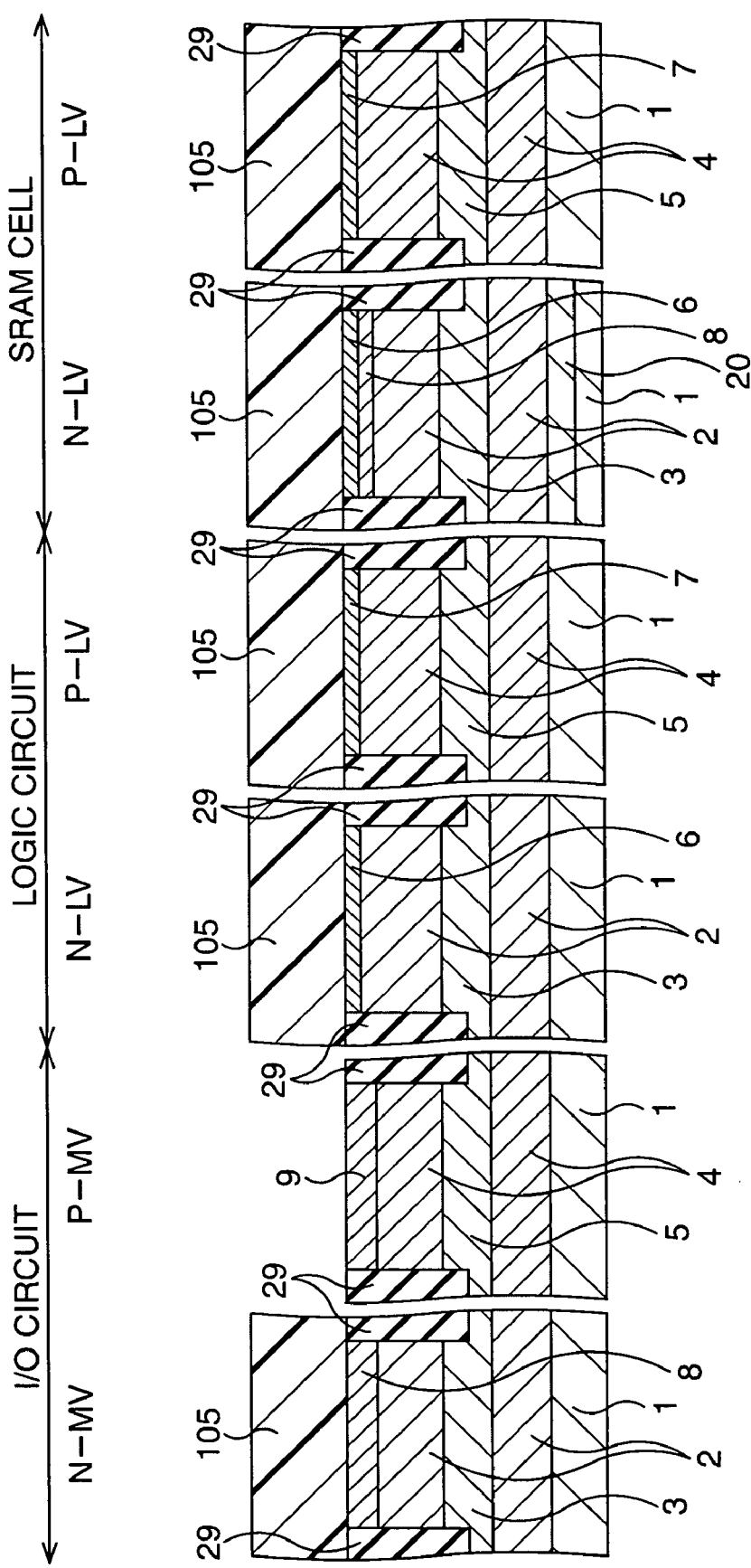

Next, as shown in FIG. 12H, the photoresist mask 104 is removed by, for example, ashing. Thereafter, a photoresist mask 105 exposing the P-MV region is formed by a photolithography technique. Subsequently, with the photoresist mask 105 as a mask, ion implantation is performed, and thereby, a channel doped layer 9 is formed as the n-type threshold voltage control impurity layer. In formation of the channel-doped layer 9, for example, arsenic ion is ion-implanted under the condition of the acceleration energy: 150 keV and the dose amount: $2\times10^{12}$ cm$^{-2}$.

Figure 12I:
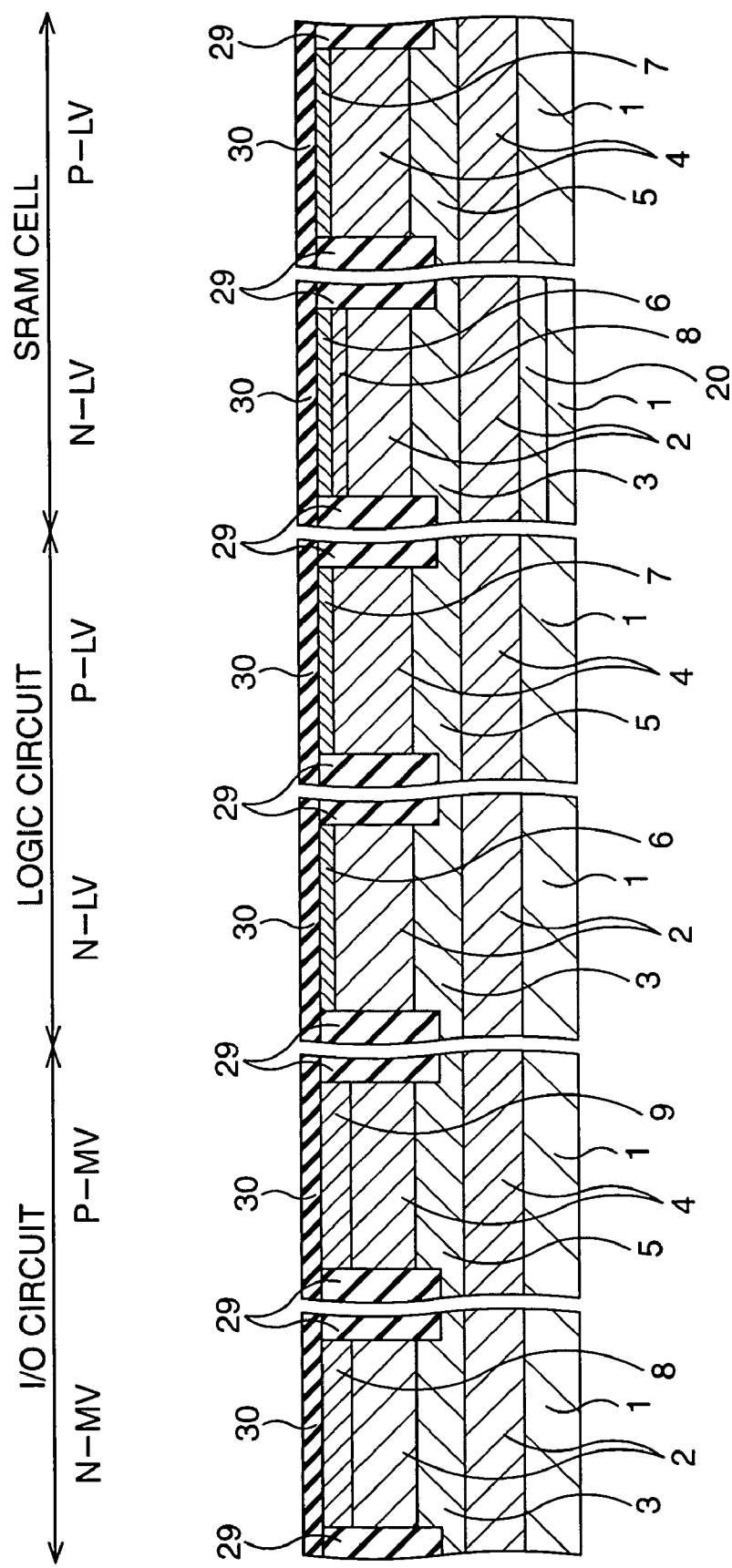

Next, as shown in FIG. 12I, the photoresist mask 105 is removed by, for example, ashing. Next, silicone oxide films each of the film thickness of about 7 nm are formed on the active regions of the N-MV region, the p-MV region, the N-LV regions and the P-LV regions as gate insulation films 30 by performing thermal oxidation at, for example, the temperature of 850° C.

Figure 12J:
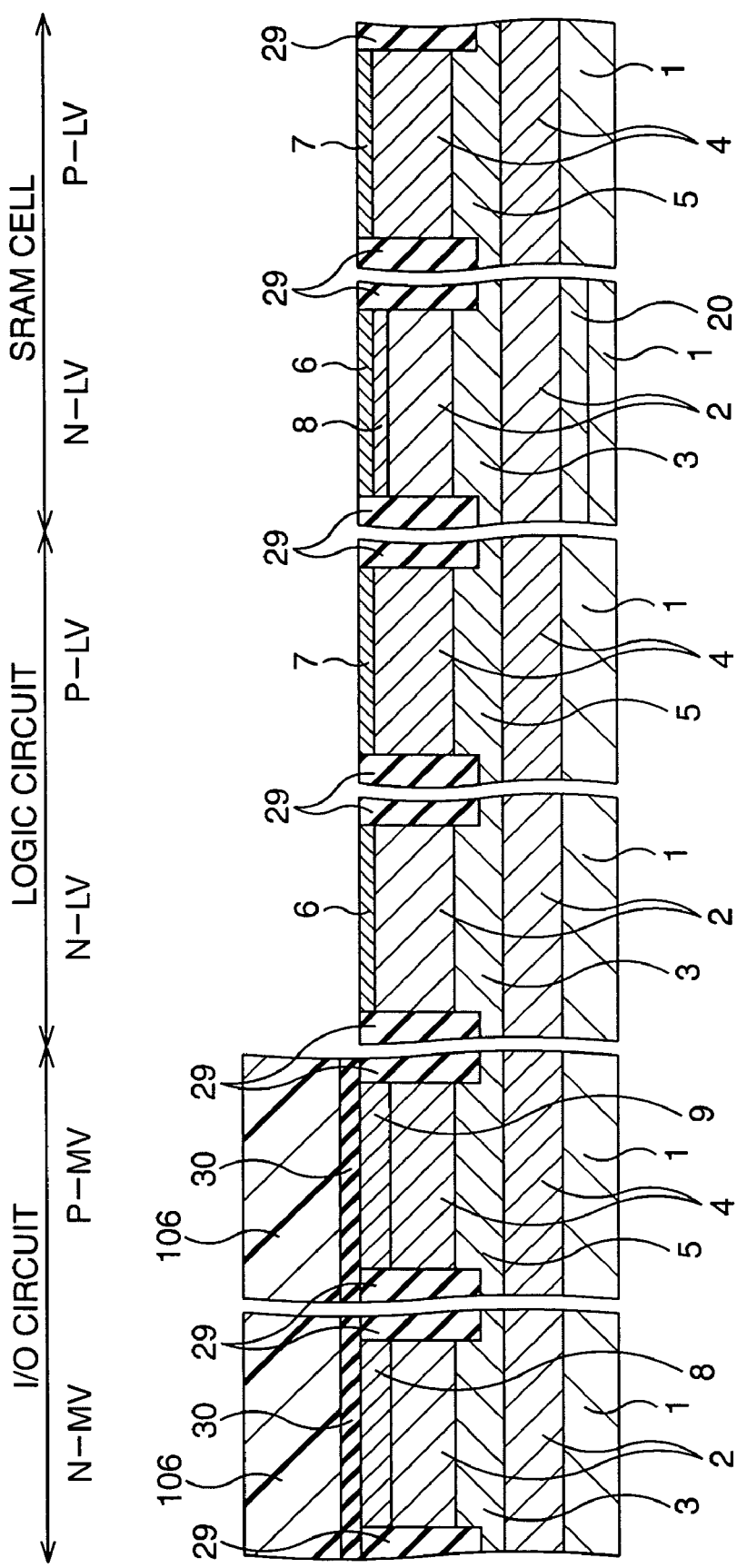

Next, as shown in FIG. 12J, a photoresist mask 106 covering the N-MV region and the P-MV region and exposing the regions in which the low-voltage transistors are formed (the N-LV regions and the P-LV regions) is formed by a photolithography technique. Thereafter, by wet etching using, for example, a hydrofluoric acid aqueous solution, the gate insulation films 30 are etched with the photoresist mask 106 as a mask. As a result, the gate insulation films 30 in the N-LV regions and the P-LV regions are removed.

Figure 12K:
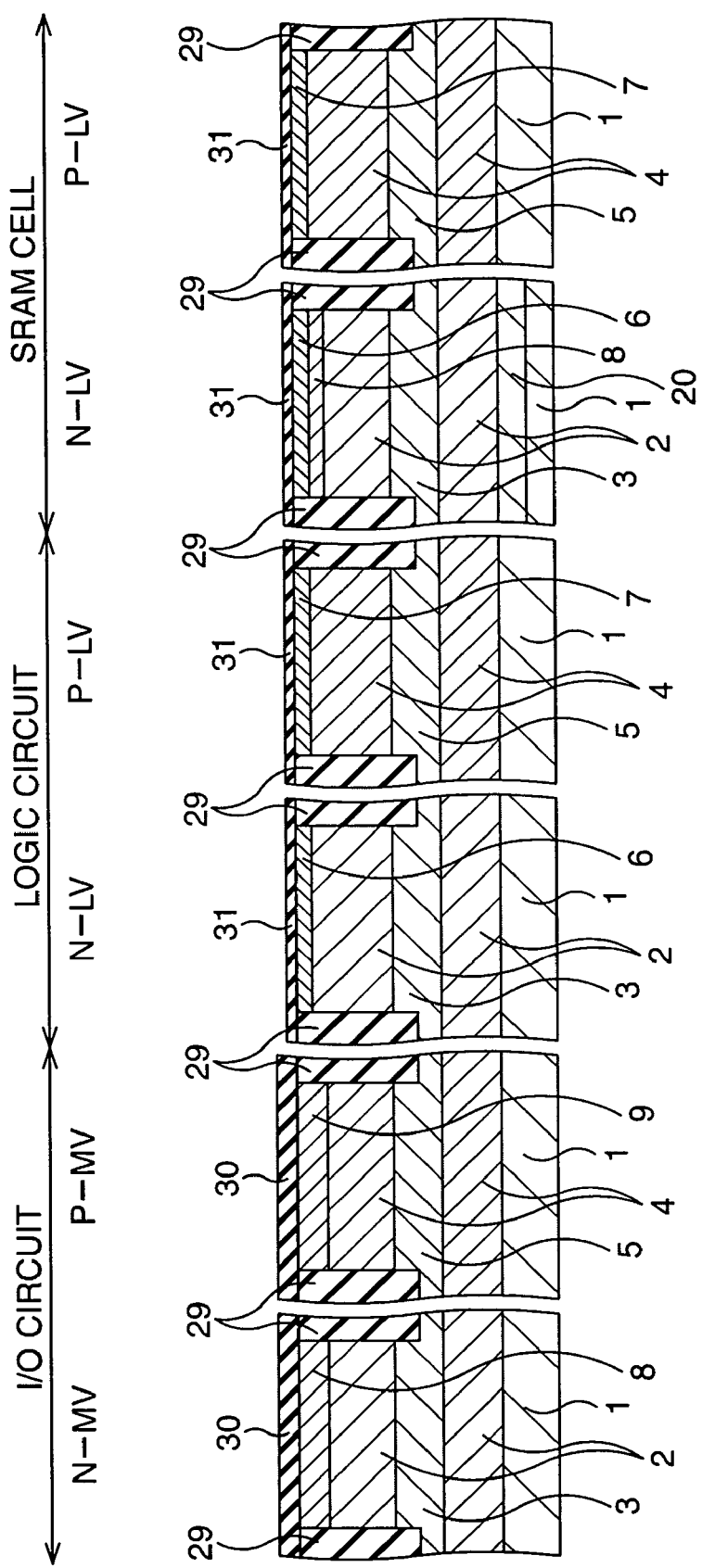

Subsequently, as shown in FIG. 12K, the photoresist mask 106 is removed by, for example, ashing. Next, silicone oxide films each of the film thickness of about 1.8 nm are formed on the active regions of the N-LV regions and the P-LV formation regions as gate insulation films 31 by performing thermal oxidation at, for example, the temperature of 850° C. The film thickness of the gate insulation film 30 increases up to about 8.8 nm by this thermal oxidation.

Figure 12L:
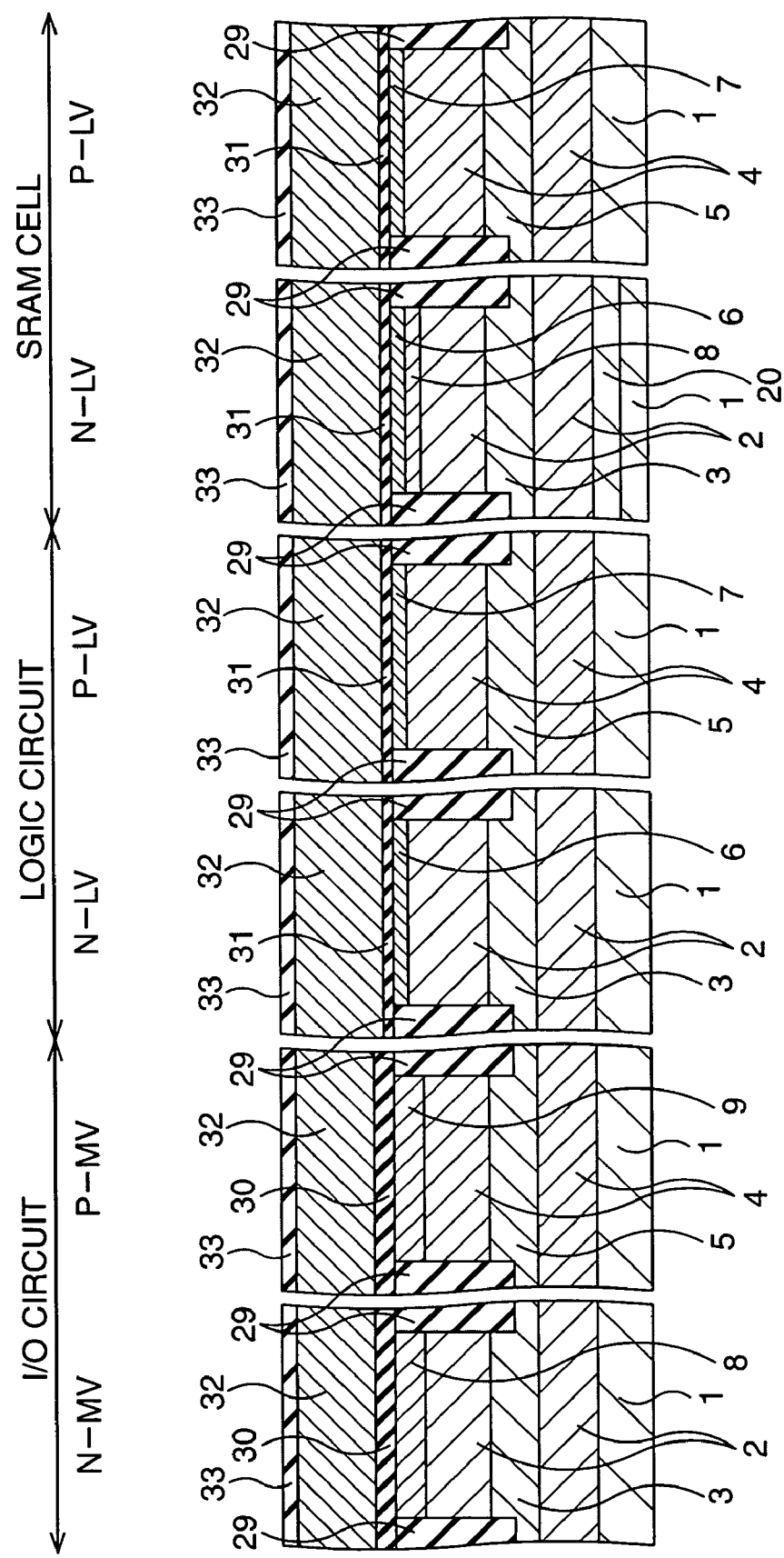

Next, as shown in FIG. 12L, a polysilicon film 32 of the film thickness of about 180 nm, for example, are formed by a CVD method, and a silicon nitride film 33 of the film thickness of about 30 nm, for example, is formed on the polysilicon film 32 as a etching mask also serving as an antireflection film.

Figure 12M:
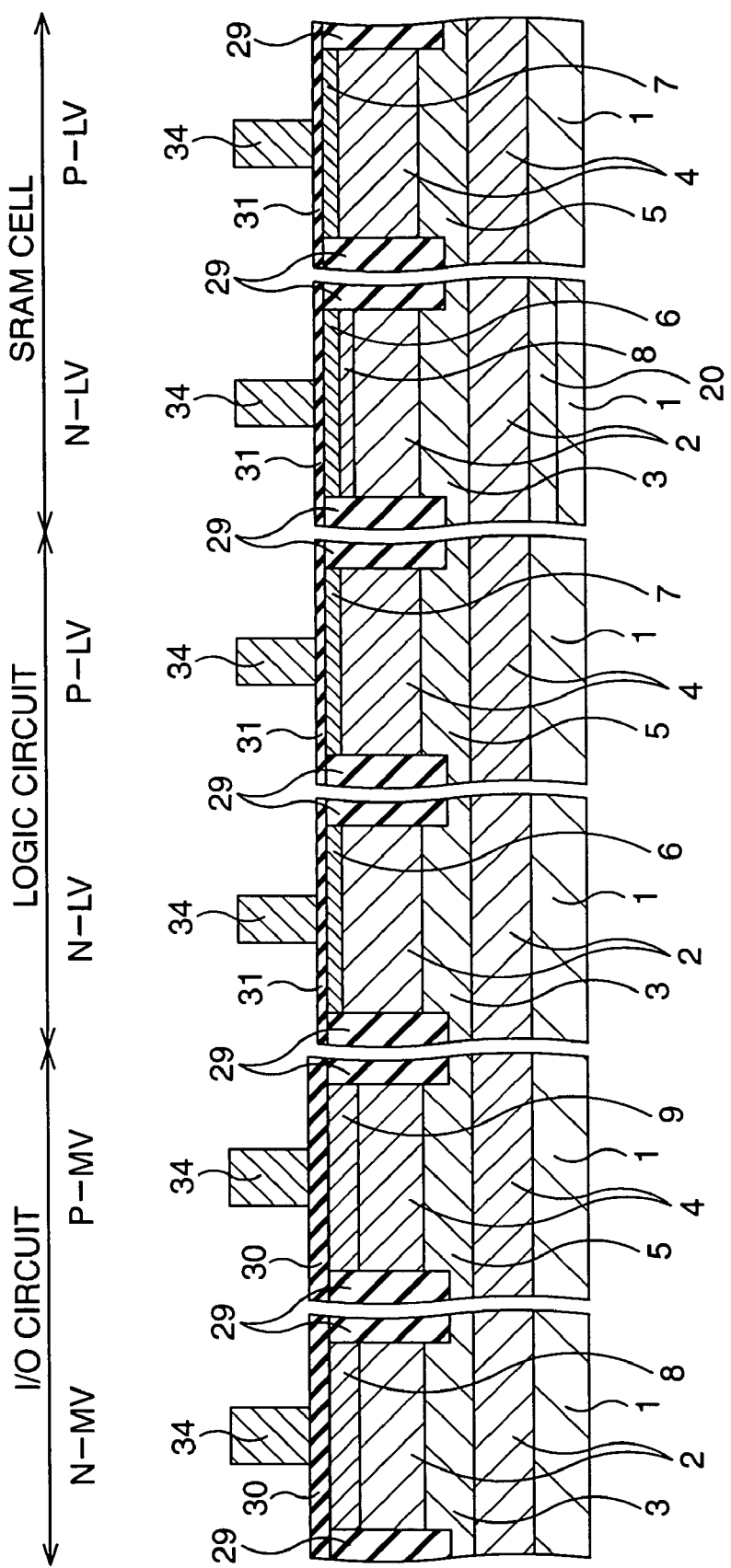

Thereafter, as shown in FIG. 12M, the polysilicon film 32 is patterned by a photolithography technique and a dry etching technique, and thereby gate electrodes 34 are formed in the N-MV region, the P-MV region, the N-LV regions and the P-LV regions. At this time, the width of each of the gate electrodes 34 in the N-MV region and the P-MV region is made larger than the width of each of the gate electrodes 34 in the N-LV regions and the P-LV regions.

Figure 12N:
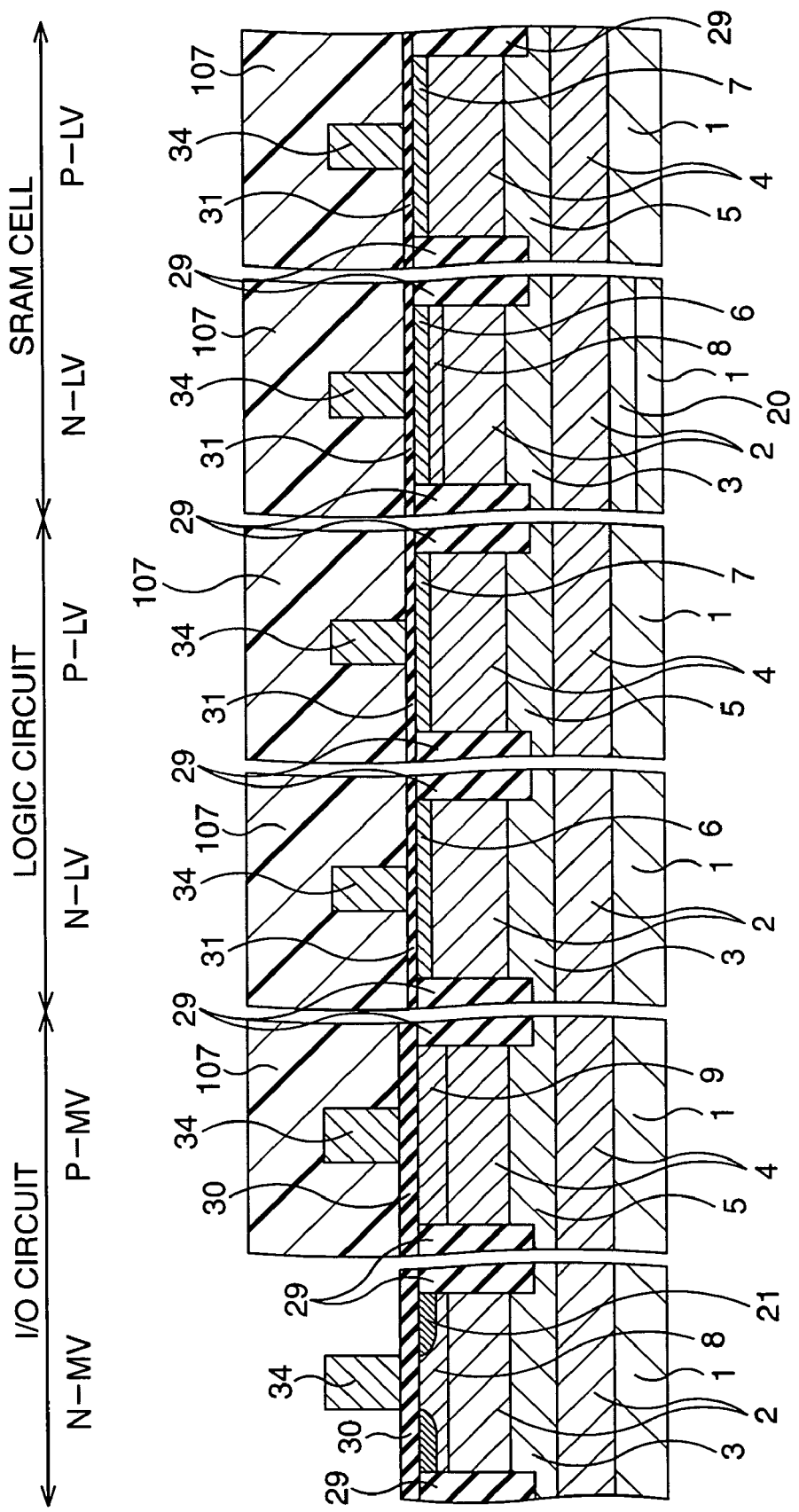

Subsequently, as shown in FIG. 12N, a photoresist mask 107 exposing the N-MV region and covering the other regions is formed by a photolithography technique. Next, an extension layer 21 for forming a source/drain of the N-MV region is formed by performing ion implantation with the photoresist mask 107 as a mask. In formation of the extension layer 21, for example, phosphorus ion is ion-implanted under the condition of the acceleration energy: 35 keV and the dose amount: $4 \times 10^{13}$ cm$^{-2}$.

Figure 12O:
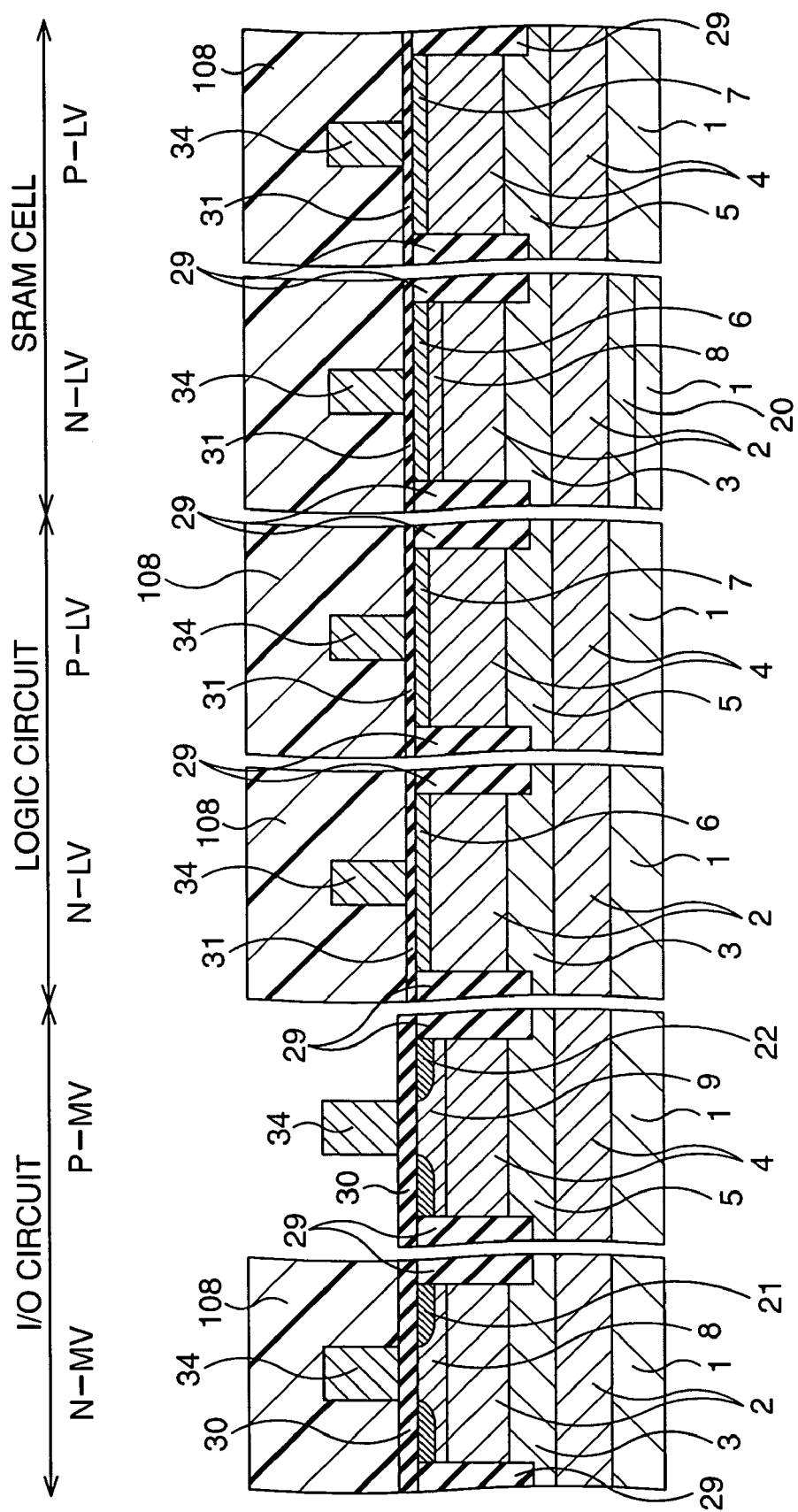

Next, as shown in FIG. 12O, the photoresist mask 107 is removed by, for example, ashing. Thereafter, a photoresist mask 108 exposing the P-MV region and covering the other regions is formed by a photolithography technique. Subsequently, an extension layer 22 for forming a source/drain of the P-MV region is formed by performing ion implantation with the photoresist mask 108 as a mask. In formation of the extension layer 22, for example, boron fluoride ion is ion-implanted under the condition of the acceleration energy: 10 keV and the dose amount: $4 \times 10^{13}$ cm$^{-2}$.

Figure 12P:
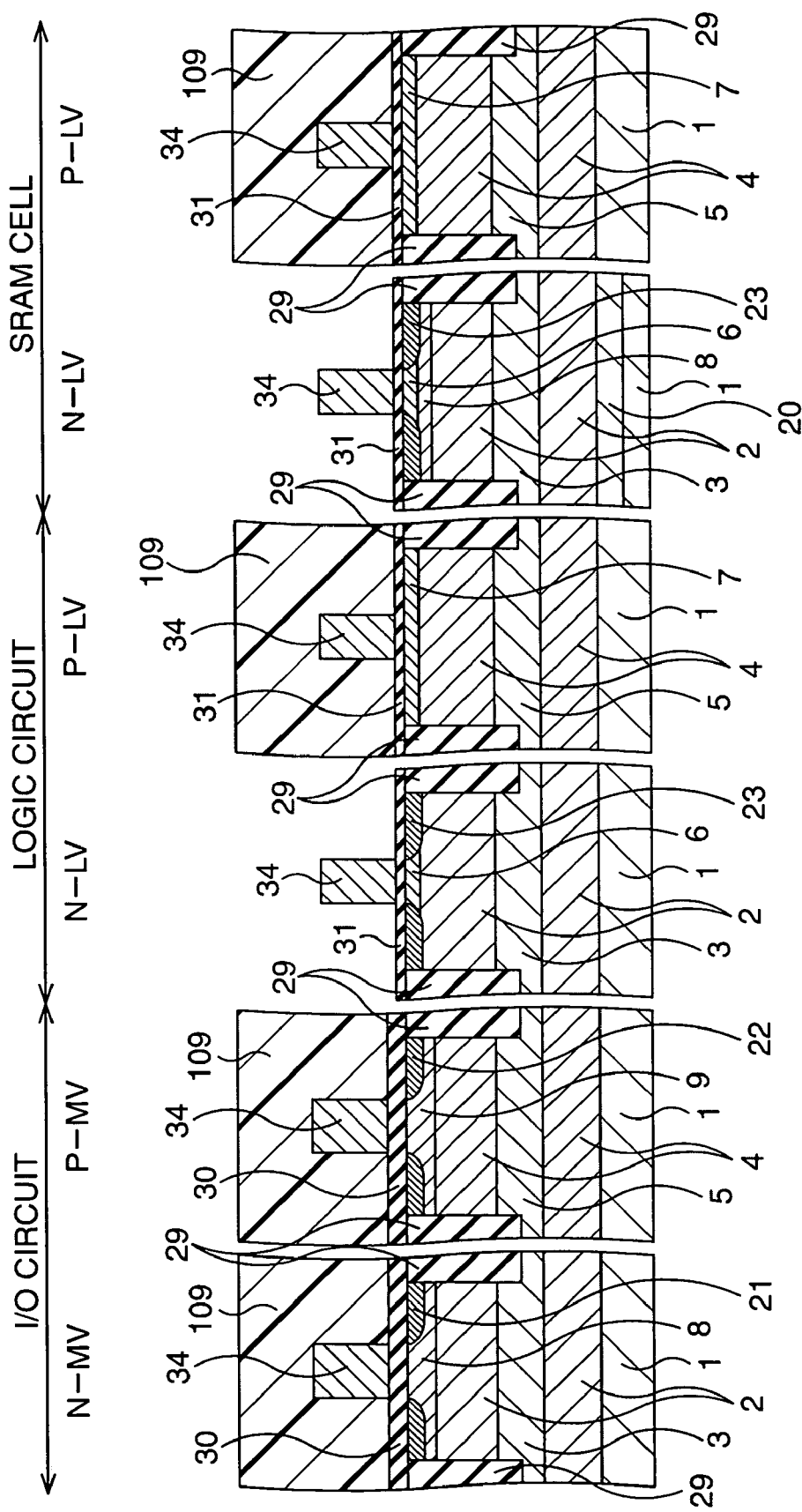

Next, as shown in FIG. 12P, the photoresist mask 108 is removed by, for example, ashing. Next, a photoresist mask 109 exposing the N-LV regions and covering the other regions is formed by a photolithography technique. Thereafter, ion-implantation is performed with the photoresist mask 109 as a mask, and thereby, extension layers 23 to constitute sources/drains of the N-LV regions are formed. In formation of the extension layers 23, for example, arsenic ion is ion-implanted under the condition of the acceleration energy: 3 keV and the dose amount: $1 \times 10^{15}$ cm$^{-2}$, and thereafter, boron fluoride ion is ion-implanted from the four directions inclined 28 degrees from the normal line of the Si substrate 1 under the condition of the acceleration energy: 80 keV and the dose amount: $4 \times 10^{12}$ cm$^{-2}$ for each. As a result, the extension layers 23 become the extension layers including pocket layers (not shown).

Figure 12Q:
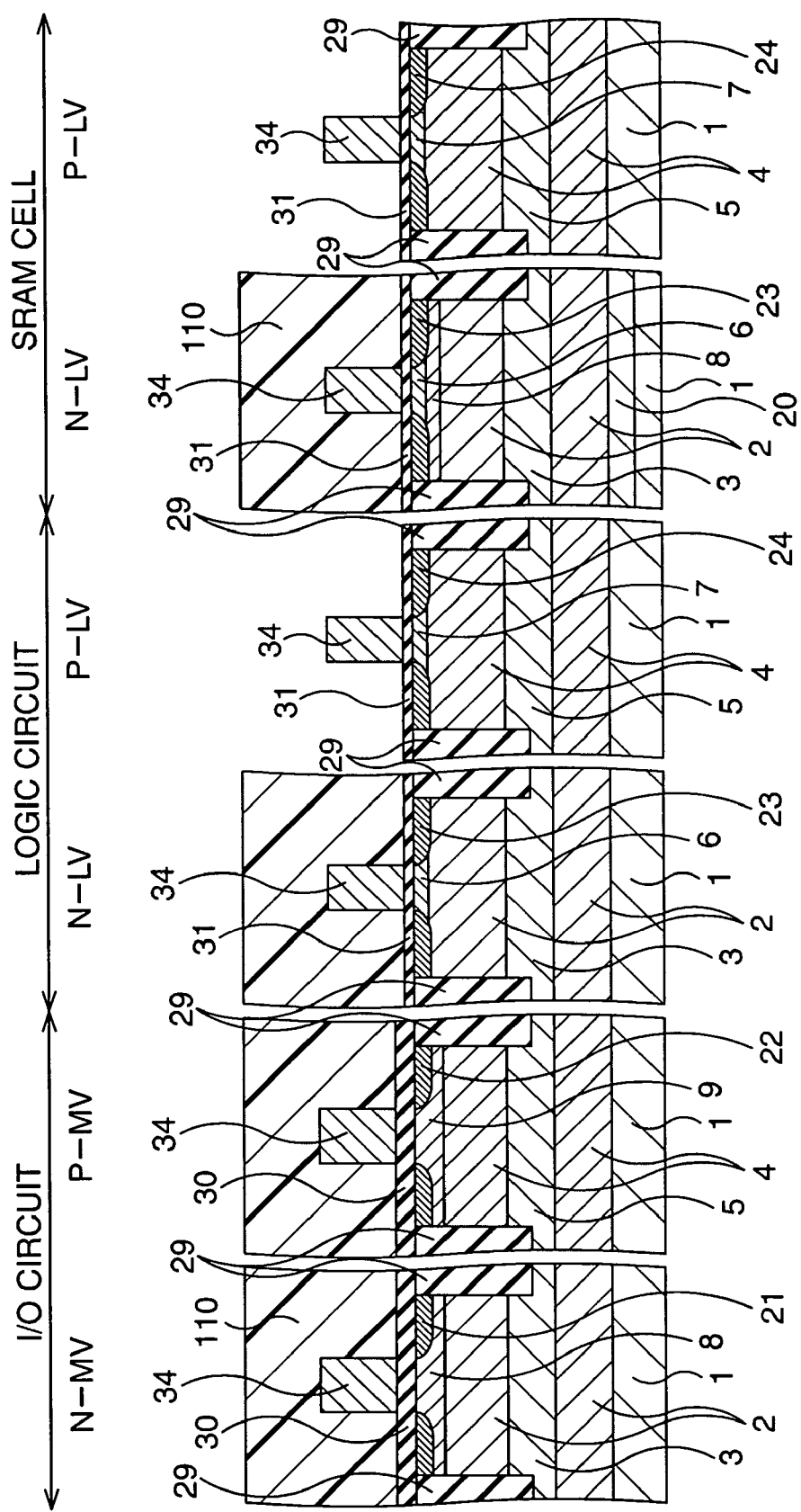

Subsequently, as shown in FIG. 12Q, the photoresist mask 109 is removed by, for example, ashing. Next, a photoresist mask 110 exposing the P-LV regions and covering the other regions is formed by a photolithography technique. Next, ion-implantation is performed with the photoresist mask 110 as a mask, and thereby, extension layers 24 to constitute sources/drains of the P-LV regions are formed. In formation of the extension layers 24, for example, boron ion is ion-implanted under the condition of the acceleration energy: 0.5 keV and the dose amount: $6 \times 10^{14}$ cm$^{-2}$, and thereafter, arsenic ion is ion-implanted from the four directions inclined 28 degrees from the normal line of the Si substrate 1 under the condition of the acceleration energy: 120 keV and the dose amount: $5 \times 10^{12}$ cm$^{-2}$ for each. As a result, the extension layers 24 also become the extension layers including pocket layers (not shown).

Figure 12R:
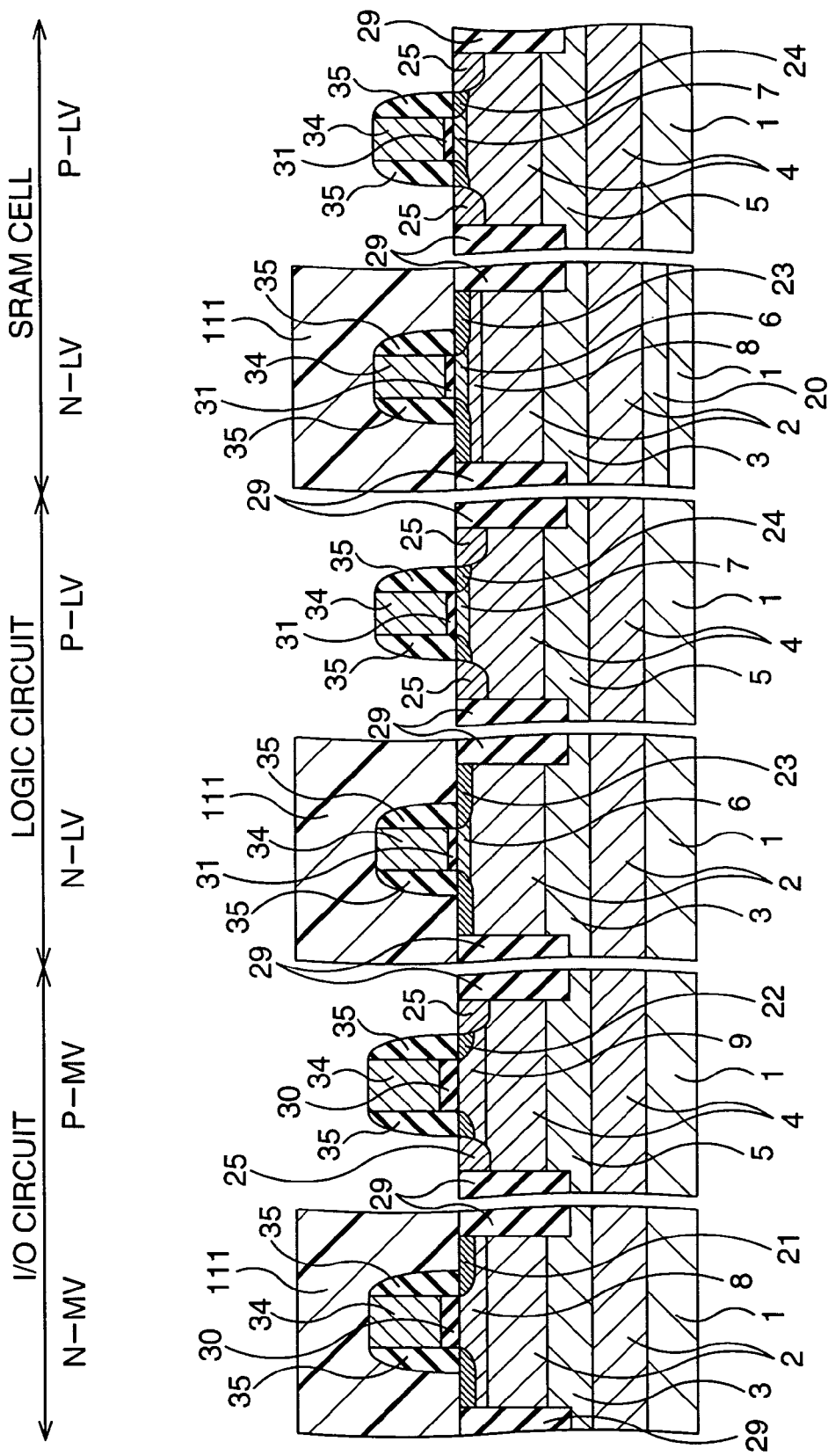

Thereafter, as shown in FIG. 12R, the photoresist mask 110 is removed by, for example, ashing. Subsequently, after a silicon oxide film is deposited by, for example, a thermal CVD method, the silicon oxide film is etched back, and thereby side walls (side wall insulation films) 35 constituted of the silicon oxide film are formed on side wall portions of the gate electrodes 34. Next, a photoresist mask 111 exposing the P-MV region and the P-LV regions is formed by a photolithography technique. Next, by performing ion implantation with the photoresist mask 111 as a mask, source/drain diffusion layers (SD diffusion layers) 25 to constitute the sources/drains of the pMOS transistors (transistors in the P-MV region and the P-LV regions) are formed. In formation of the SD diffusion layers 25, for example, boron ion is ion-implanted under the condition of the acceleration energy: 5 keV and the dose amount: $4 \times 10^{15}$ cm$^{-2}$. The conductivity type of the gate electrode 34 of the pMOS transistor becomes p-type by this ion implantation.

Figure 12S:
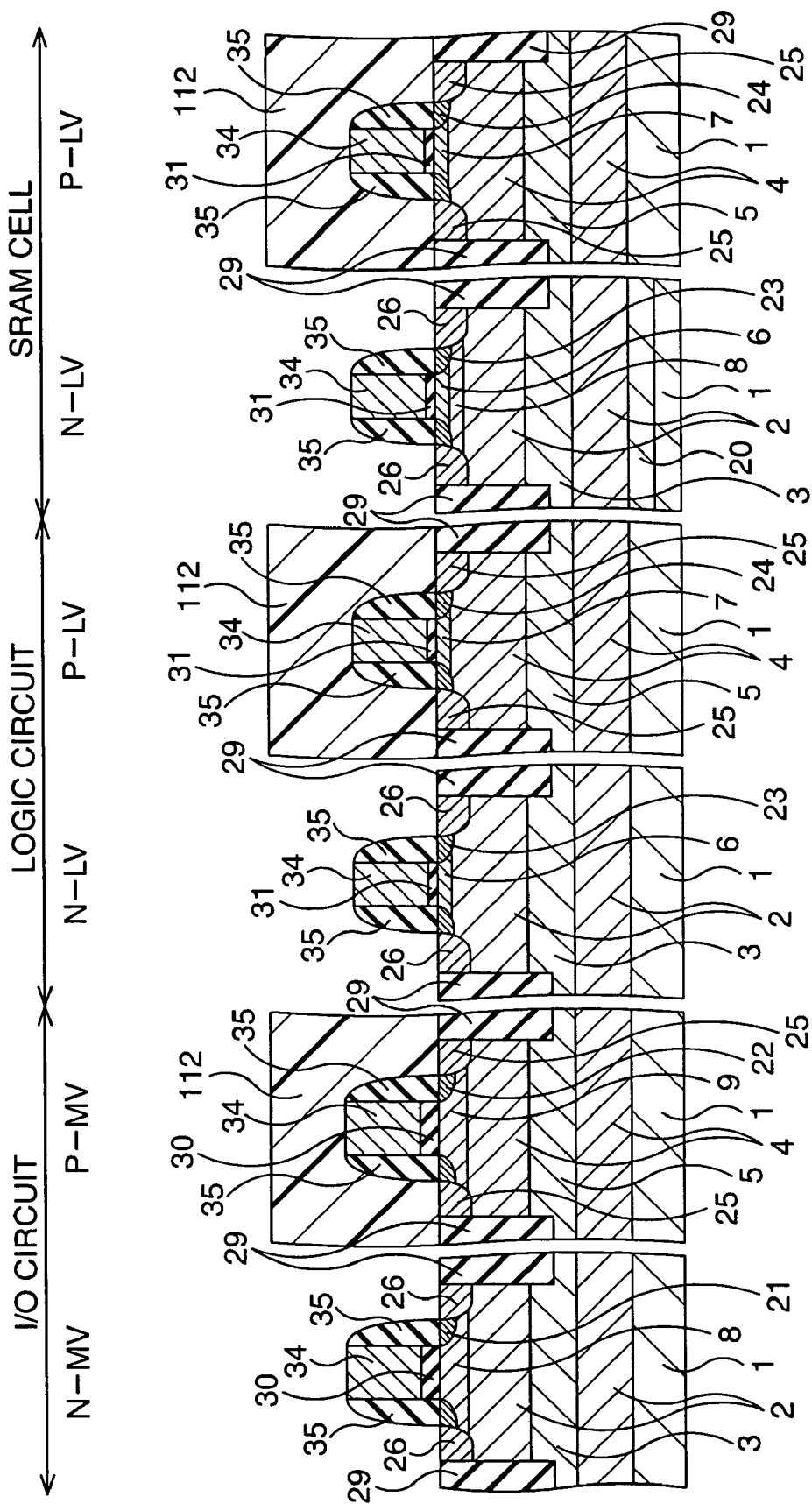
Figure 12T:
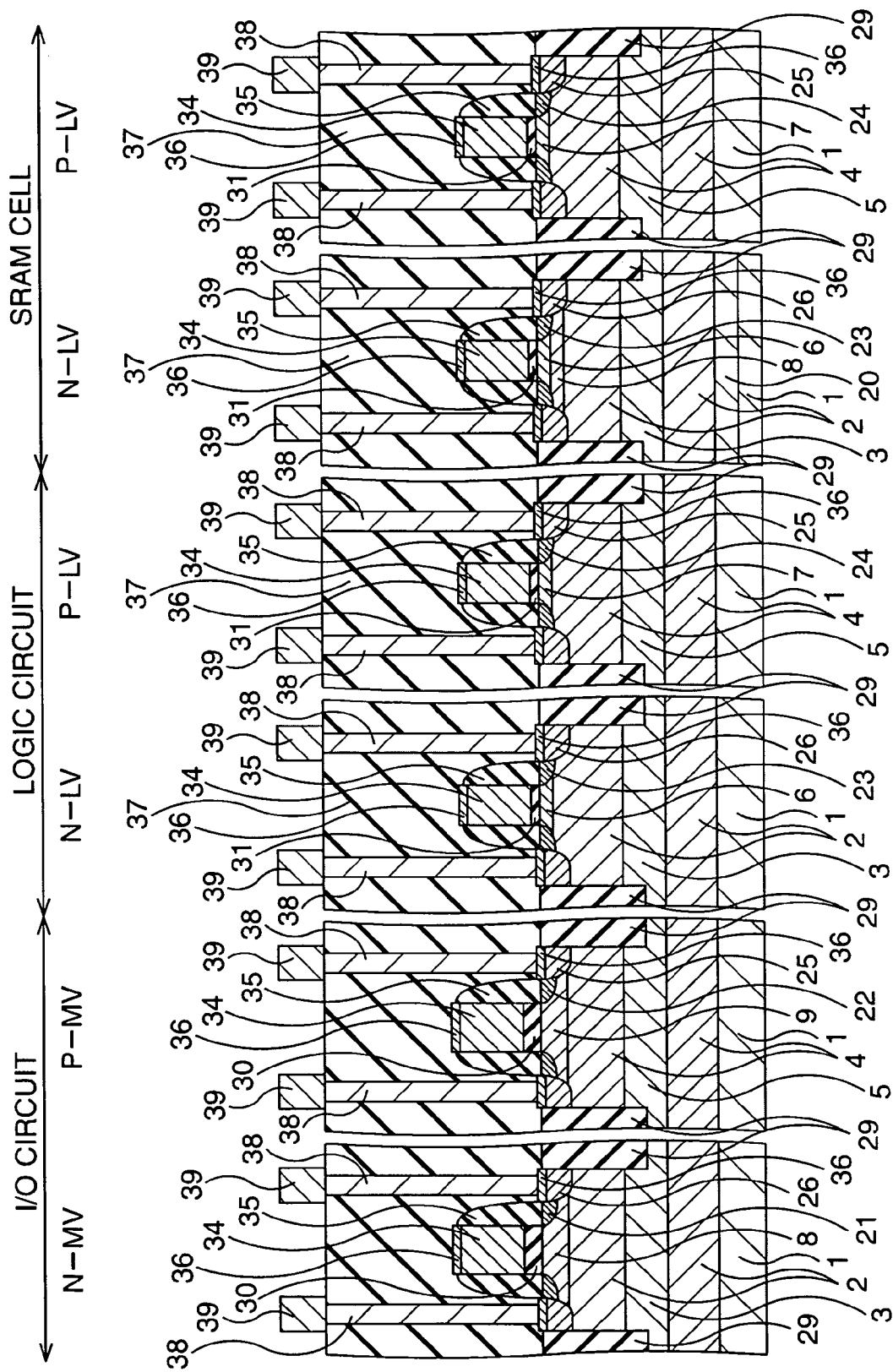

Thereafter, as shown in FIG. 12S, the photoresist mask 111 is removed by, for example, ashing. Next, a photoresist mask 112 exposing the N-MV region and the N-LV regions is formed by a photolithography technique. Next, by performing ion implantation with the photoresist mask 112 as a mask, SD diffusion layers 26 to constitute the sources/drains of the nMOS transistors (transistors in the N-MV region and the N-LV regions) are formed. In formation of the SD diffusion layers 26, for example, phosphorus ion is ion-implanted under the condition of the acceleration energy: 10 keV and the dose amount: $6 \times 10^{15}$ cm$^{-2}$. The conductivity type of the gate electrode 34 of the nMOS transistor becomes n-type by this ion implantation.

Thereafter, as shown in FIG. 12T, the photoresist mask 112 is removed by, for example, ashing. Subsequently, silicide layers 36 are formed on the gate electrodes 34 and the SD diffusion layers 25 and 26 by a known salicide process. Subsequently, an interlayer insulation film 37 is formed on the entire surface, and thereafter, contact holes are formed. After contact plugs 38 are formed in the contact holes, wirings 39 are formed on the interlayer insulation film 37. In this manner, the steps up to the first metal wiring layer are completed. As the interlayer insulation film 37, the Si oxide film of the thickness of about 600 nm is formed by, for example, a HDP method.

Thereafter, further upper wiring layer and interlayer insulation film and the like are formed, and the logic circuit element (semiconductor device) loaded with the SRAM is completed.

In the semiconductor device manufactured according to the above method, the n-type embedded layer 20 is formed directly under the p-well 2, and therefore even when α rays are incident thereon, a change in the depletion layer in the nMOS transistor is suppressed, thus enhancing the soft error resistance. The embedded layer 20 is not formed under the n-well 4, the soft error resistance in the pMOS transistor is not reduced unnecessarily.

In the second embodiment, the channel doped layer in the N-LV region of the SRAM cell region does not have to be made a dual structure.

Third Embodiment

Figure 13A:
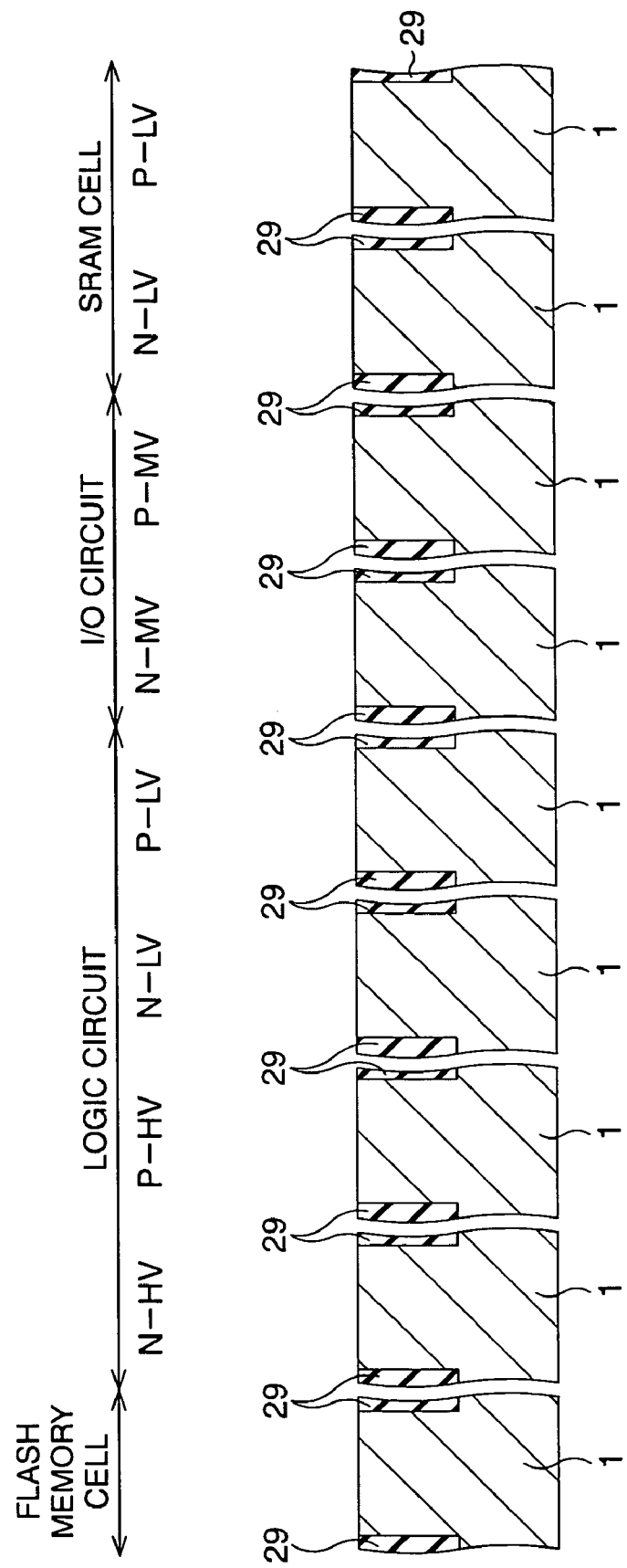
FIG. 13A to FIG. 13Z are sectional views showing a manufacturing method of a semiconductor device according to a third embodiment of the present invention in the sequence of the process steps.

Next, a third embodiment of the present invention will be explained. FIG. 13A to FIG. 13Z are sectional views showing a manufacturing method of a semiconductor device according to the third embodiment of the present invention. In this embodiment, not only an I/O circuit, a logic circuit and a SRAM cell respectively including nMOS transistors and pMOS transistors, but also a flash memory is formed in one chip. In this embodiment, not only a transistor operated at low voltage but also an nMOS transistor and a pMOS transistor operating at higher voltage than the transistor constituting the I/O circuit are formed. Hereinafter, a region in which the nMOS transistor operating at high voltage is formed will be called an N-HV region, an area in which the pMOS transistor operating at high voltage is formed will be called a P-HV region.

In the third embodiment, as shown in FIG. 13A, element isolation insulating films 29 are formed on a surface of an Si substrate 1 first as shown in FIG. 13A. Next, by thermally oxidizing (sacrificial oxidation) the surface of the Si substrate 1, Si oxide film (not shown) of the thickness of about 10 nm is formed.

Figure 13B:
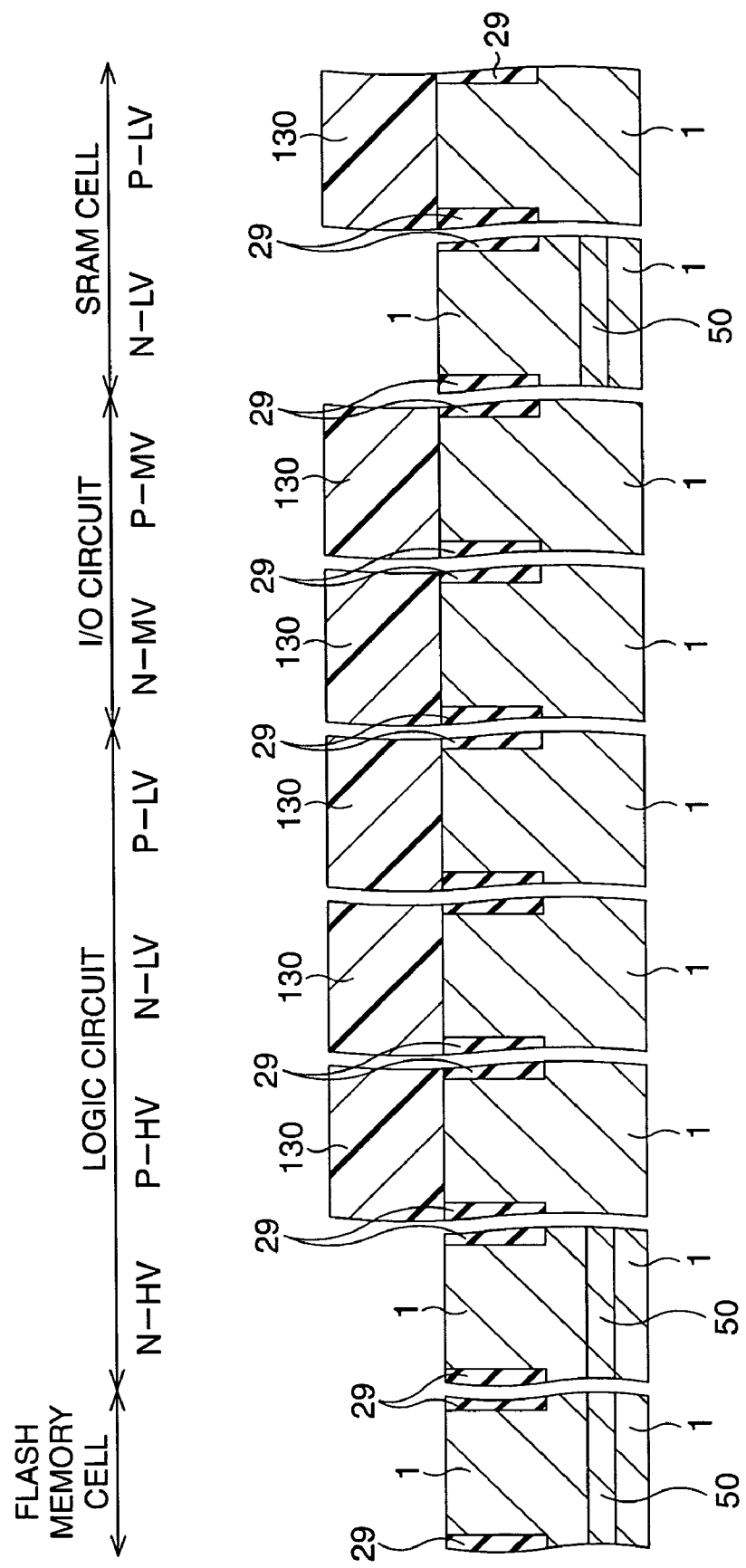

Next, as shown in FIG. 13B, a photoresist mask 130 exposing a flash memory cell region, an N-HV region and an N-LV region of the SRAM cell region is formed by a photolithography technique. Thereafter, by performing ion implantation with the photoresist mask 130 as a mask, an n-type embedded layer 50 is formed. In formation of the n-type embedded layer 50, for example, phosphorus ion is ion-implanted under the condition of the acceleration energy: 2 MeV and the dose amount: $2\times10^{13}$ cm$^{-2}$. The depth of the embedded layer 50 from the substrate surface is about 2 µm, for example.

Figure 13C:
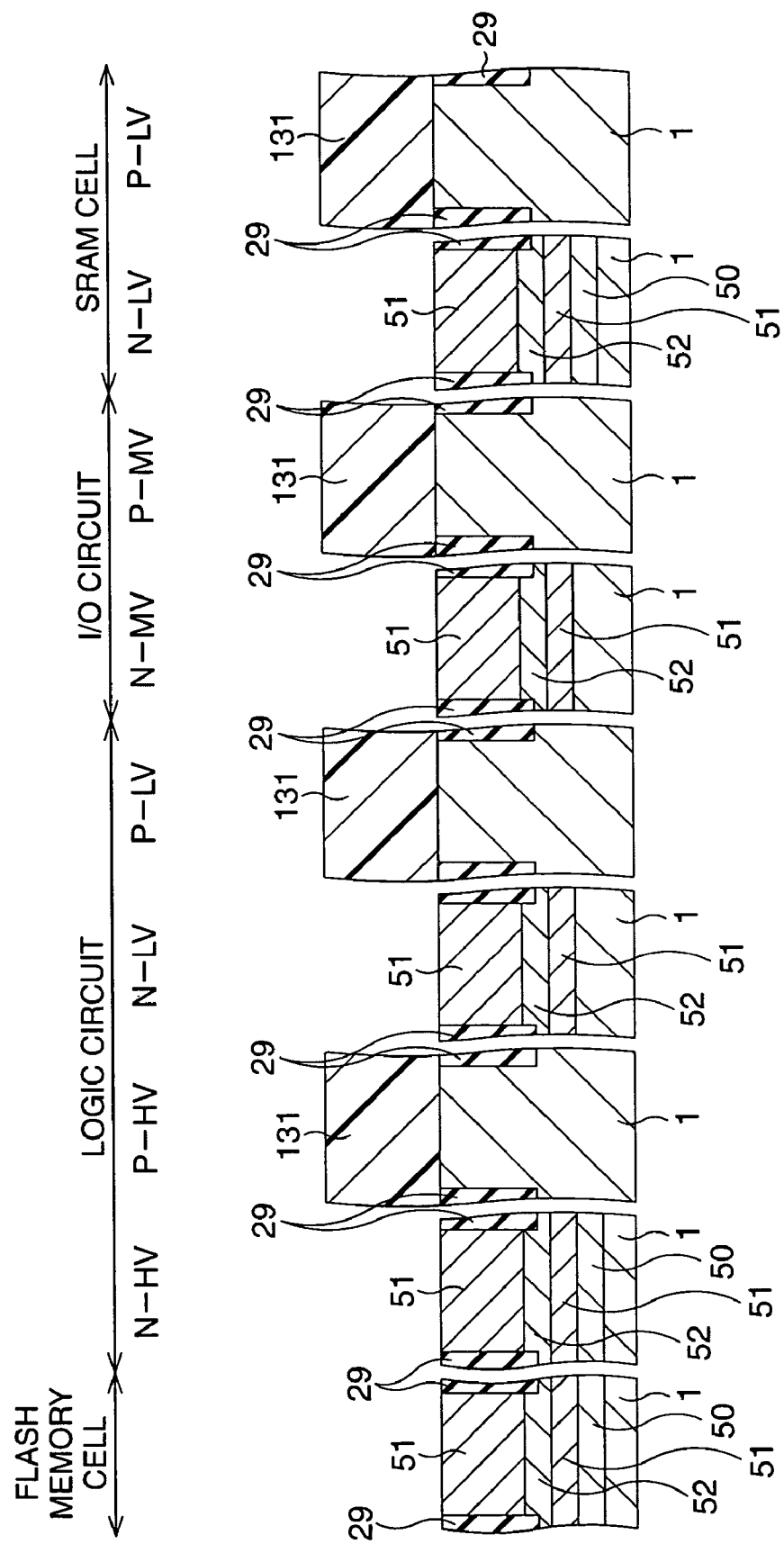

Subsequently, as shown in FIG. 13C, the photoresist mask 130 is removed by, for example, ashing. Next, a photoresist mask 131 exposing the flash memory cell formation region, the N-HV region, the N-MV region and the N-LV regions and covering the other regions is formed by a photolithography technique. Thereafter, with the photoresist mask 131 as a mask, ion implantation is performed, and thereby, p-wells 51 and 52 are formed. In formation of the p-wells 51, for example, boron ion is ion-implanted under the condition of the acceleration energy: 400 keV and the dose amount: $1.4\times10^{13}$ cm$^{-2}$. In formation of the p-wells 52, for example, boron ion is ion-implanted under the condition of the acceleration energy: 100 keV and the dose amount: $3\times10^{12}$ cm$^{-2}$. As a result, the p-well 52 of higher impurity concentration is formed in each of the p-wells 51.

Figure 13D:
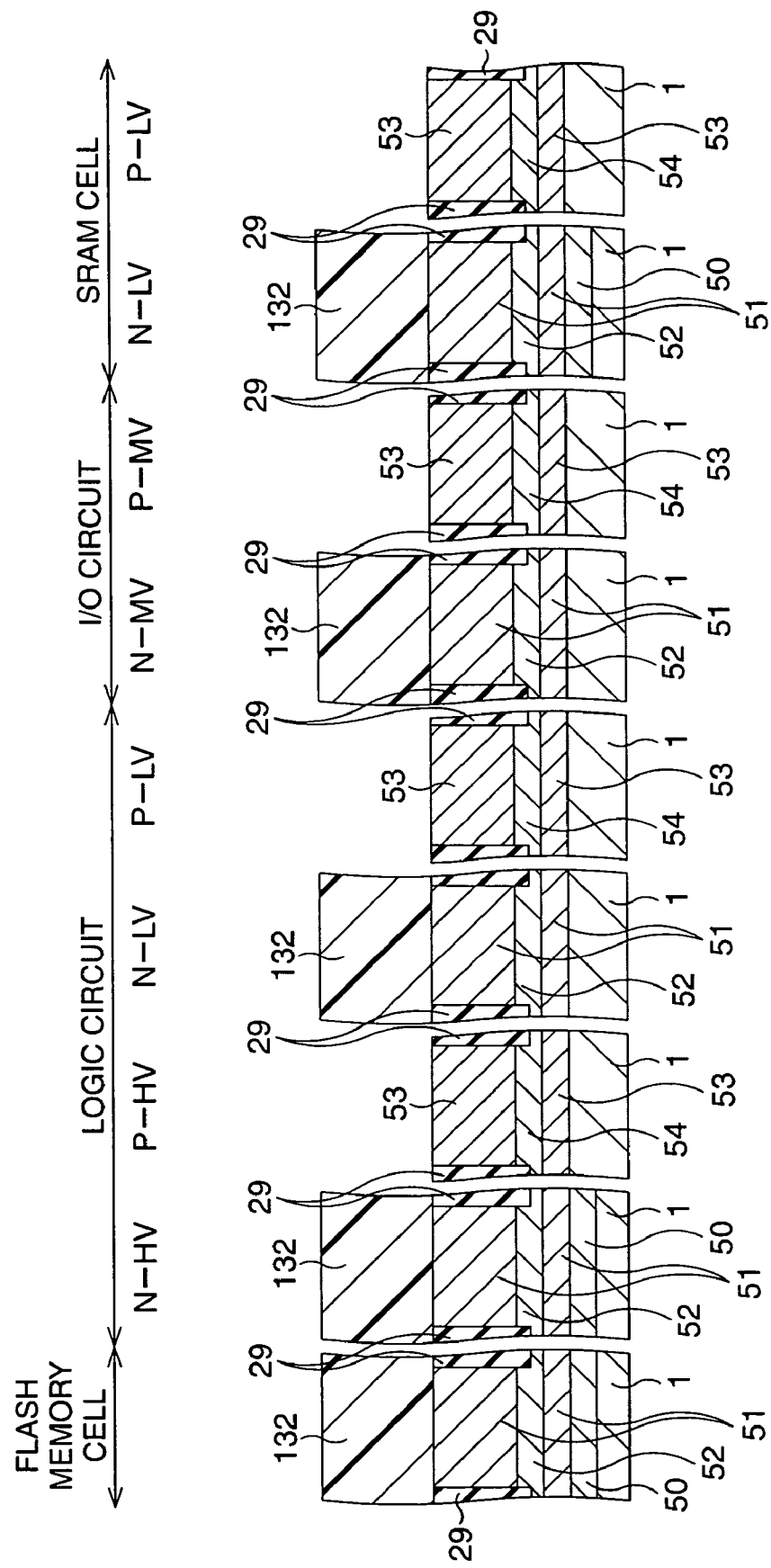

Subsequently, as shown in FIG. 13D, the photoresist mask 131 is removed by, for example, ashing. Next, a photoresist mask 132 exposing the P-HV region, the P-MV region and the P-LV regions and covering the other regions is formed by a photolithography technique. Next, with the photoresist mask 132 as a mask, ion implantation is performed, and thereby, n-wells 53 and 54 are formed. In formation of the n-wells 53, for example, phosphorus ion is ion-implanted under the condition of the acceleration energy: 600 keV and the dose amount: $3\times10^{13}$ cm$^{-2}$. In formation of the n-wells 54, for example, phosphorus ion is ion-implanted under the condition of the acceleration energy: 240 keV and the dose amount: $9\times10^{12}$ cm$^{-2}$. As a result, the n-well 54 of higher impurity concentration is formed in each of the n-wells 53.

Figure 13E:
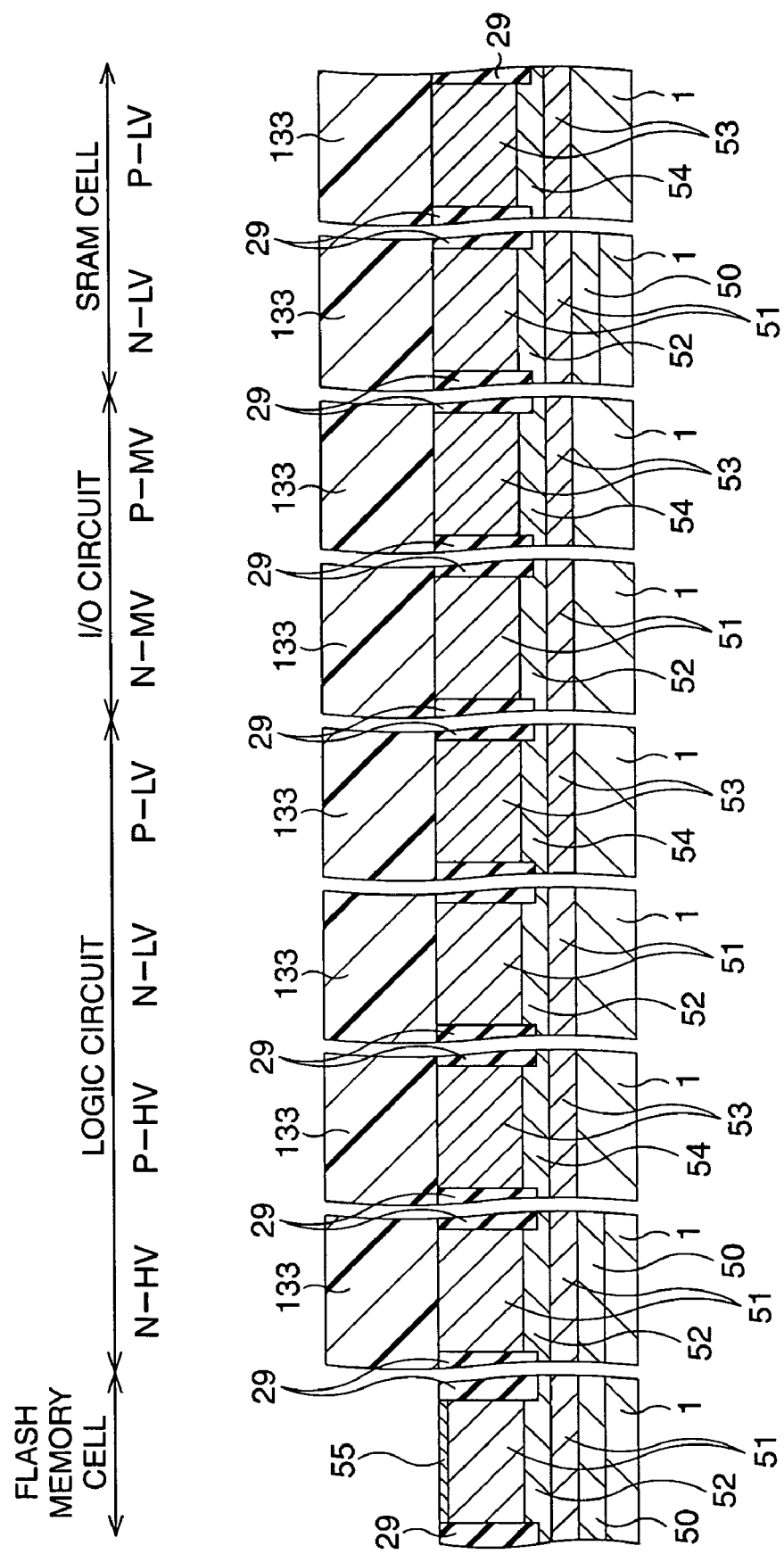

Next, as shown in FIG. 13E, the photoresist mask 132 is removed by, for example, ashing. Thereafter, a photoresist mask 133 exposing the flash memory region is formed by a photolithography technique. Thereafter, with the photoresist mask 133 as a mask, ion implantation is performed, and thereby, a channel doped layer 55 is formed as a p-type threshold voltage control impurity layer. In formation of the channel-doped layer 55, for example, boron ion is ion-implanted under the condition of the acceleration energy: 40 keV and the dose amount: $6\times10^{13}$ cm$^{-2}$.

Figure 13F:
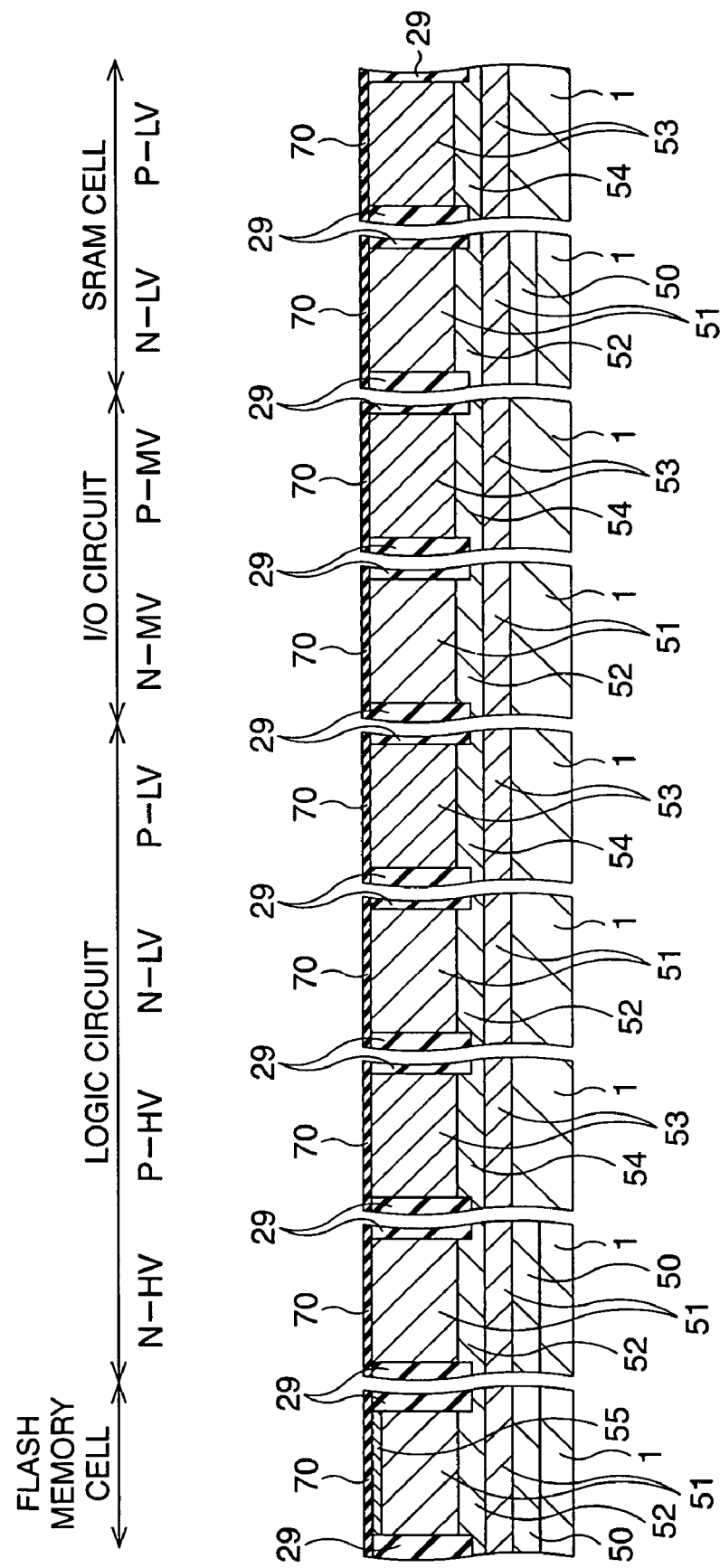

Subsequently, as shown in FIG. 13F, the photoresist mask 133 is removed by, for example, ashing. Next, a tunnel oxide film 70 of the film thickness of about 10 nm is formed on the active regions by performing thermal oxidation at, for example, the temperature of 900° C. to 1050° C. for 30 minutes.

Figure 13G:
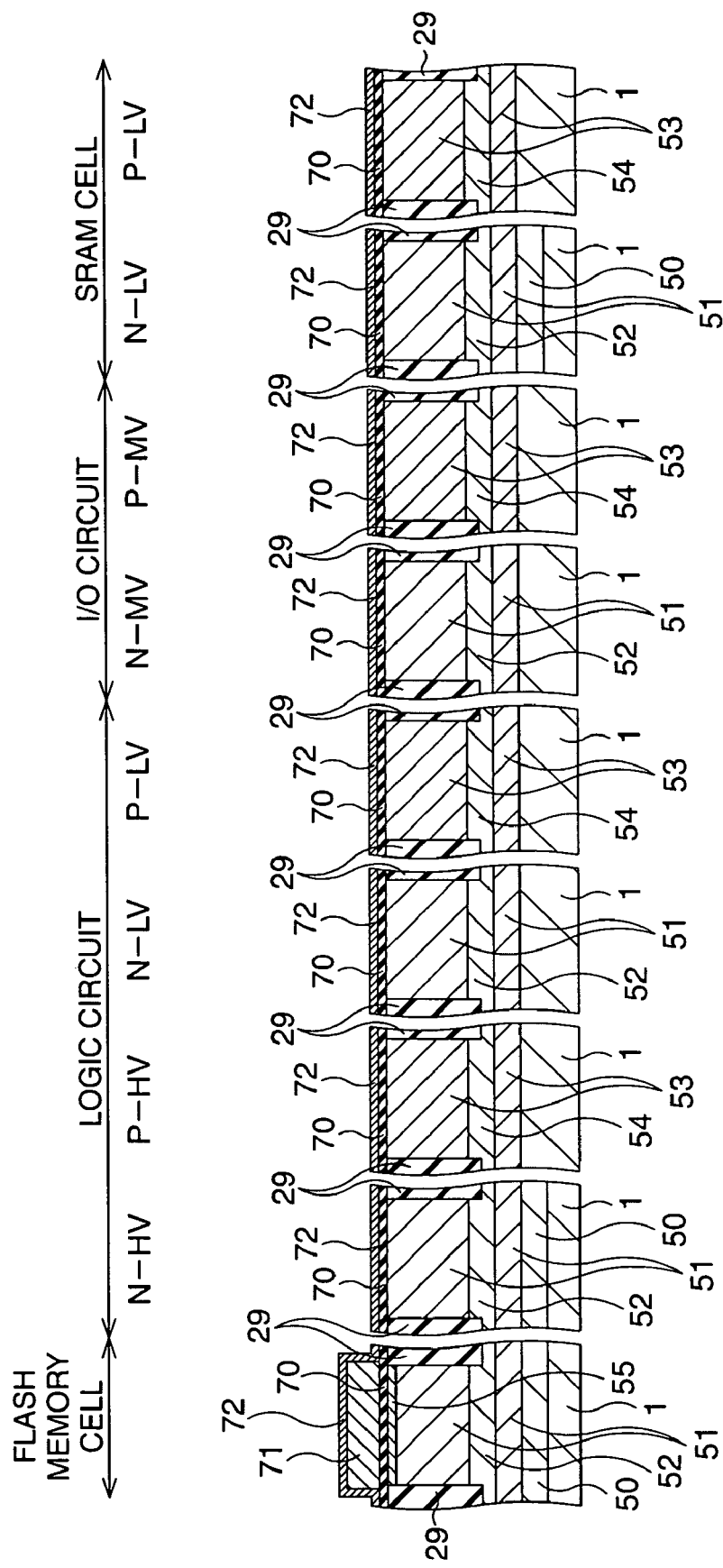

Next, as shown in FIG. 13G, after a polysilicon film of the film thickness of about 90 nm is formed on the tunnel oxide film 70 by, for example, a CVD method, a floating gate 71 is formed in the flash memory cell region by patterning the polysilicon film by a photolithography technique and a dry etching technique. Next, an ONO film 72, which is constituted of a silicon oxide film, a silicon nitride film and a silicon oxide film which are sequentially layered, is formed on the entire surface. In formation of the ONO film 72, the silicon oxide film of the film thickness of about 5 nm and the silicon nitride film of the film thickness of about 10 nm are formed by, for example, a CVD method, and thereafter, the surface of the silicon nitride film is thermally oxidized at 950° C. for 90 minutes, whereby the silicon oxide film of the film thickness of about 30 nm is formed.

Figure 13H:
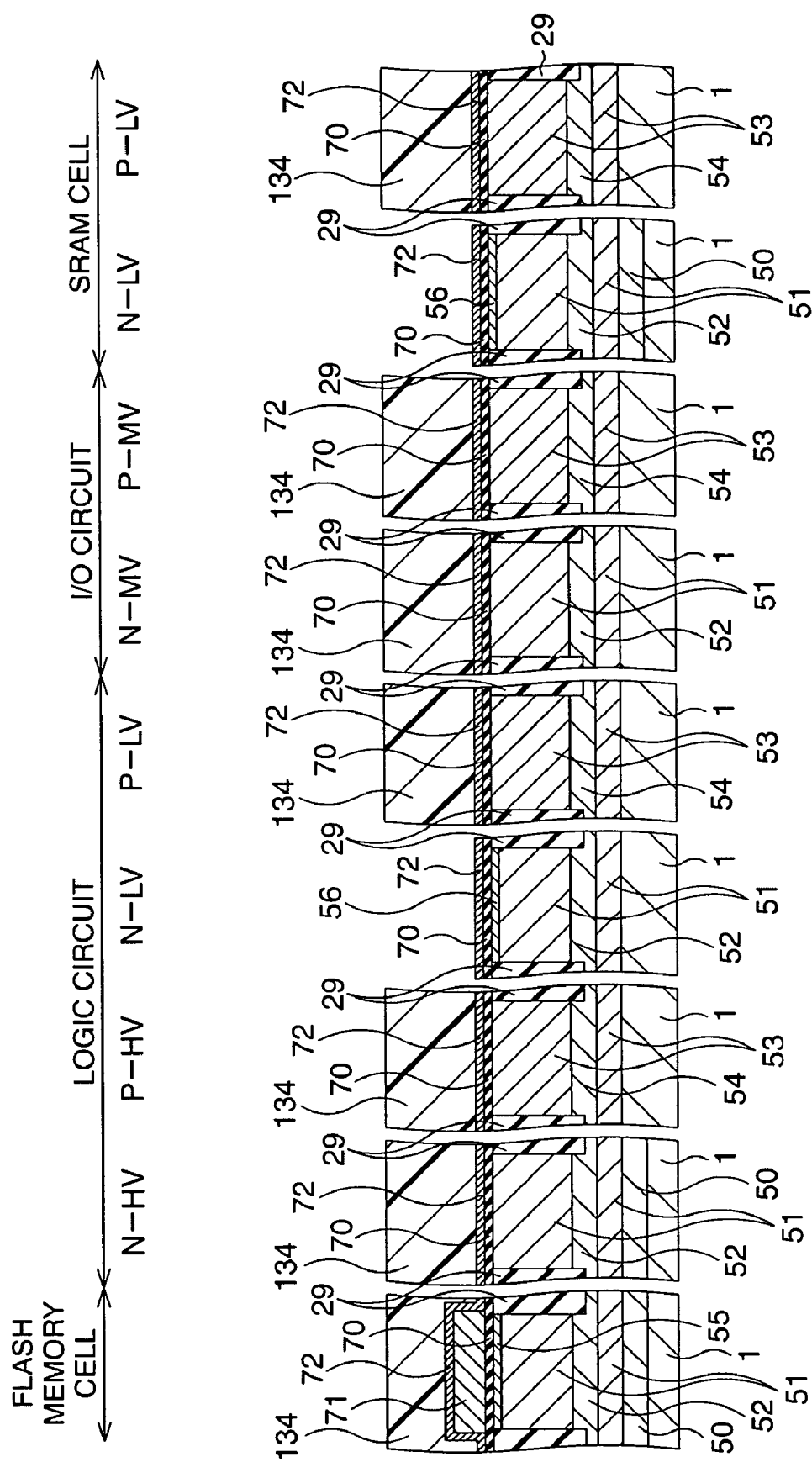

Next, as shown in FIG. 13H, a photoresist film 134 exposing the N-LV regions and covering the other regions is formed by a photolithography technique. Thereafter, with the photoresist mask 134 as a mask, ion implantation is performed, and thereby, channel doped layers 56 are formed as the p-type threshold voltage control impurity layers. In formation of the channel-doped layers 56, for example, boron ion is ion-implanted under the condition of the acceleration energy: 15 keV and the dose amount: $8\times10^{12}$ cm$^{-2}$.

Figure 13I:
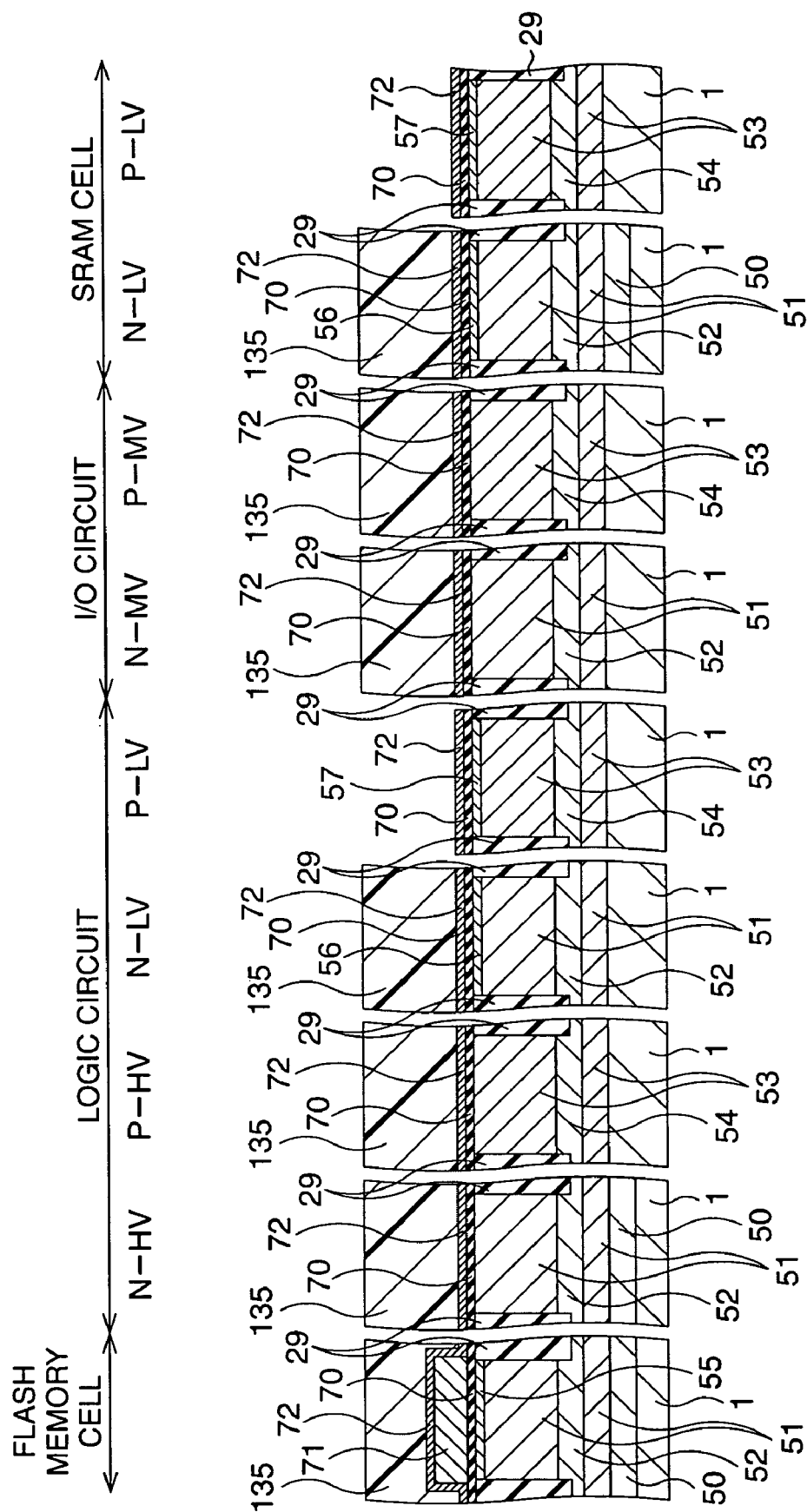

Subsequently, as shown in FIG. 13I, the photoresist mask 134 is removed by, for example, ashing. Next, a photoresist mask 135 exposing the P-LV regions is formed by a photolithography technique. Next, with the photoresist mask 135 as a mask, ion implantation is performed, and thereby, channel doped layers 57 are formed as the n-type threshold voltage control impurity layers. In formation of the channel-doped layers 57, for example, arsenic ion is ion-implanted under the condition of the acceleration energy: 150 keV and the dose amount: $3\times10^{12}$ cm$^{-2}$.

Figure 13J:
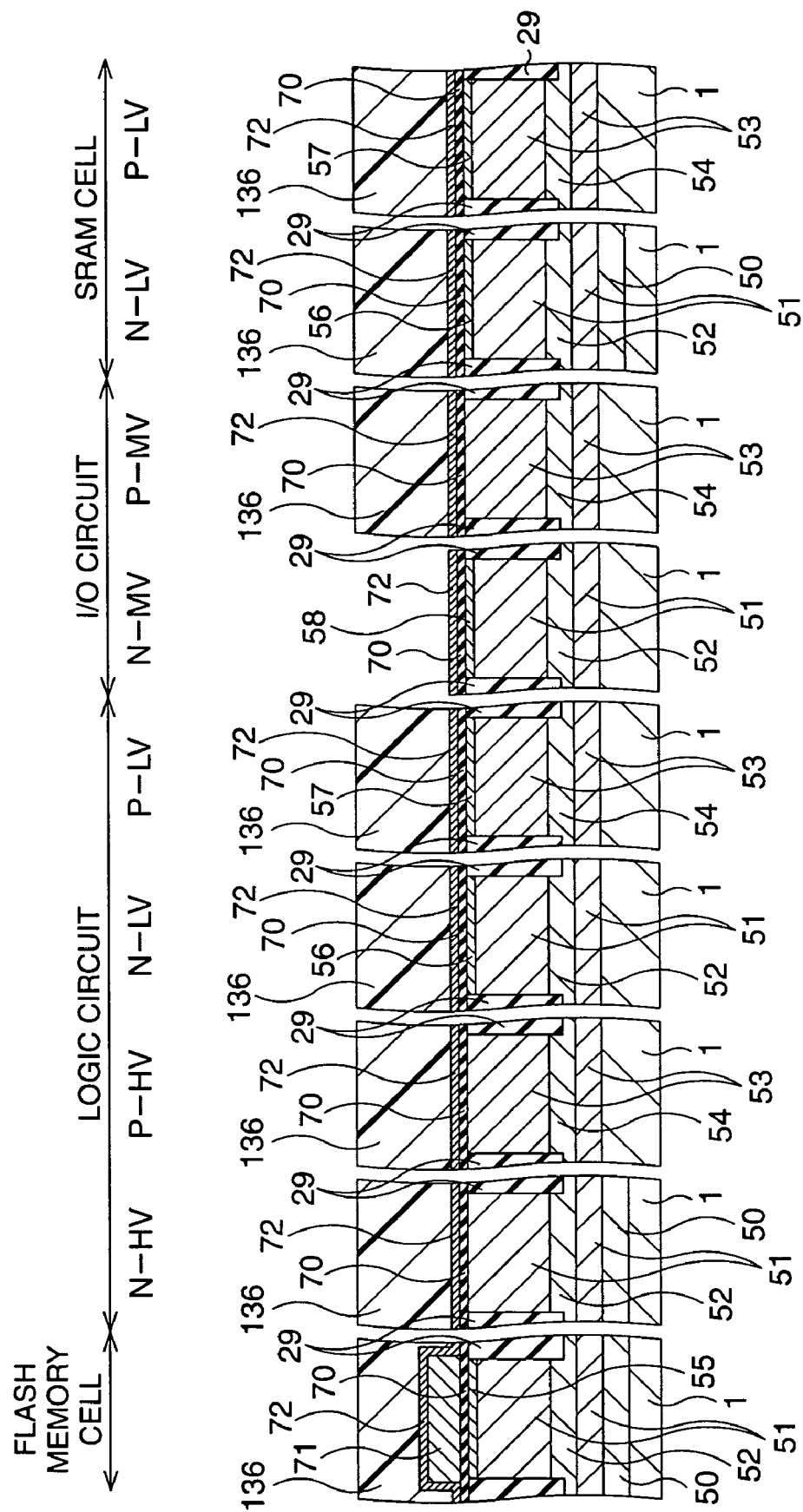

Thereafter, as shown in FIG. 13J, the photoresist mask 135 is removed by, for example, ashing. Subsequently, a photoresist mask 136 exposing the N-MV region and covering the other regions is formed by a photolithography technique. Next, with the photoresist mask 136 as a mask, ion implantation is performed, and thereby, a channel doped layer 58 is formed as a p-type threshold voltage control impurity layer. In formation of the channel-doped layer 58, for example, boron ion is ion-implanted under the condition of the acceleration energy: 35 keV and the dose amount: $5\times10^{12}$ cm$^{-2}$. As in the first and the second embodiments, the photoresist mask 136 may be formed into the shape exposing the N-LV region of the SRAM cell, and the channel doped layer 58 may be also formed in the N-LV region of the SRAM cell region. In this case, the channel doped layers 56 and 58 are formed in the N-LV region of the SRAM cell region, and the state of the N-LV region of the SRAM cell region is in the same sate as shown in FIG. 5B.

Figure 13K:
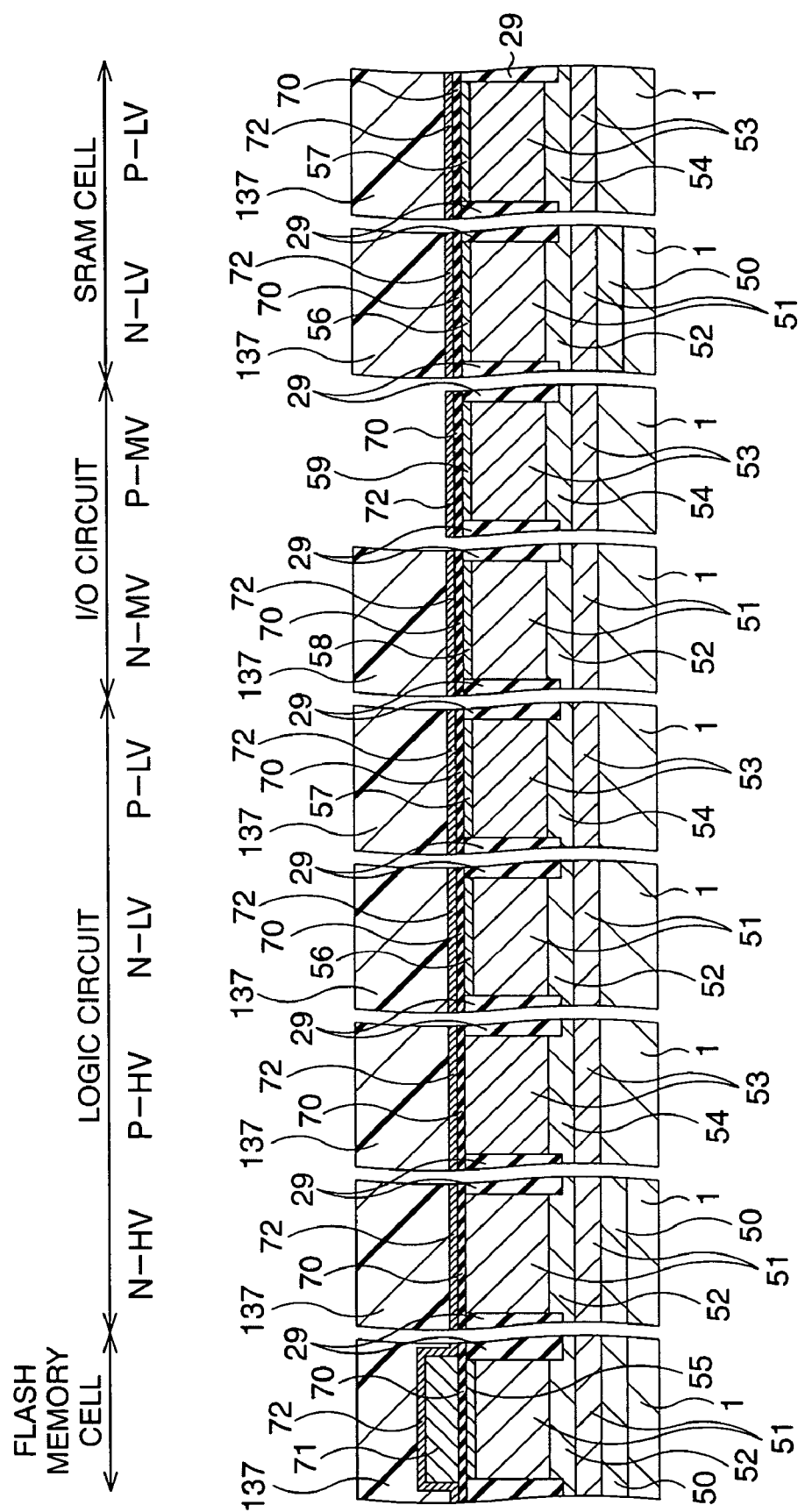

Next, as shown in FIG. 13K, the photoresist mask 136 is removed by, for example, ashing. Thereafter, a photoresist mask 137 exposing the P-MV region and covering the other regions is formed by a photolithography technique. Subsequently, with the photoresist mask 137 as a mask, ion implantation is performed, and thereby, a channel doped layer 59 is formed as the n-type threshold voltage control impurity layer. In formation of the channel-doped layer 59, for example, arsenic ion is ion-implanted under the condition of the acceleration energy: 150 keV and the dose amount: $2\times10^{12}$ cm$^{-2}$.

Figure 13L:
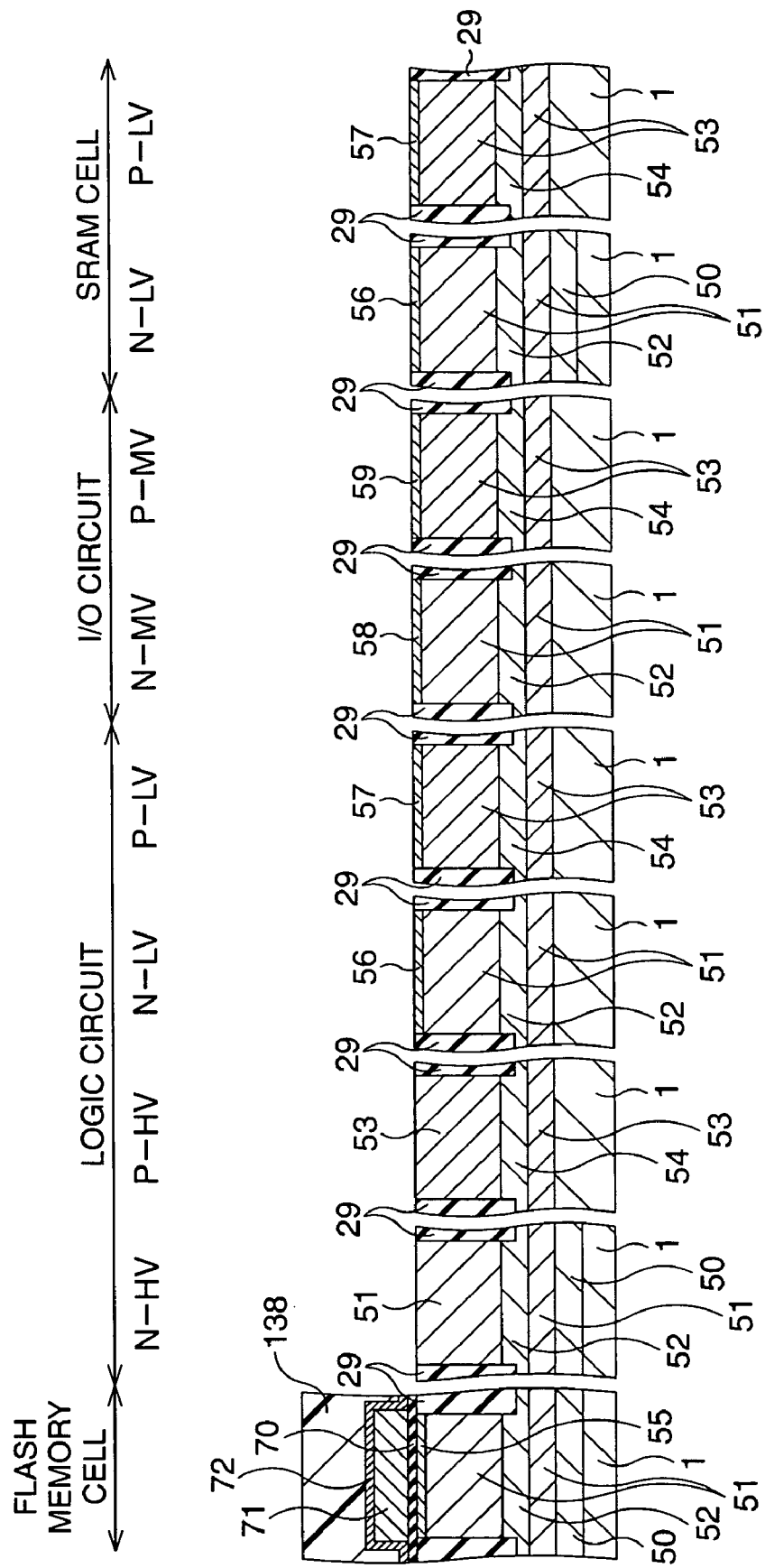

Next, as shown in FIG. 13L, the photoresist mask 137 is removed by, for example, ashing. Next, a photoresist mask 138 covering the flash memory cell region and exposing the other regions is formed by a photolithography technique. Thereafter, by, for example, dry etching, the ONO film 72 is etched with the photoresist mask 138 as a mask. As a result, the ONO film 72 of the other regions than the flash memory cell region is removed. Further, by wet etching using a hydrofluoric acid aqueous solution, the tunnel oxide film 70 is etched with the photoresist mask 138 as a mask. As a result, the tunnel oxide film 70 of the other regions than the flash memory region is removed.

Figure 13M:
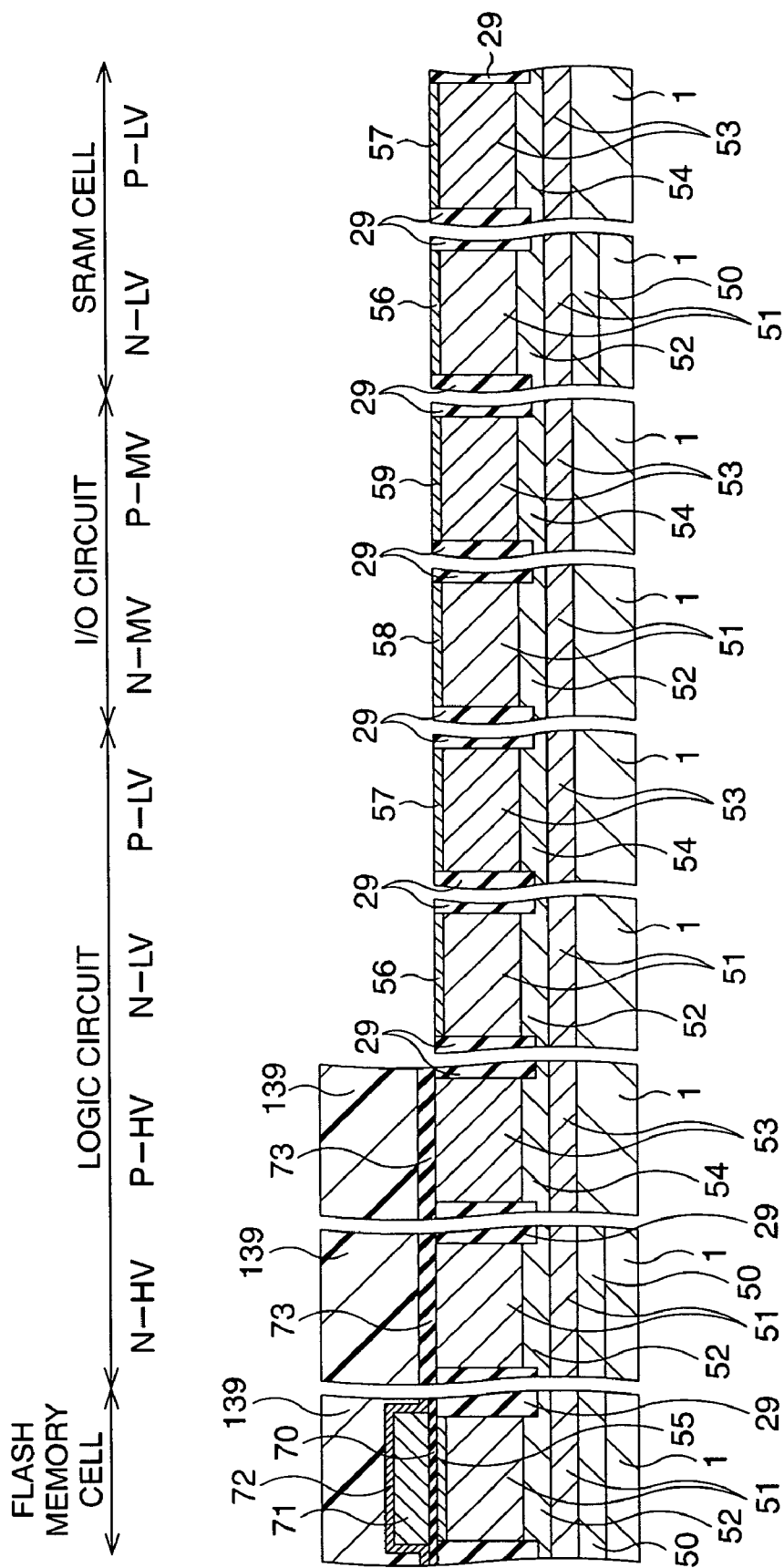

Next, as shown in FIG. 13M, the photoresist mask 138 is removed by, for example, ashing. Next, silicone oxide films each of the film thickness of about 11 nm are formed on the active regions as gate insulation films 73 by performing thermal oxidation at, for example, the temperature of 800° C. Thereafter, by a photolithography, a photoresist film 139 covering the flash memory cell region, the N-HV region and the P-HV region and exposing the other regions is formed. Subsequently, by wet etching using a hydrofluoric acid aqueous solution, for example, the gate insulation films 73 are etched with the photoresist mask 139 as a mask. As a result, the gate insulation films 73 in the N-MV region, the P-MV region, the N-LV regions and the P-LV regions are removed.

Figure 13N:
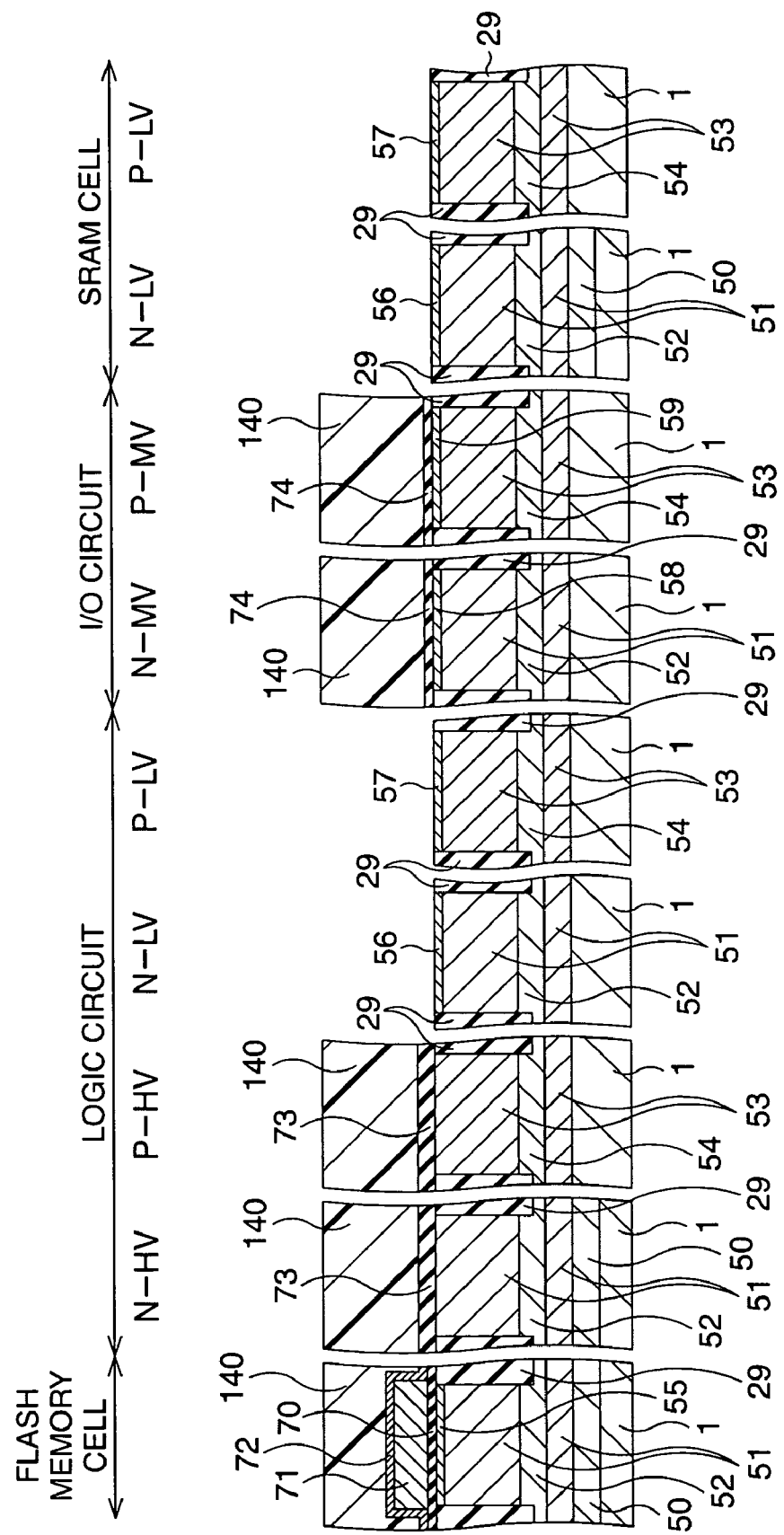

Next, as shown in FIG. 13N, the photoresist film 139 is removed by, for example, ashing. Next, silicone oxide films each of the film thickness of about 7 nm are formed on the active regions of the N-MV region, the P-MV region, the N-LV regions and the P-LV regions as gate insulation films 74 by performing thermal oxidation at, for example, the temperature of 800° C. The film thickness of the gate insulation films 73 is increased by this thermal oxidation. Thereafter, by a photolithography technique, a photoresist mask 140 covering the flash memory cell region, the N-HV region, the P-HV region, the N-MV region and the P-MV region and exposing the N-LV regions and the P-LV regions is formed. Subsequently, by wet etching using a hydrofluoric acid aqueous solution, for example, the gate insulation films 74 are etched with the photoresist mask 140 as a mask. As a result, the gate insulation films 74 in the N-LV regions and the P-LV regions are removed.

Figure 13O:
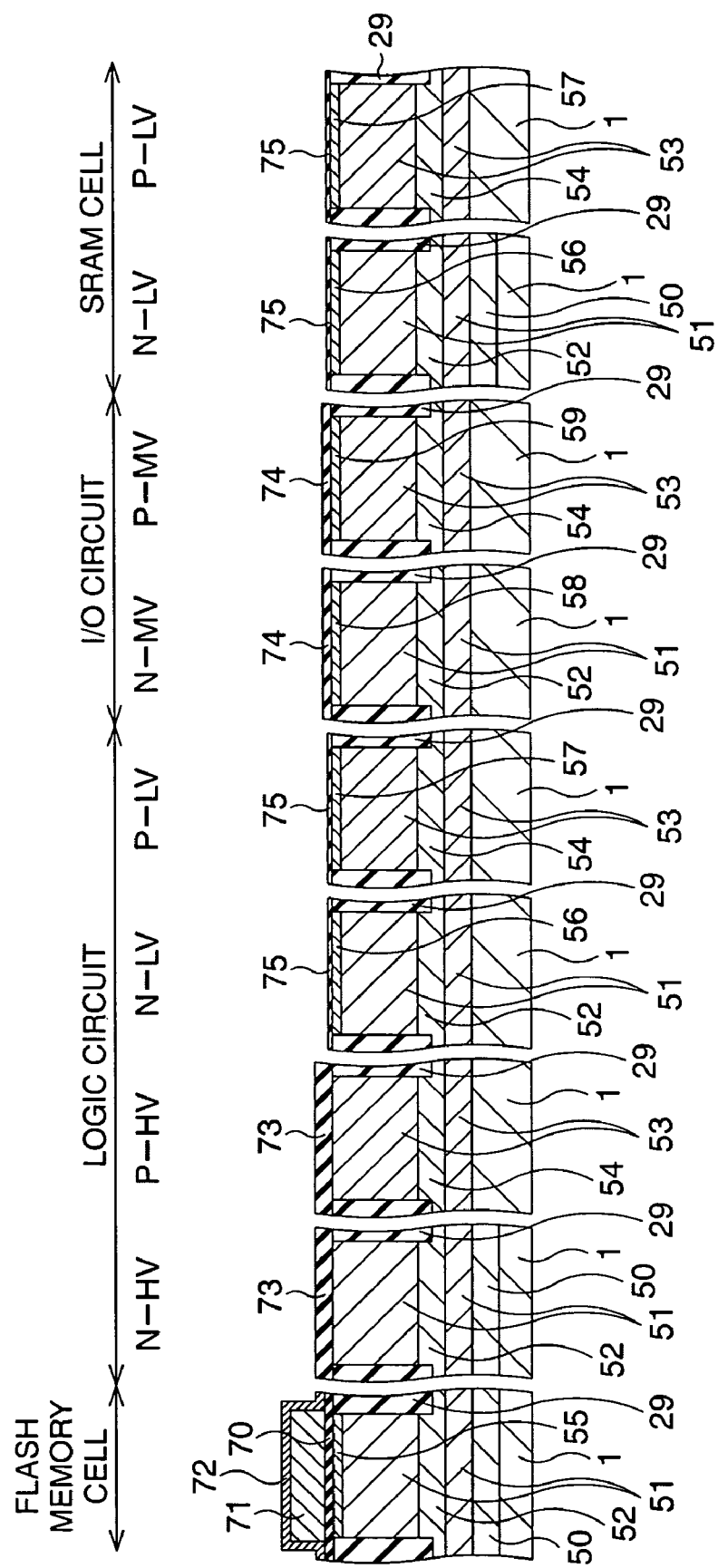

Next, as shown in FIG. 13O, the photoresist mask 140 is removed by, for example, ashing. Next, silicone oxide films each of the film thickness of about 1.8 nm are formed on the active regions of the N-LV regions and the P-LV regions as gate insulation films 75 by performing thermal oxidation at, for example, the temperature of 850° C. The film thickness of each of the gate insulation films 73 and 74 increases by this thermal oxidation.

Figure 13P:
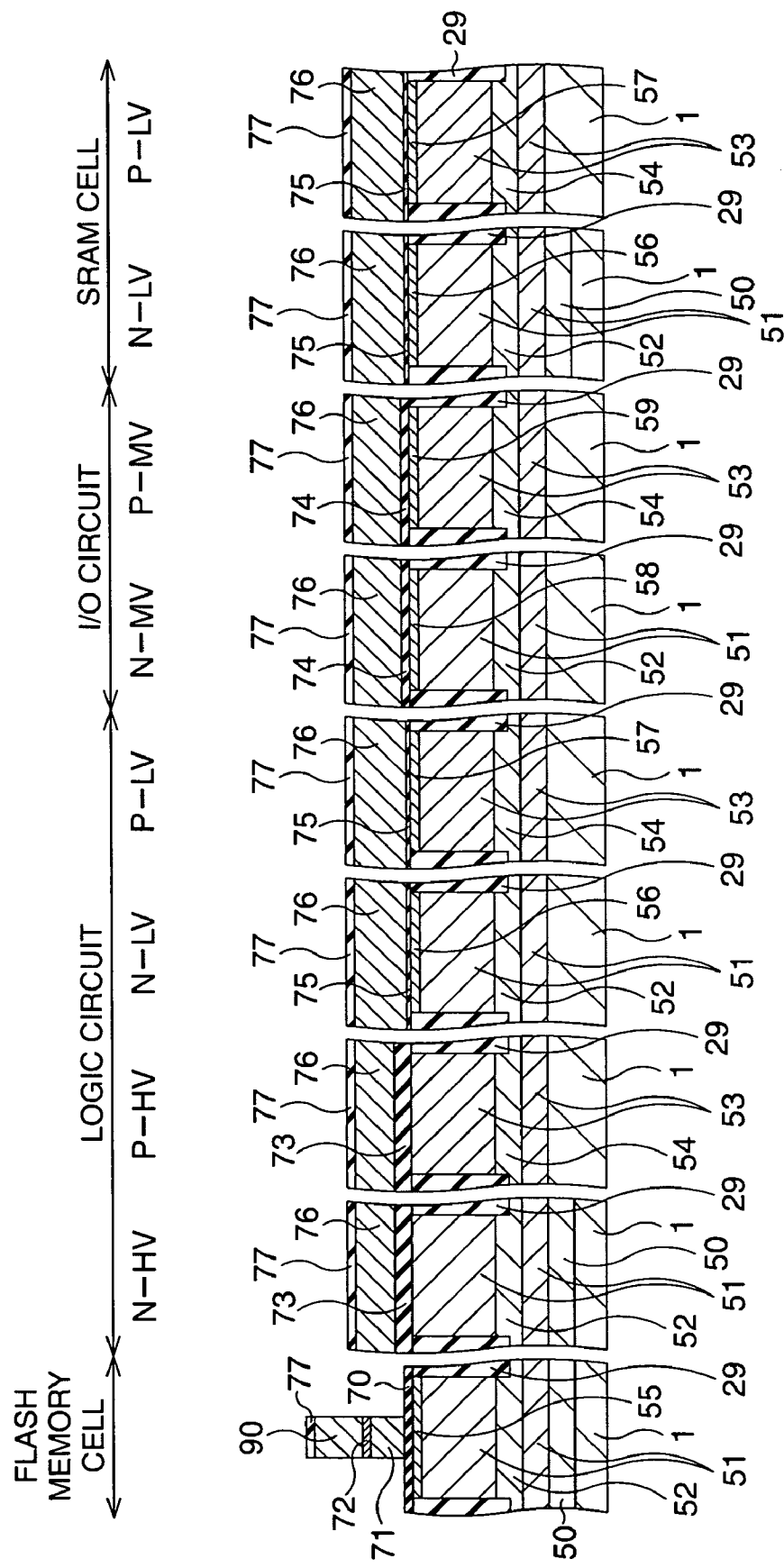

Next, as shown in FIG. 13P, a polysilicon film 76 of the film thickness of about 180 nm, for example, is formed by a CVD method, and a silicon nitride film 77 of the film thickness of about 30 nm, for example, is formed on the polysilicon film 76 as a etching mask also serving as an antireflection film. The silicon nitride film 77 also exhibits the function of protecting the gate electrodes in the logic circuit, the I/O circuit and the SRAM cell when the side surfaces of the gate electrode of the flash memory cell which will be described later is oxidized. Thereafter, the silicon nitride film 77, the polysilicon film 76, the ONO film 72 and the floating gate 71 in the flash memory cell region are patterned by photolithography and dry etching, and thereby, the gate electrode 90 and the like constituted of the polysilicon film 76 is formed.

Figure 13Q:
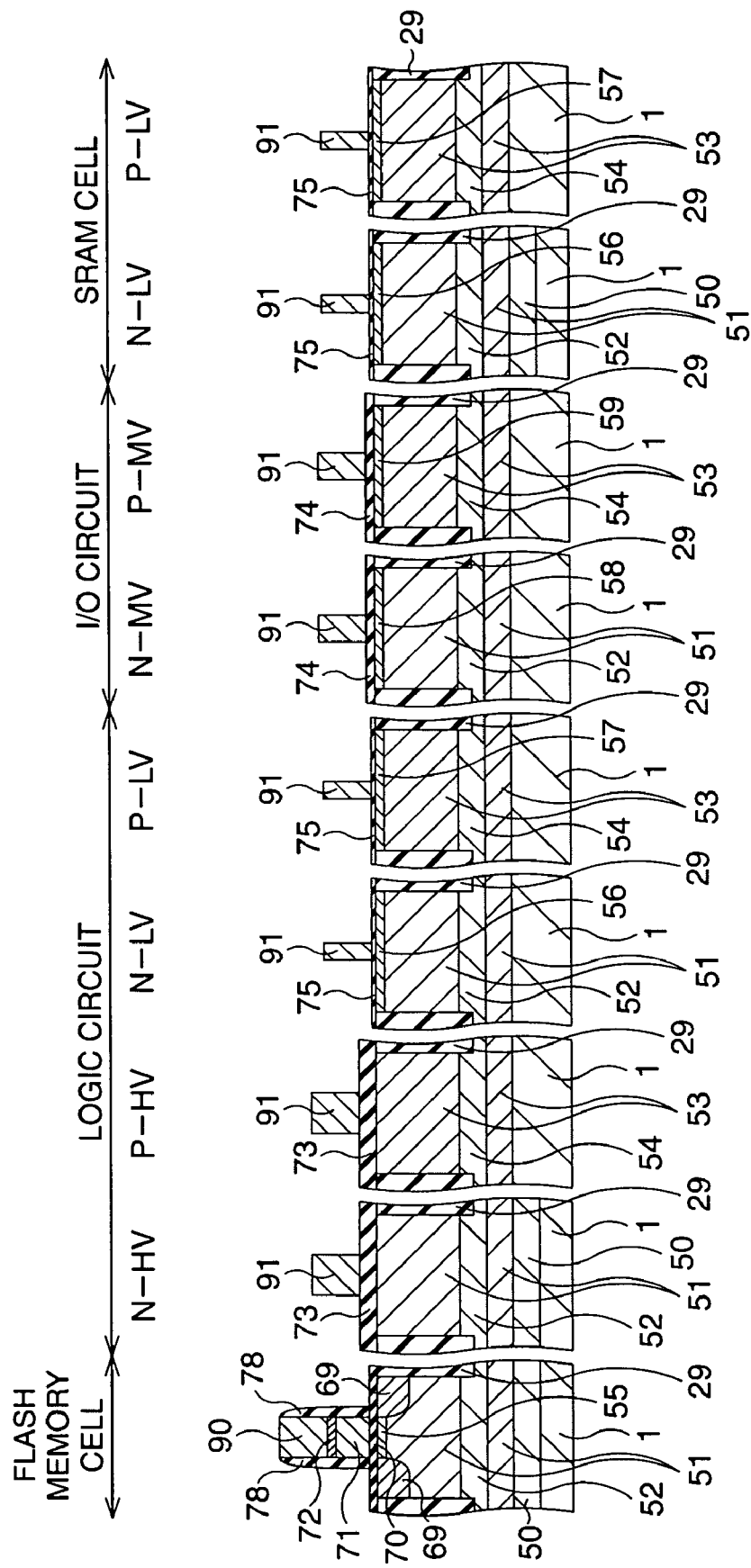

Next, as shown in FIG. 13Q, the side surfaces of the gate electrode 90 are thermally oxidized by about 10 nm. Thereafter, an SD diffusion layer 69 which constitutes a source/drain is formed by ion implantation. Subsequently, the side surfaces of the gate electrode 90 are thermally oxidized by about 10 nm again. Next, after a silicon nitride film is deposited by, for example, a thermal CVD method, the silicon nitride film is etched back, and thereby side walls (side wall insulation films) 78 constituted of the silicon nitride film are formed on side wall portions of the gate electrode 90. Next, the polysilicon film 76 in the N-HV region, the P-HV region, the N-MV region, the P-MV region, the N-LV regions and the P-LV regions are patterned by photolithography and dry etching, and thereby gate electrodes 91 constituted of the polysilicon film 76 are formed. At this time, the width of each of the gate electrodes 91 in the N-MV region and the P-MV region is made larger than the width of each of the gate electrodes 91 in the N-LV regions and the P-LV regions, and the width of each of the gate electrodes 91 in the N-HV region and the P-HV region is made larger than the width of each of the gate electrodes 91 in the N-MV region and the P-MV region.

Figure 13R:
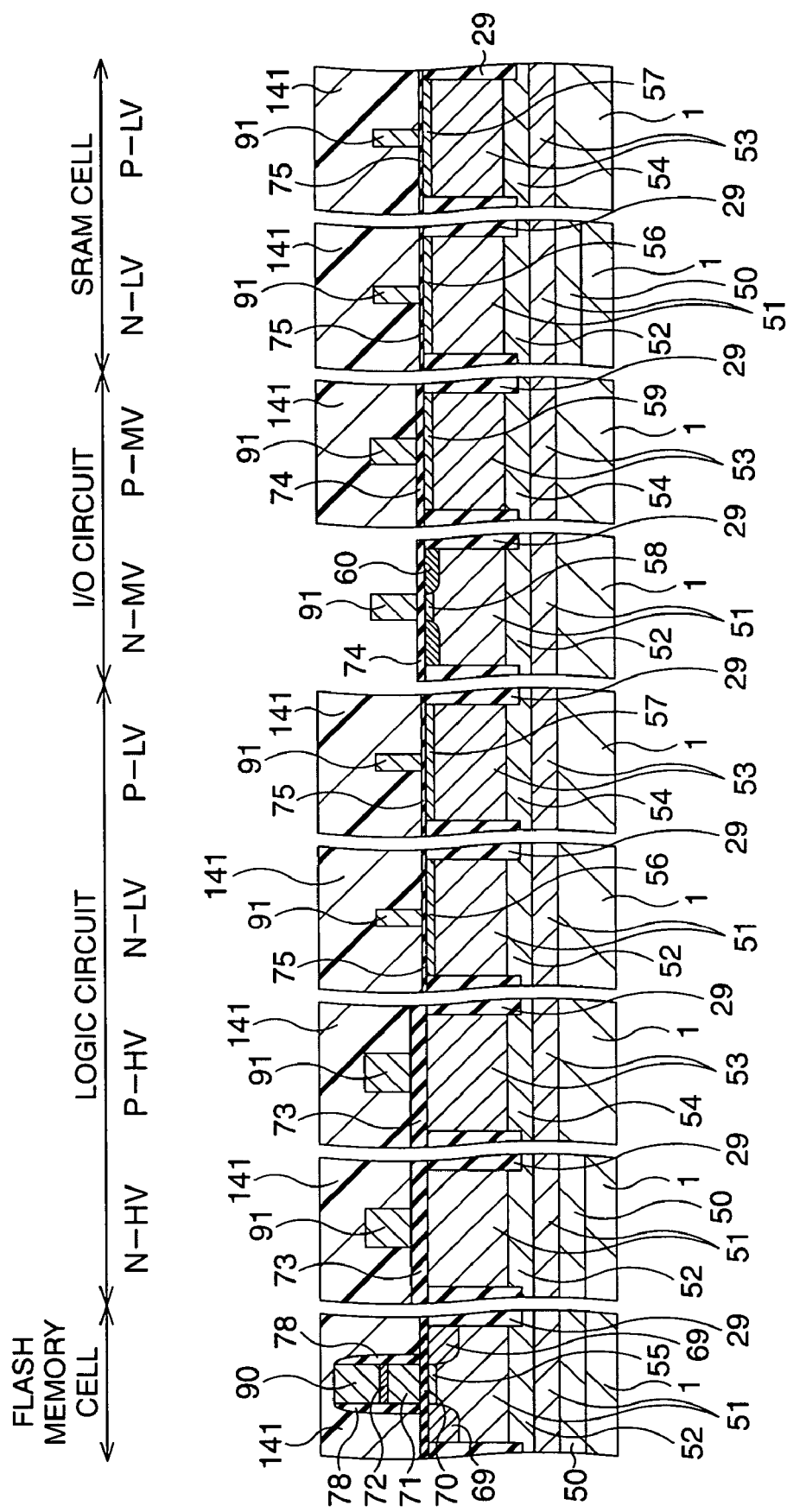

Subsequently, as shown in FIG. 13R, a photoresist mask 141 exposing the N-MV region and covering the other regions is formed by a photolithography technique. Next, an extension layer 60 for forming a source/drain of the N-MV region is formed by performing ion implantation with the photoresist mask 141 as a mask. In formation of the extension layer 60, for example, phosphorus ion is ion-implanted under the condition of the acceleration energy: 35 keV and the dose amount: $4 \times 10^{13}$ cm$^{-2}$.

Figure 13S:
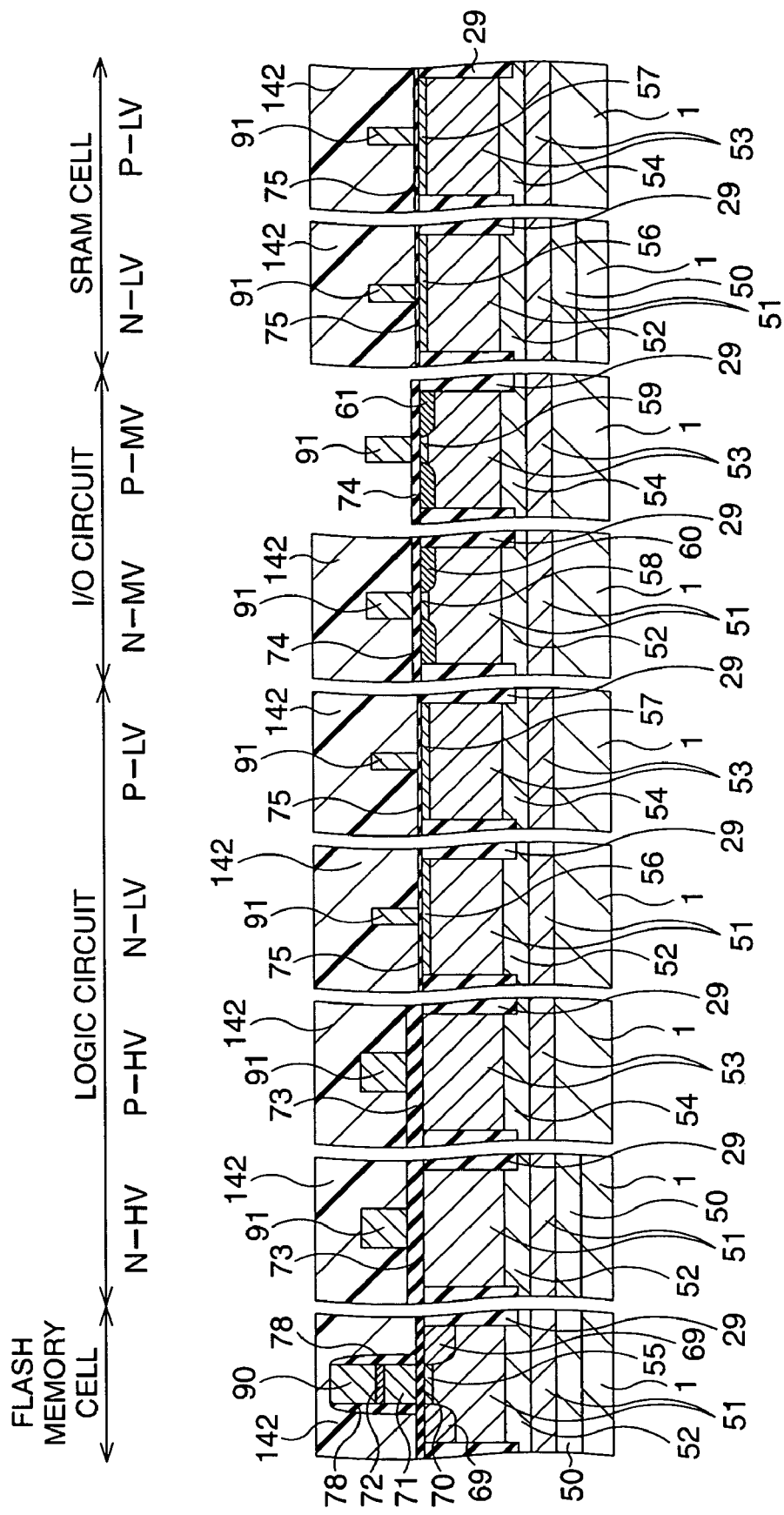

Next, as shown in FIG. 13S, the photoresist mask 141 is removed by, for example, ashing. Thereafter, a photoresist mask 142 exposing the P-MV region and covering the other regions is formed by a photolithography technique. Subsequently, an extension layer 61 for forming a source/drain of the P-MV region is formed by performing ion implantation with the photoresist mask 142 as a mask. In formation of the extension layer 61, for example, boron fluoride ion is ion-implanted under the condition of the acceleration energy: 10 keV and the dose amount: $4 \times 10^{13}$ cm$^{-2}$.

Figure 13T:
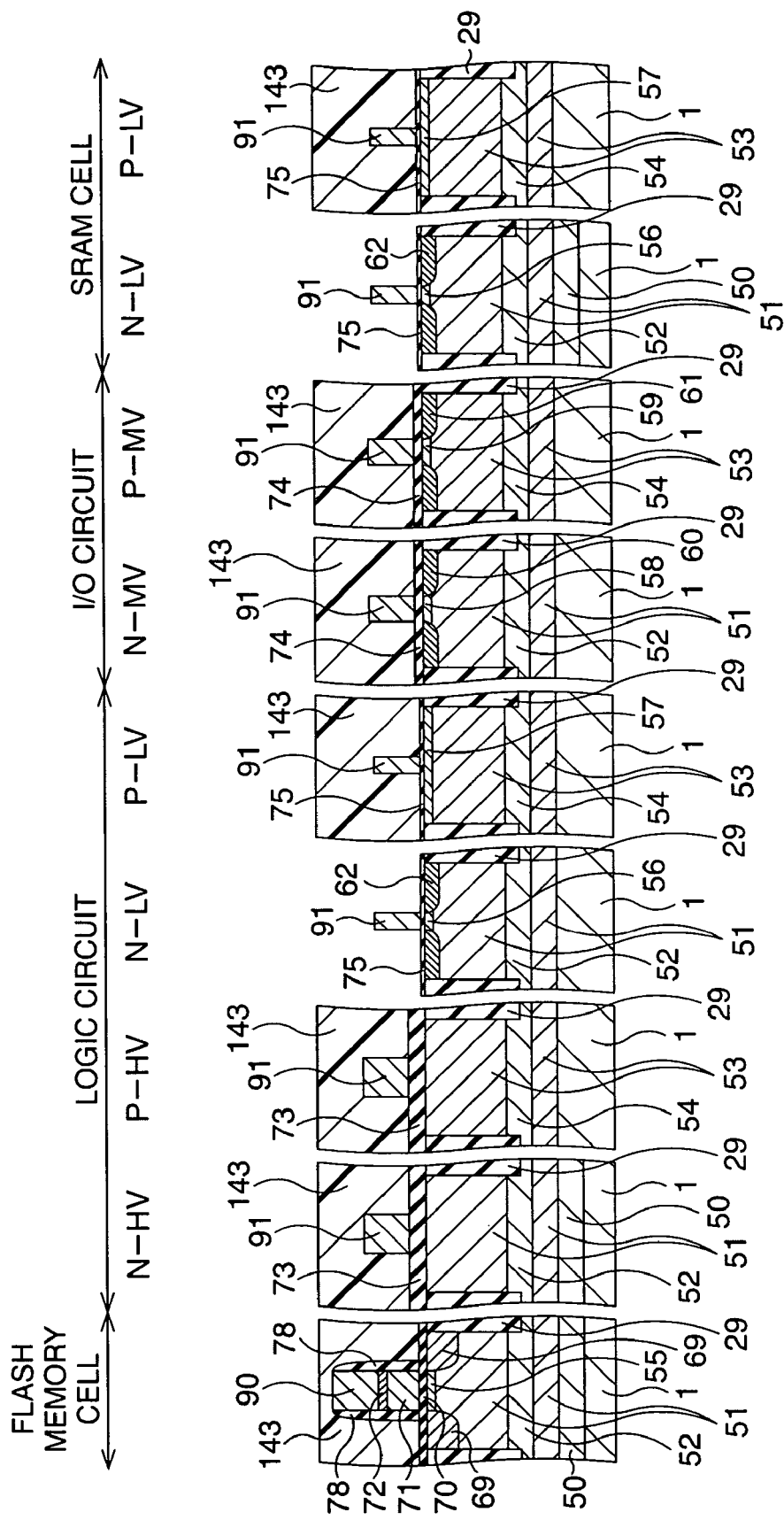

Next, as shown in FIG. 13T, the photoresist mask 142 is removed by, for example, ashing. Next, a photoresist mask 143 exposing the N-LV regions and covering the other regions is formed by a photolithography technique. Thereafter, ion-implantation is performed with the photoresist mask 143 as a mask, and thereby, extension layers 62 which constitute the sources/drains of the N-LV regions are formed. In formation of the extension layers 62, for example, arsenic ion is ion-implanted under the condition of the acceleration energy: 3 keV and the dose amount: $1 \times 10^{15}$ cm$^{-2}$, and thereafter, boron fluoride ion is ion-implanted from the four directions inclined 28 degrees from the normal line of the Si substrate 1 under the condition of the acceleration energy: 80 keV and the dose amount: $4 \times 10^{12}$ cm$^{-2}$ for each. As a result, the extension layers 62 become an extension layers including pocket layers (not shown).

Figure 13U:
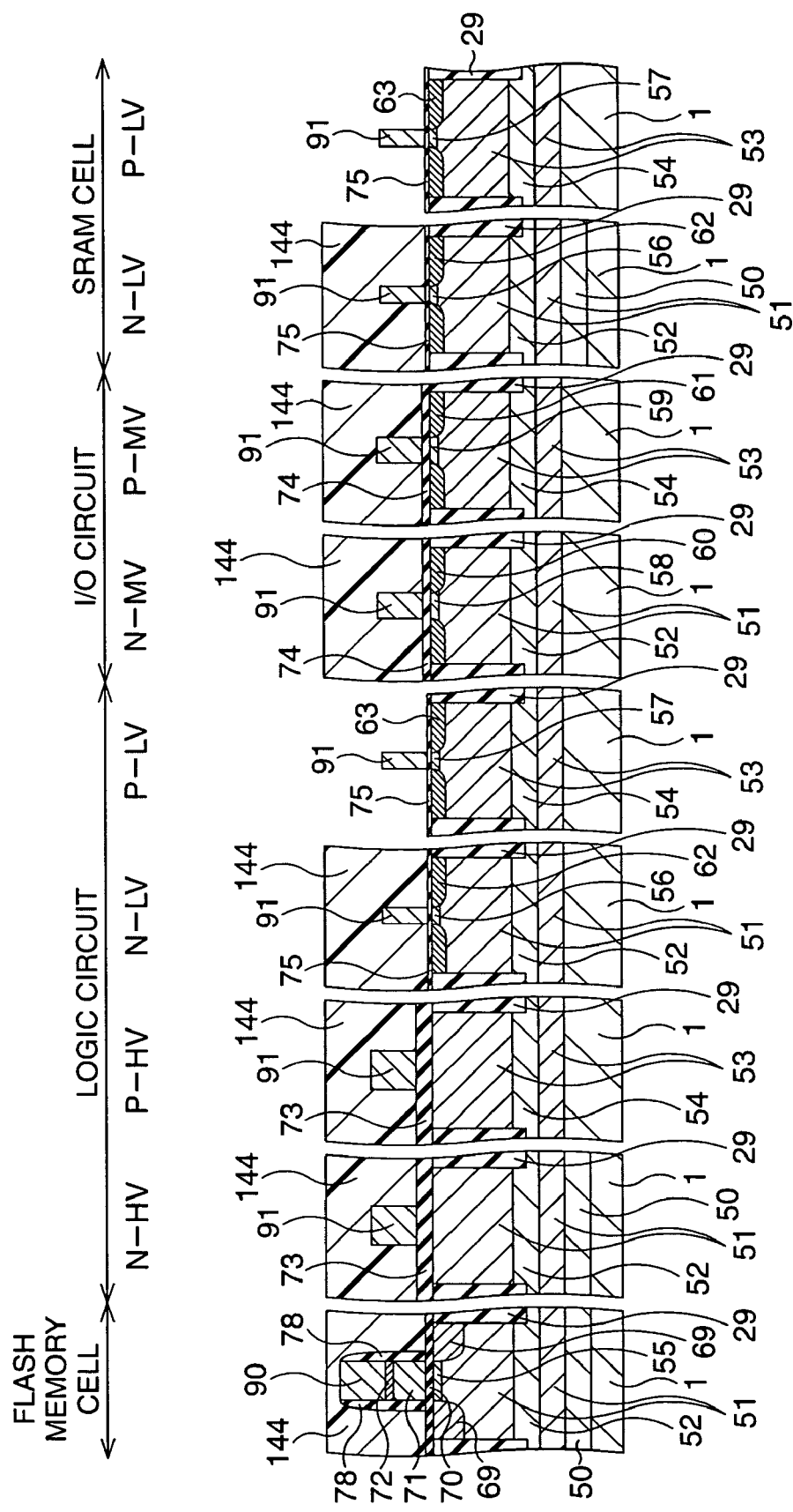

Subsequently, as shown in FIG. 13U, the photoresist mask 143 is removed by, for example, ashing. Next, a photoresist mask 144 exposing the P-LV regions and covering the other regions is formed by a photolithography technique. Next, ion-implantation is performed with the photoresist mask 144 as a mask, and thereby, extension layers 63 which constitute sources/drains of the P-LV regions are formed. In formation of the extension layers 63, for example, boron ion is ion-implanted under the condition of the acceleration energy: 0.5 keV and the dose amount: $6 \times 10^{14}$ cm$^{-2}$, and thereafter, arsenic ion is ion-implanted from the four directions inclined 28 degrees from the normal line of the Si substrate 1 under the condition of the acceleration energy: 120 keV and the dose amount: $5 \times 10^{12}$ cm$^{-2}$ for each. As a result, the extension layers 63 also become an extension layers including pocket layers (not shown).

Figure 13V:
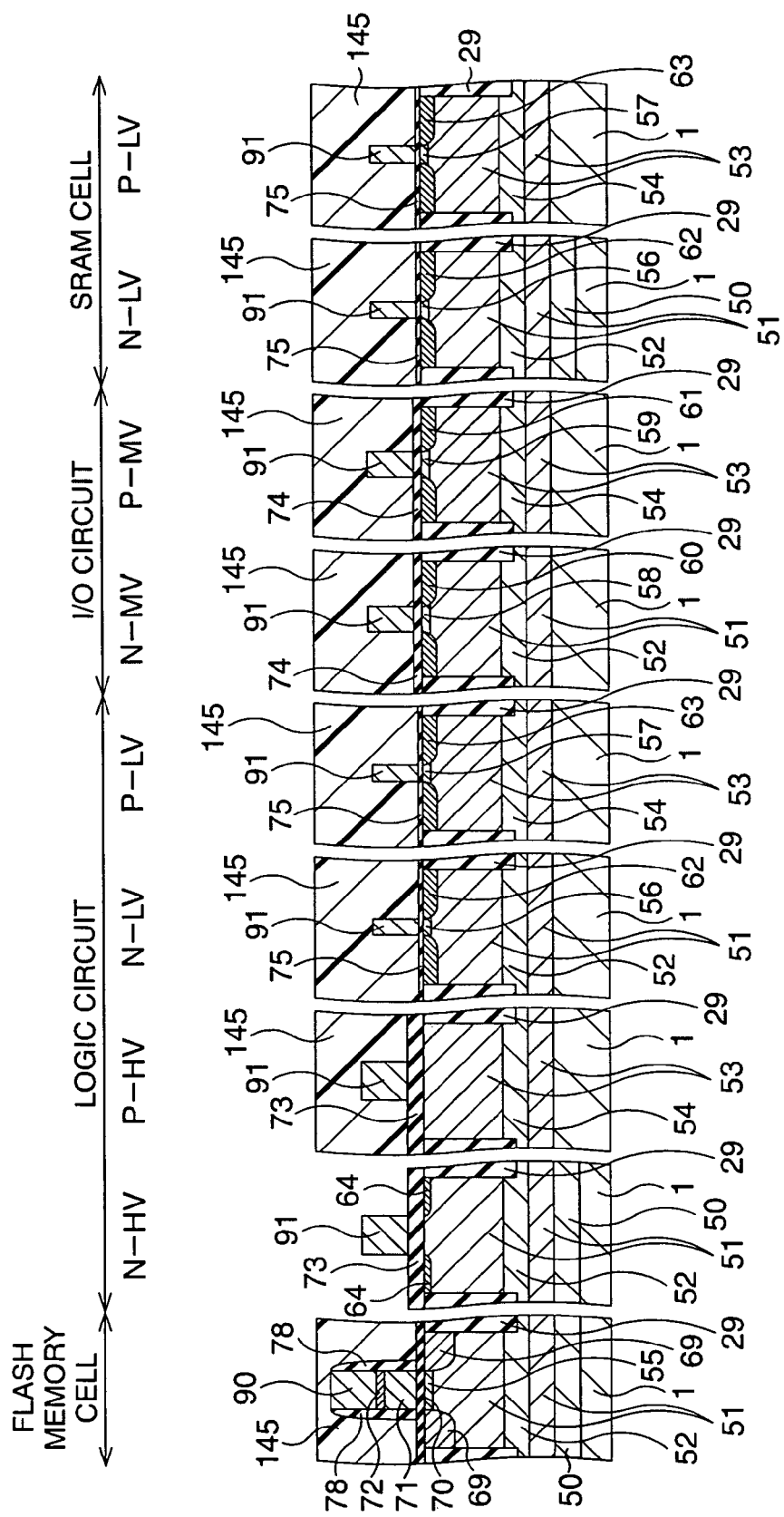

Thereafter, as shown in FIG. 13V, the photoresist mask 144 is removed by, for example, ashing. Subsequently, a photoresist mask 145 exposing the N-HV region and covering the other regions is formed by a photolithography technique. Next, an extension layer 64 which constitutes a source/drain of the N-HV region is formed by performing ion implantation with the photoresist mask 145 as a mask. In formation of the extension layer 64, for example, arsenic ion is ion-implanted under the condition of the acceleration energy: 120 keV and the dose amount: $2\times10^{13}$ cm$^{-2}$.

Figure 13W:
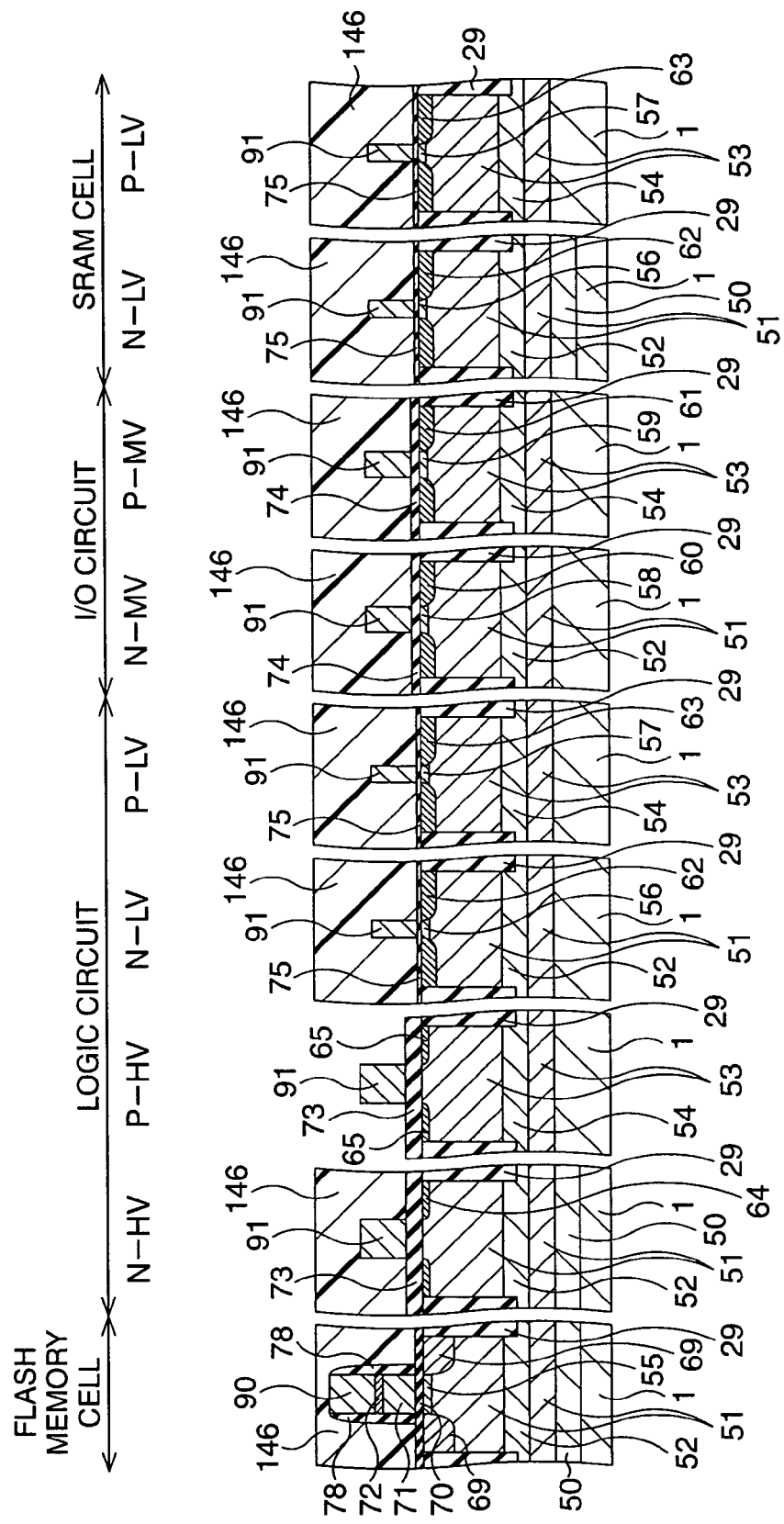

Next, as shown in FIG. 13W, the photoresist mask 145 is removed by, for example, ashing. Thereafter, a photoresist mask 146 exposing the P-HV region and covering the other regions is formed by a photolithography technique. Subsequently, ion-implantation is performed with the photoresist mask 146 as a mask, and thereby, an extension layer 65 which constitutes a source/drain of the P-HV region is formed. In formation of the extension layer 65, for example, boron fluoride ion is ion-implanted under the condition of the acceleration energy: 80 keV and the dose amount: $2\times10^{13}$ cm$^{-2}$.

Figure 13X:
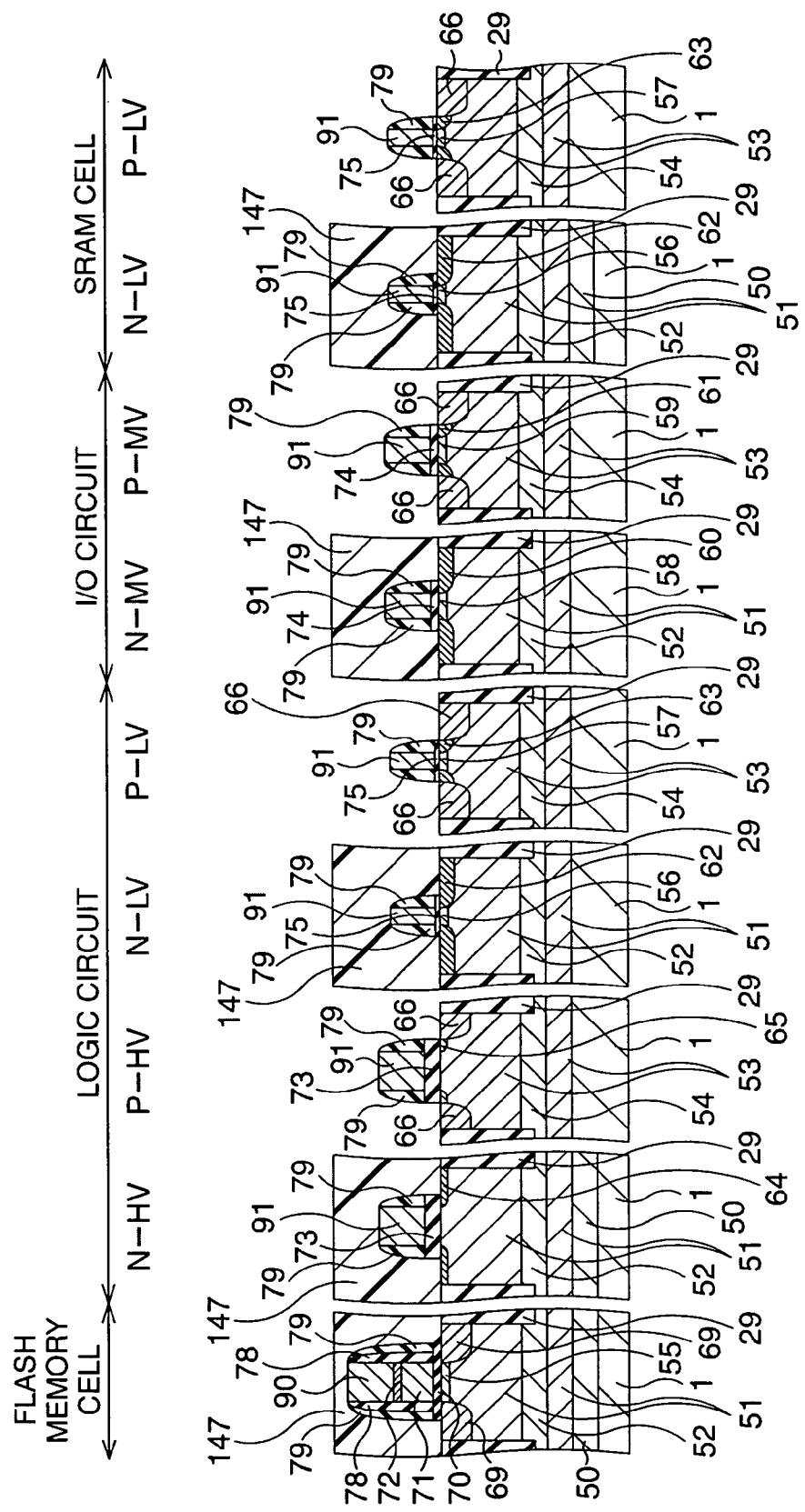

Next, as shown in FIG. 13X, the photoresist mask 146 is removed by, for example, ashing. Next, after a silicon oxide film is deposited by, for example, a thermal CVD method, the silicon oxide film is etched back, and thereby side walls (side wall insulation films) 79 constituted of the silicon oxide film are formed on side wall portions of the gate electrodes 90 and 91. Thereafter, a photoresist mask 147 exposing the P-HV region, the P-MV region and the P-LV regions and covering the other regions is formed. Subsequently, source/drain diffusion layers (SD diffusion layers) 66 which constitutes the sources/drains of the P-HV region, the P-MV region and the P-LV regions are formed by performing ion implantation with the photoresist mask 147 as a mask. In formation of the SD diffusion layers 66, for example, boron ion is ion implanted under the condition of the acceleration energy: 5 keV and the dose amount: $4\times10^{15}$ cm$^{-2}$. The conductivity type of the gate electrodes 91 in the P-HV region, the P-MV region and the P-LV regions become p-type.

Figure 13Y:
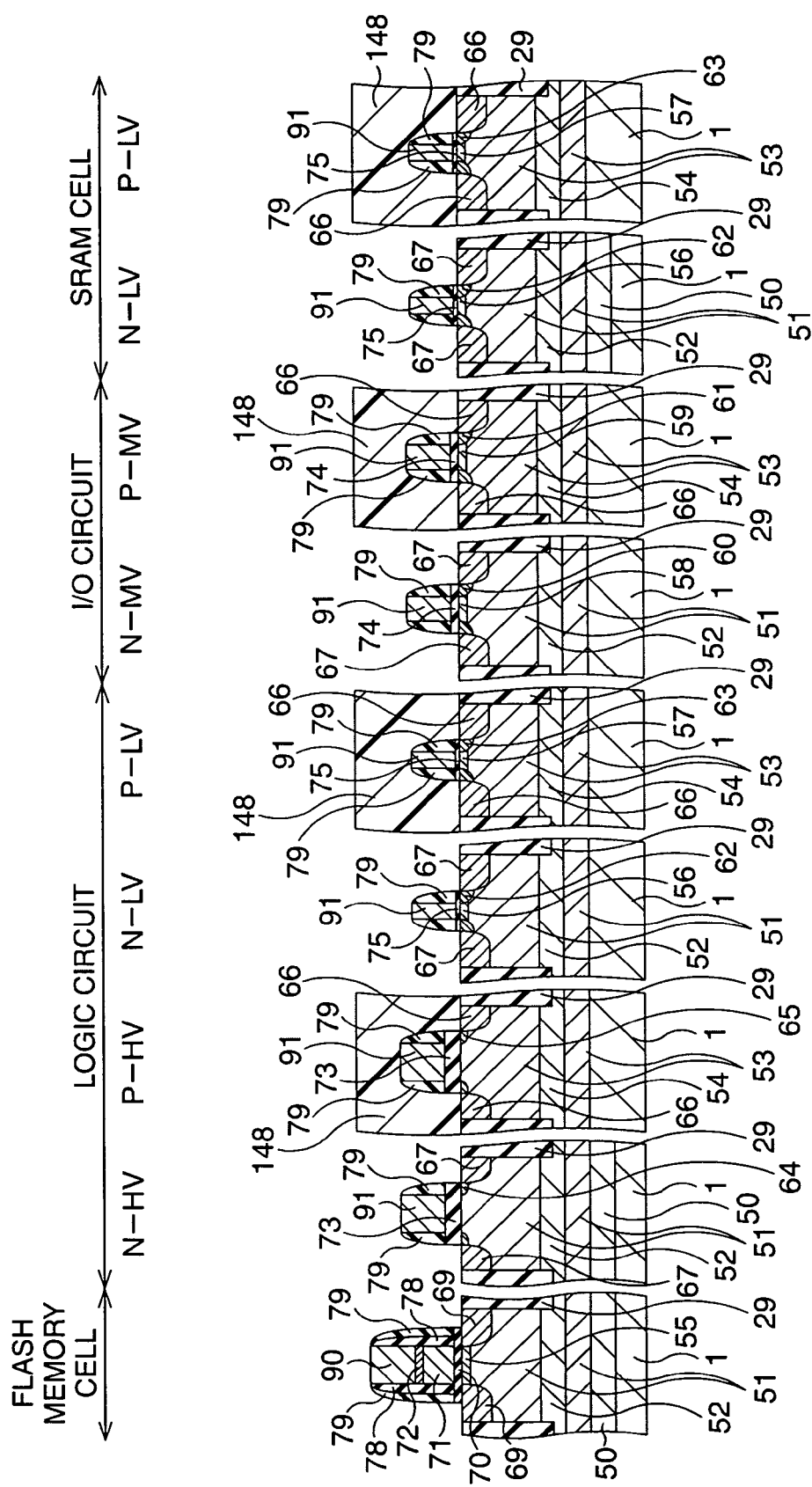
Figure 13Z:
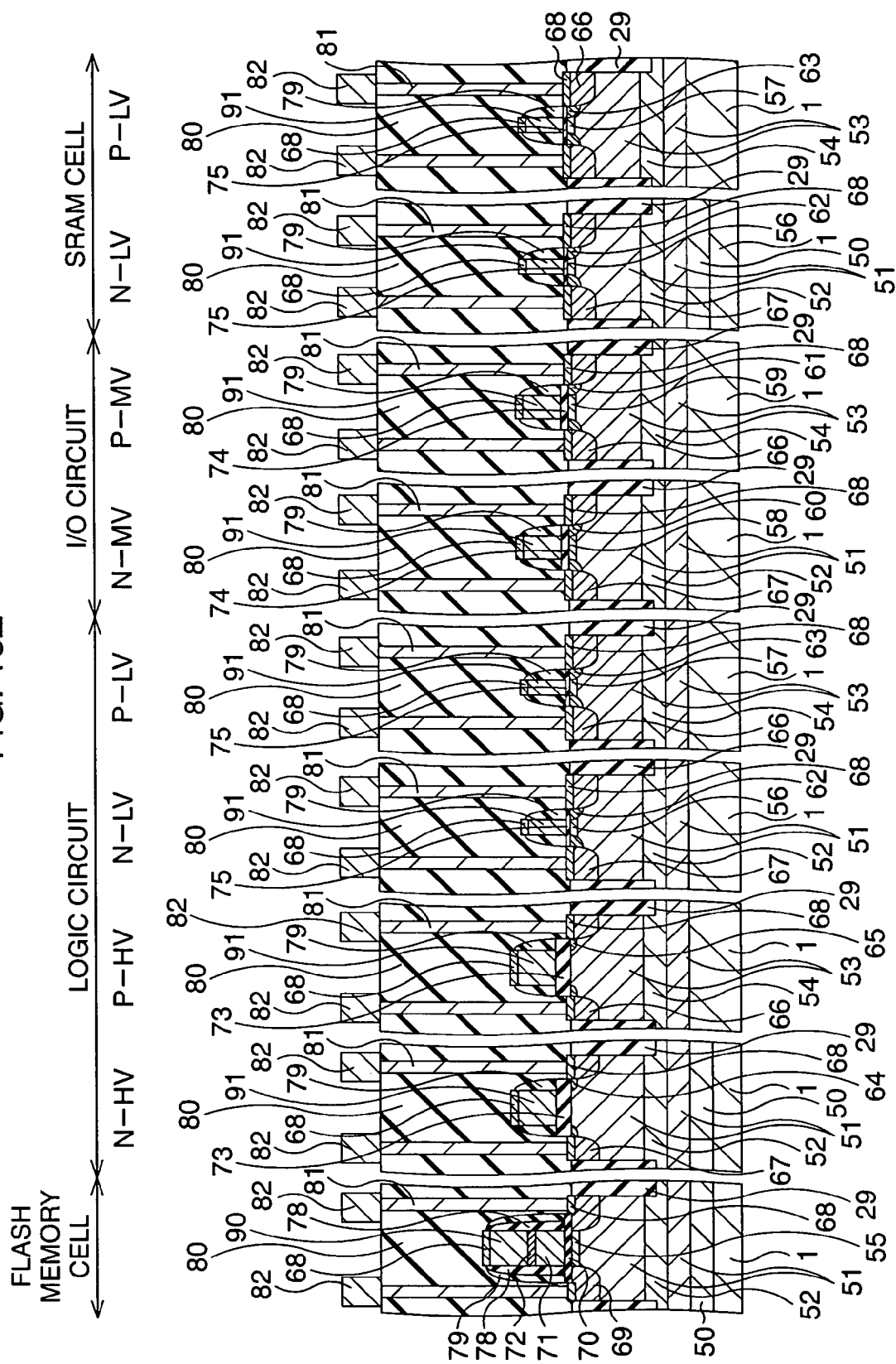

Thereafter, as shown in FIG. 13Y, the photoresist mask 147 is removed by, for example, ashing. Next, a photoresist mask 148 exposing the flash memory cell region, the N-HV region, the N-MV region and the N-LV regions and covering the other regions is formed by a photolithography technique. Next, ion implantation is performed with the photoresist mask 148 as a mask, and thereby SD diffusion layers 67 which constitute sources/drains of the flash memory cell region, the N-HV region, the N-MV region and the N-LV regions are formed. In formation of the SD diffusion layers 67, for example, phosphorus ion is ion-implanted under the condition of the acceleration energy: 10 keV and the dose amount: $6\times10^{15}$ cm$^{-2}$. By this ion implantation, the conductivity type of the gate electrode 90 of the flash memory cell and the gate electrodes 91 of the N-HV region, the N-MV region and the N-LV regions becomes n-type.

Thereafter, as shown in FIG. 13Z, the photoresist mask 148 is removed by, for example, ashing. Subsequently, silicide layers 68 are formed on the gate electrodes 90 and 91, and the SD diffusion layers 66 and 67 by a known salicide process. Subsequently, an interlayer insulation film 80 is formed on the entire surface, and thereafter contact holes are formed. After contact plugs 81 are formed in the contact holes, wirings 82 are formed on the interlayer insulation film 80. In this manner, the steps up to the first metal wiring layer are completed. As the interlayer insulation film 80, an Si oxide film of the thickness of about 600 nm is formed by, for example, a HDP method.

Thereafter, a further upper wiring layer and interlayer insulation film and the like are formed, and the semiconductor device on which the logic circuit element loaded with the SRAM and the flash memory are mixedly mounted is completed.

According to the above third embodiment, the same effect as in the second embodiment is also obtained. Even if the SRAM cell is formed in parallel with the formation of the non-volatile memory (flash memory) cell, it is possible to avoid increase in the number of process steps and increase in the cost following this.

According to the first aspect of the present invention, the impurity profile of the channel of the first transistor for the memory has a superimposed profile of the first depth impurity profile of the channel of the first transistor for the peripheral circuit and the second depth impurity profile of the channel of the second transistor for the peripheral circuit, thus making it possible to obtain high threshold voltage and ensure a wide operation margin. The introduction of the impurity into the channel of the first transistor for the memory can be performed in parallel with the introduction of impurities into each of the channel of the first transistor for the peripheral circuit and the channel of the second transistor for the peripheral circuit and the channel of the second transistor for the peripheral circuit, and therefore the increase in the process steps and the increase in cost can be avoided.

According to the second aspect of the present invention, the embedded well of the second conductivity type is formed directly under the first well, and therefore when α-ray is incident on the transistor for the first memory, a change in the depletion layer is suppressed, thus making it possible to suppress a soft error.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
    a semiconductor substrate;
    a first transistor for a memory with a channel of a first conductivity type, formed on a surface of said semiconductor substrate;
    a first transistor for a peripheral circuit with a channel of the first conductivity type with a first depth impurity profile, formed on the surface of said semiconductor substrate; and
    a second transistor for the peripheral circuit with a channel of the first conductivity type with a second depth impurity profile, formed on the surface of said semiconductor substrate,
    the impurity profile of the channel of said first transistor for the memory being a sum of the implant dosages of said first depth impurity profile and said second depth impurity profile.

2. The semiconductor device according to claim 1, wherein
    operating voltage of said first transistor for the memory and that of said first transistor for the peripheral circuit are equal to each other, and
    the operating voltage of said first transistor for the memory and that of said second transistor for the peripheral circuit are different from each other.

3. The semiconductor device according to claim 1, wherein a conductivity type of said semiconductor substrate is the first conductivity type, and
    said semiconductor device, further comprising:
    a second transistor for the memory with a channel of a second conductivity type, formed on the surface of said semiconductor substrate;
    a first well of the first conductivity type formed in a region with said first transistor for the memory formed therein, of the surface of said semiconductor substrate;

a second well of the second conductivity type formed in a region with said second transistor for the memory formed therein, of the surface of said semiconductor surface; and an embedded well of the second conductivity type formed directly under said first well.

4. The semiconductor device according to claim 1, wherein said memory comprises a static random access memory.

5. The semiconductor device according to claim 1, further comprising a non-volatile memory cell whose channel has the first conductivity type.

6. The semiconductor device according to claim 3, wherein a structure of said first and second wells is a triple-well structure.

7. The semiconductor device according to claim 1, wherein the first conductivity type is p-type, and the second conductivity type is n-type.

* * * * *